US006861692B2

United States Patent
Kujirai et al.

(10) Patent No.: US 6,861,692 B2
(45) Date of Patent: Mar. 1, 2005

(54) METHOD OF MANUFACTURING SEMICONDUCTOR DEVICE AND SEMICONDUCTOR DEVICE

(75) Inventors: Hiroshi Kujirai, Kunitachi (JP); Masahiro Moniwa, Sayama (JP); Kazuo Nakazato, Cambridge (GB); Teruaki Kisu, deceased, late of Tokyo (JP); by Teruo Kisu, legal representative, Tokyo (JP); by Haruko Kisu, legal representative, Tokyo (JP); Hideyuki Matsuoka, Nishi-tokyo (JP); Tsuyoshi Tabata, Futaba (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/338,002

(22) Filed: Jan. 8, 2003

(65) Prior Publication Data

US 2004/0000690 A1 Jan. 1, 2004

(Under 37 CFR 1.47)

Related U.S. Application Data

(62) Division of application No. 10/278,918, filed on Oct. 24, 2002.

(30) Foreign Application Priority Data

Oct. 24, 2001 (JP) ........................................ 2001-326757

(51) Int. Cl.$^7$ .............................................. H01L 29/78
(52) U.S. Cl. ...................................... 257/302; 257/305
(58) Field of Search ................................. 257/302, 305

(56) References Cited

U.S. PATENT DOCUMENTS 4,873,560 A * 10/1989 Sunami et al. ............... 257/302
6,060,723 A   5/2000 Nakazato et al.
6,635,526 B1 * 10/2003 Malik et al. ................. 438/243

FOREIGN PATENT DOCUMENTS

JP          5-110019          4/1993

* cited by examiner

Primary Examiner—Jerome Jackson
(74) Attorney, Agent, or Firm—Antonelli, Terry, Stout & Kraus, LLP

(57) ABSTRACT

A vertical MIS is provided immediately above a trench-type capacitor provided in a memory cell forming region of a semiconductor substrate, and a lateral nMIS is provided in the peripheral circuit forming region of the semiconductor substrate. After forming the capacitor, the lateral nMIS is formed. In addition, after forming the lateral nMIS, the vertical MIS is formed. Furthermore, after forming a capacitor, an isolation part of the peripheral circuit is formed.

8 Claims, 53 Drawing Sheets

Fig. 1
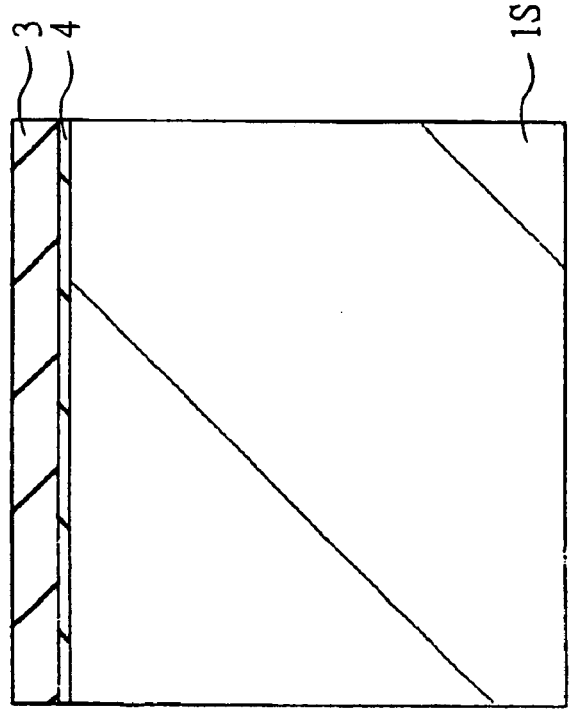
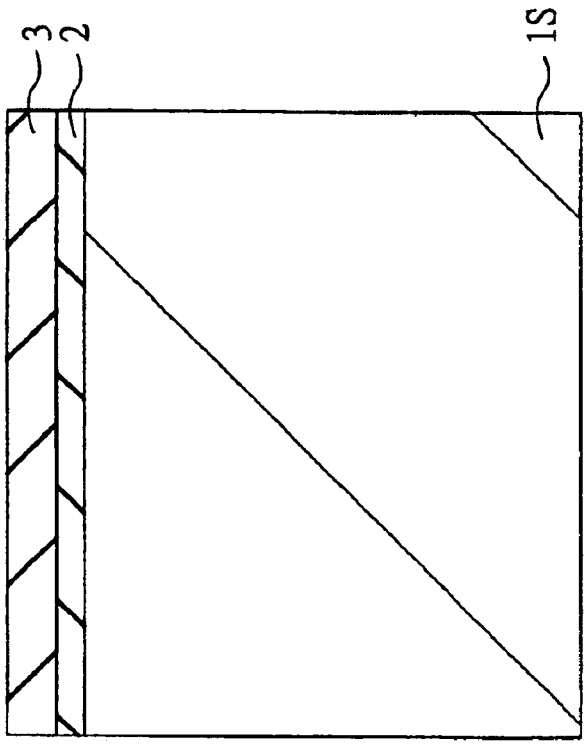

*Fig. 6*
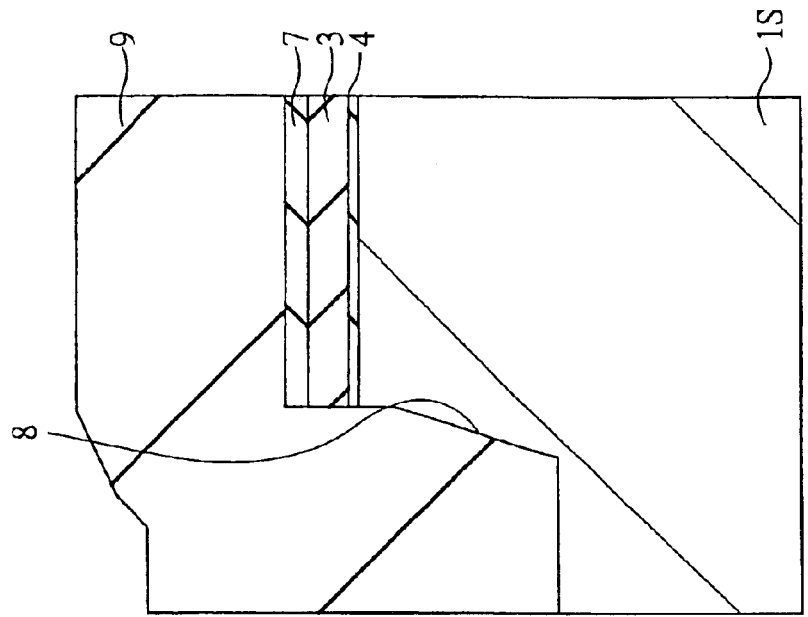
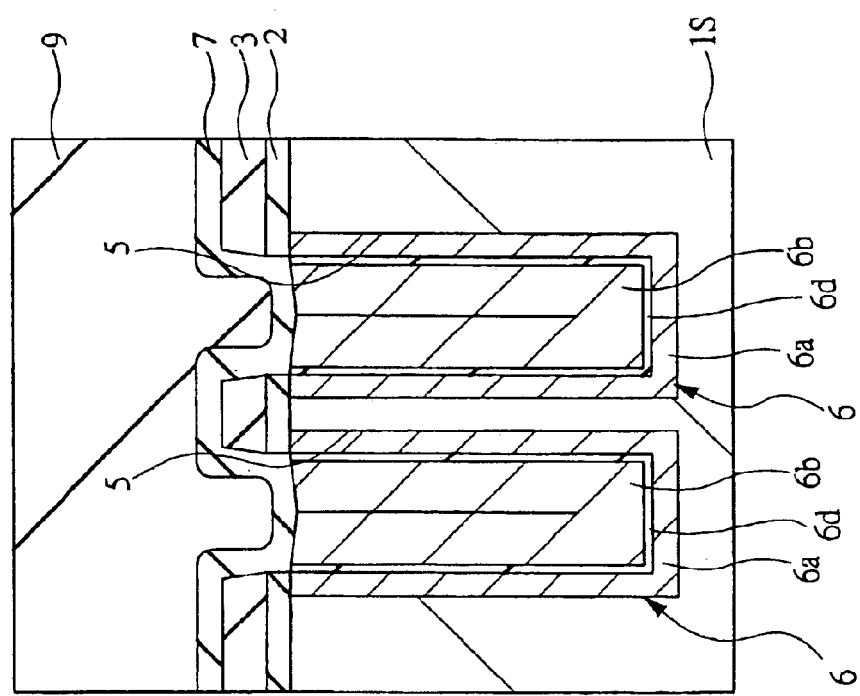

Fig. 7
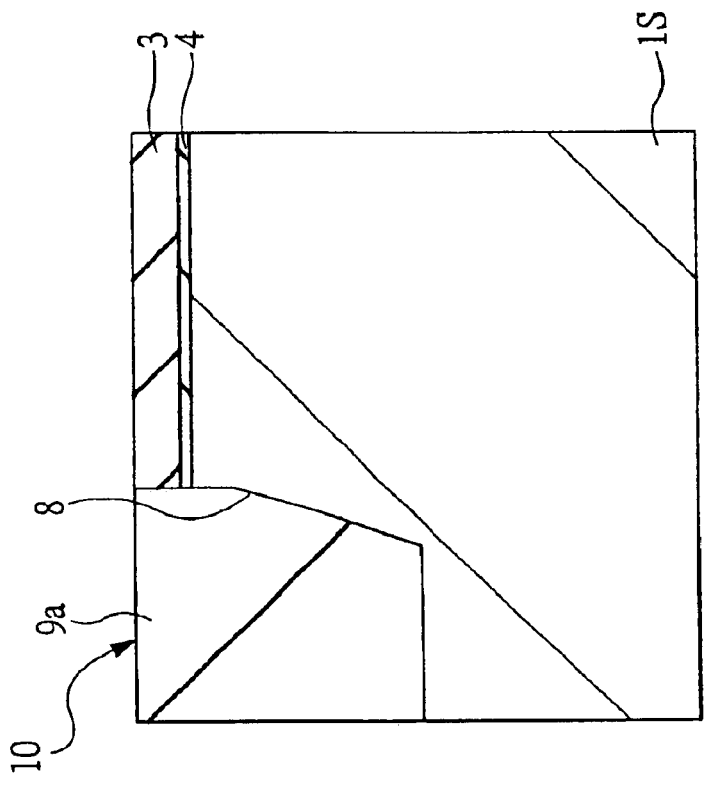
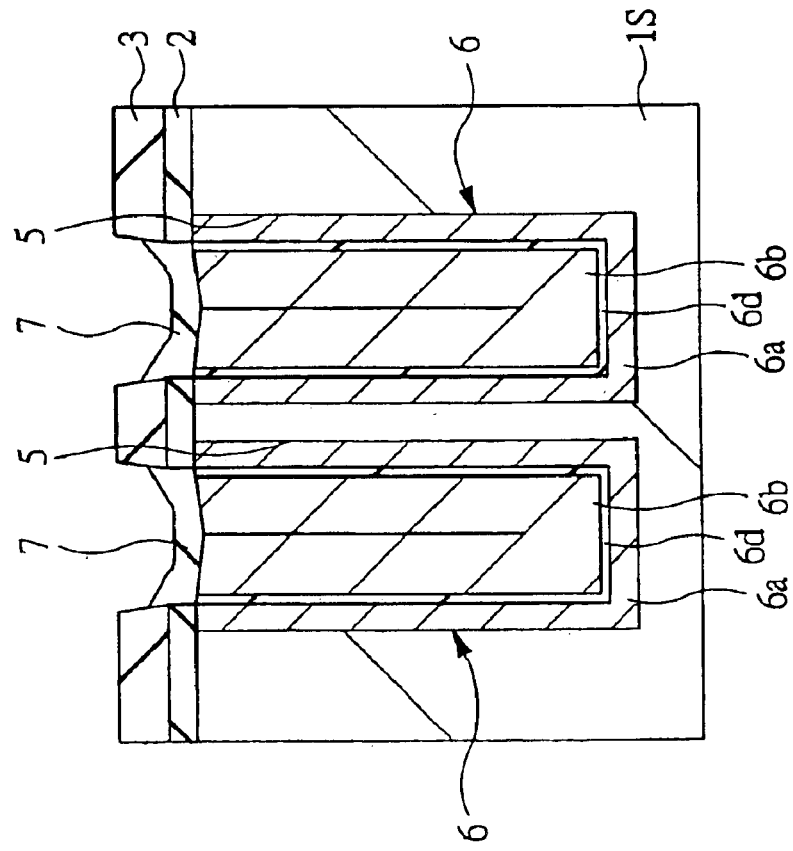

memory cell forming region

Fig. 18
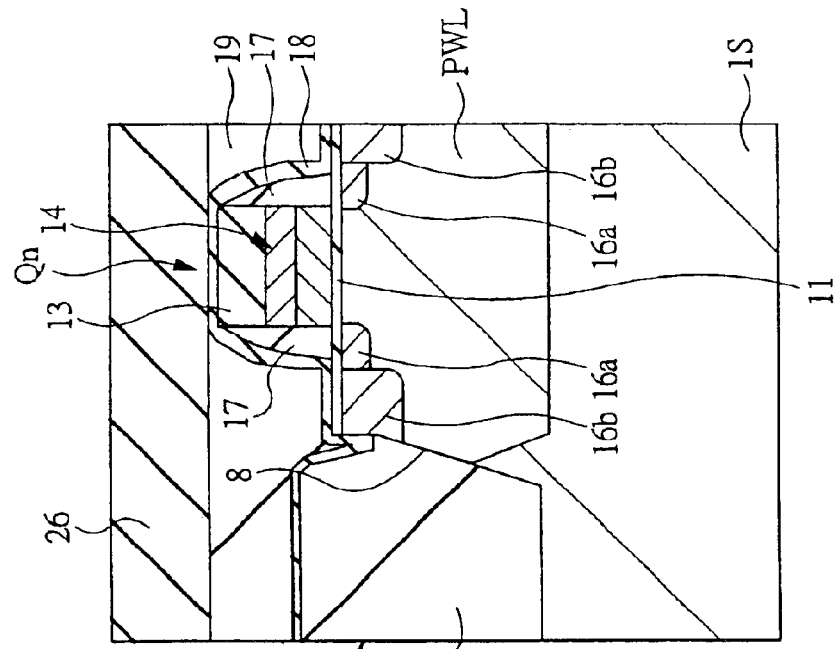
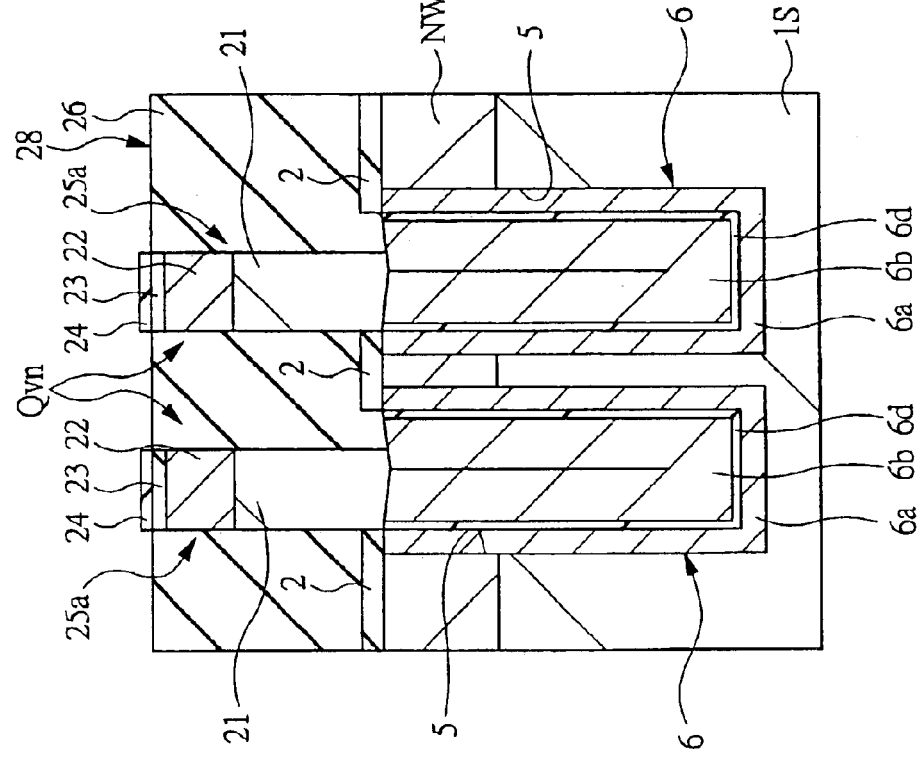

memory cell forming region memory cell forming region

US 6,861,692 B2

METHOD OF MANUFACTURING SEMICONDUCTOR DEVICE AND SEMICONDUCTOR DEVICE

This application is a Divisional application of application Ser. No. 10/278,918, filed Oct. 24, 2002, the contents of which are incorporated herein by reference in their entirety.

TECHNICAL FIELD OF THE INVENTION

The present invention relates to a method of manufacturing a semiconductor device and a semiconductor device technology. More specifically, the present invention relates to a technique effectively applied to a technology for a semiconductor device with a vertical transistor.

BACKGROUND OF THE INVENTION

The semiconductor device with a vertical transistor is described in, for example, Japanese Patent Laid-Open No. 05-110019. In this description, a structure is disclosed, in which a trench for forming a gate electrode is self-alignedly formed in a semiconductor region, in which a channel portion of a vertical MOS transistor is to be formed, by a bit line provided on the semiconductor region.

In addition, in U.S. Pat. No. 6,060,723, which corresponds to a gazette of Japanese Patent Laid-Open No. 11-87541, a semiconductor device having a PLED transistor is described. In this description, a structure is disclosed, in which a side gate structure is provided on a sidewall of a vertical pillar, and the vertical pillar has a relatively conductive material and a non-conductive material.

SUMMARY OF THE INVENTION

However, the inventors of this invention have found out the following problems in the technology for the semiconductor device with a vertical transistor.

That is, a significant problem is how to increase the reliability of the semiconductor device having a vertical transistor as a memory cell selecting transistor in the case of actually manufacturing it.

An object of the present invention is to provide a technique capable of improving the reliability of the semiconductor device having a vertical transistor for memory cell selection.

The above and other objects and novel characteristics of the present invention will be apparent from the description and the accompanying drawings of this specification.

The typical ones of the inventions disclosed in this application will be briefly described as follows.

More specifically, an aspect of the present invention is a method comprising the step of: forming a lateral field effect transistor for a peripheral circuit on a semiconductor substrate and then forming a vertical field effect transistor for memory cell selection in a memory cell forming region.

Another aspect of the present invention is a method comprising the step of: forming a plurality of trench-type data storage capacitors on a semiconductor substrate and then forming a field effect transistor for a peripheral circuit.

Another aspect of the present invention is a method comprising the step of: forming a plurality of trench-type data storage capacitors on a semiconductor substrate and then forming an isolation part of a peripheral circuit forming region.

Another aspect of the present invention is a semiconductor device, wherein a field effect transistor for memory cell selection is composed of a vertical field effect transistor, and a field effect transistor for a peripheral circuit is composed of a lateral field effect transistor.

BRIEF DESCRIPTIONS OF THE DRAWINGS

FIG. 1 is a sectional view showing the principal part of a memory cell forming region and a peripheral circuit forming region on the same wafer in the course of the manufacturing process of a semiconductor device according to an embodiment of the present invention;

FIG. 6 is a sectional view showing the principal part of the memory cell forming region and the peripheral circuit forming region in the course of the manufacturing process of the semiconductor device subsequent to FIG. 5;

FIG. 7 is a sectional view showing the principal part of the memory cell forming region and the peripheral circuit forming region in the course of the manufacturing process of the DRAM subsequent to FIG. 6;

FIG. 18 is a sectional view showing the principal part of the memory cell forming region and the peripheral circuit forming region in the course of the manufacturing process of the semiconductor device subsequent to FIGS. 15 to 17;

DESCRIPTIONS OF THE PREFERRED EMBODIMENTS

Figure 2:
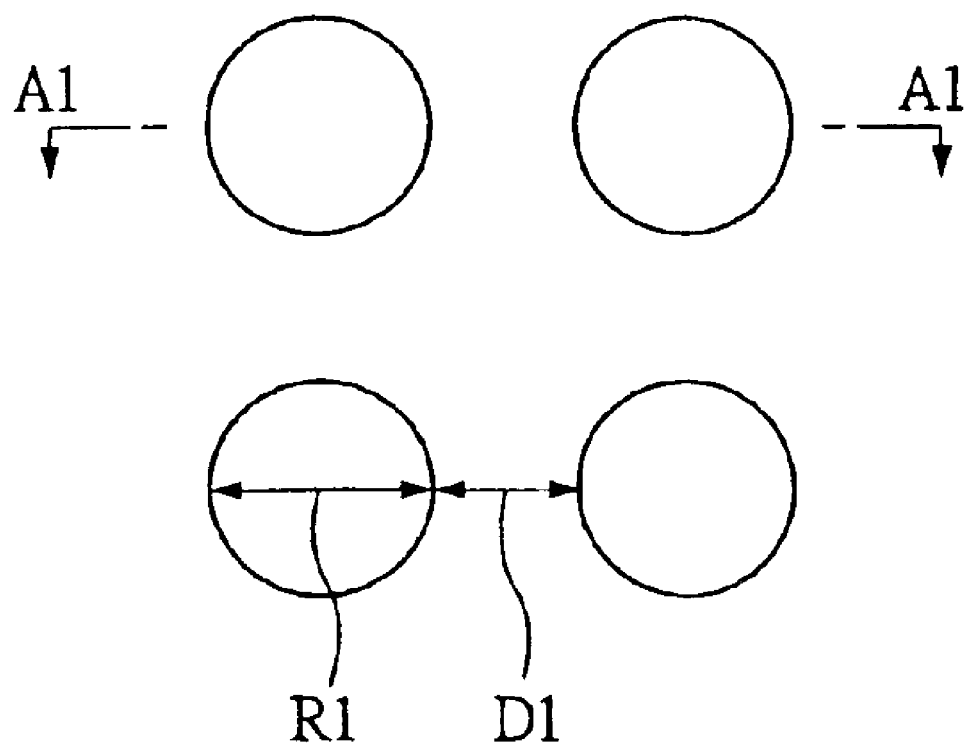
FIG. 2 is a plan view showing the principal part of the memory cell forming region in the course of the manufacturing process of the semiconductor device subsequent to FIG. 1.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of an element (including number of pieces, values, amount, range, or the like), the number of the element is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

Also, components having the same function are denoted by the same reference symbols throughout the drawings for describing the embodiment and the repetitive description thereof will be omitted.

In addition, a MISFET (Metal Insulator Semiconductor Field Effect Transistor) as a representative of a field effect transistor is abbreviated to MIS, and a p channel MISFET and an n channel MISFET are abbreviated to pMIS and nMIS, respectively.

Hereinafter, embodiments of the present invention will be described with reference to the drawings.

First Embodiment

In this first embodiment, a case where the present invention is applied to a technique for manufacturing a DRAM (Dynamic Random Access Memory) will be described.

FIG. 1 is a sectional view showing the principal part of a memory cell forming region (left of FIG. 1) and a peripheral circuit forming region (right of FIG. 1) on the same wafer in the course of the manufacturing process of the DRAM.

A semiconductor substrate (hereinafter, simply referred to as a substrate) 1S constituting an approximately circular wafer is made of, for example, p type single crystal silicon. An insulating film 2 is deposited on a main surface (device forming surface) of the substrate 1S in the memory cell forming region by the CVD (Chemical Vapor Deposition) method or the like. This insulating film 2 is made of, for example, silicon oxide ($SiO_2$ or the like) and has a thickness of about 50 to 100 nm. An insulating film 3 is deposited on the insulating film 2 by the CVD method or the like. This insulating film 3 is made of, for example, a silicon nitride film ($Si_3N_4$ or the like) and has a thickness of about 140 nm. Meanwhile, the insulating film 3 is deposited on the main surface of the substrate 1S in the peripheral circuit forming region via an insulating film 4. This insulating film 4 is a so-called pad oxide film formed by the thermal oxidation method and is made of, for example, a silicon oxide film with a thickness of about 10 nm.

Figure 3:
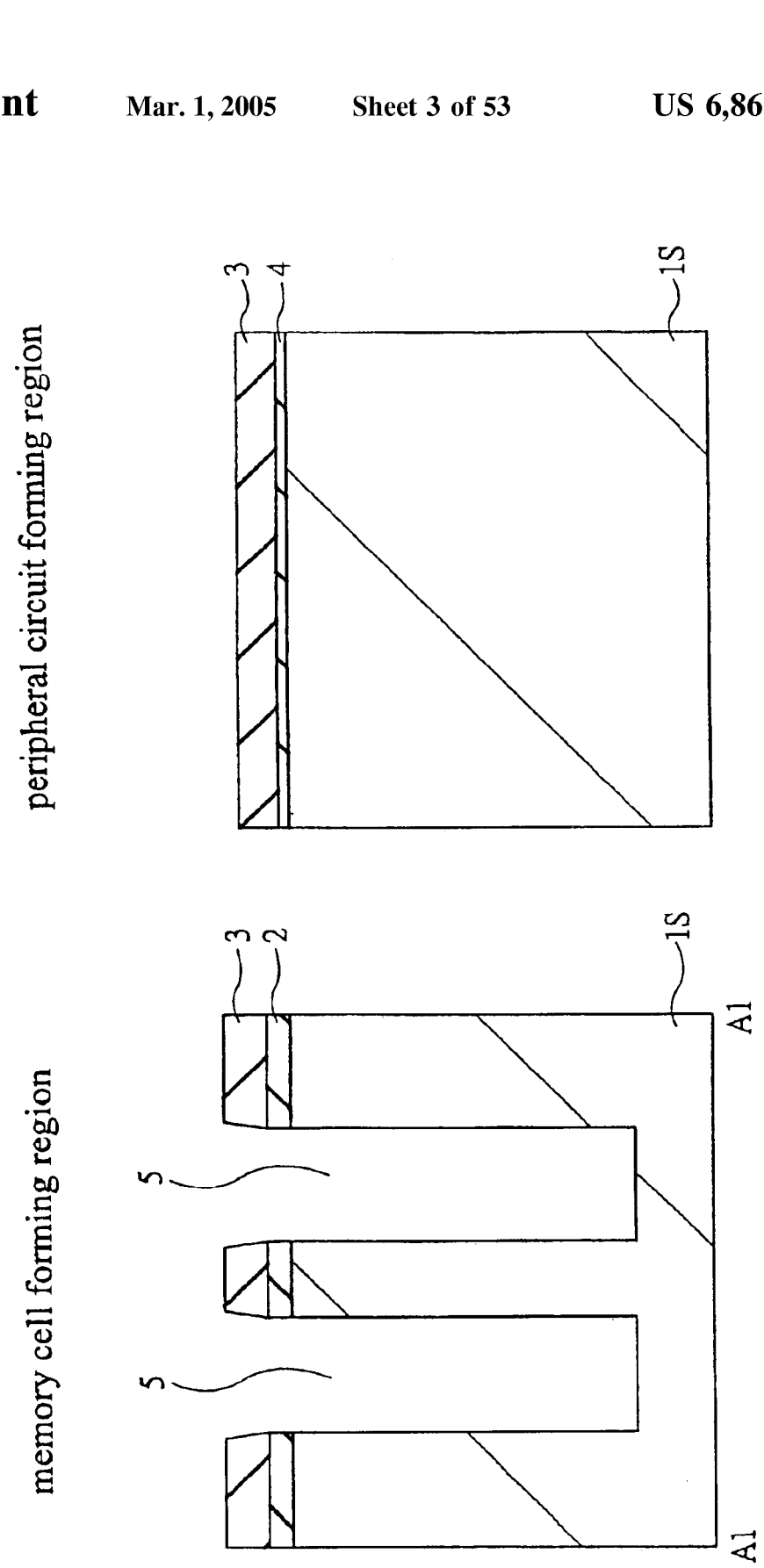
FIG. 3 is a sectional view showing the principal part of the memory cell forming region (taken along the line A1—A1 in FIG. 2) and that of the peripheral circuit forming region in the course of the manufacturing process of the semiconductor device shown in FIG. 2.

FIG. 2 is a plan view showing the principal part of the memory cell forming region in the course of the manufacturing process of the DRAM subsequent to FIG. 1. FIG. 3 is a sectional view showing the principal part of the memory cell forming region (taken along the line A1—A1 in FIG. 2) and that of the peripheral circuit forming region of the DRAM shown in FIG. 2 in the course of the manufacturing process.

In this step, a plurality of circular trenches 5 used to form data storage capacitors are formed by the photolithography technique and the dry etching technique in the memory cell forming region. More specifically, the trench 5 is formed in such a manner as follows. First, a photoresist film exposing a forming region of the trench 5 and covering the other region is formed on the insulating film 3 in the memory cell forming region. Thereafter, the insulating films 3 and 2 are sequentially removed by the etching method with using the photoresist film as an etching mask. Subsequently, after the removal of the photoresist film by ashing, a part of the substrate 1S exposed through the remaining insulating films 3 and 2 used as etching masks is etched by the dry etching method. As a result, the trench 5 extending in a direction vertical to the main surface of the substrate 1S is formed. The depth of the trench 5 is about 10 μm. The radius R1 of the trench 5 is, for example, about 120 nm, and the distance D1 between the trenches 5 adjacent in the lateral direction in FIG. 2 is, for example, about 60 nm. Then, after the substrate 1S is cleaned by RCA cleaning, the sacrificial oxidation is performed thereto and the removal of the sacrificial oxide film is performed.

Figure 4:
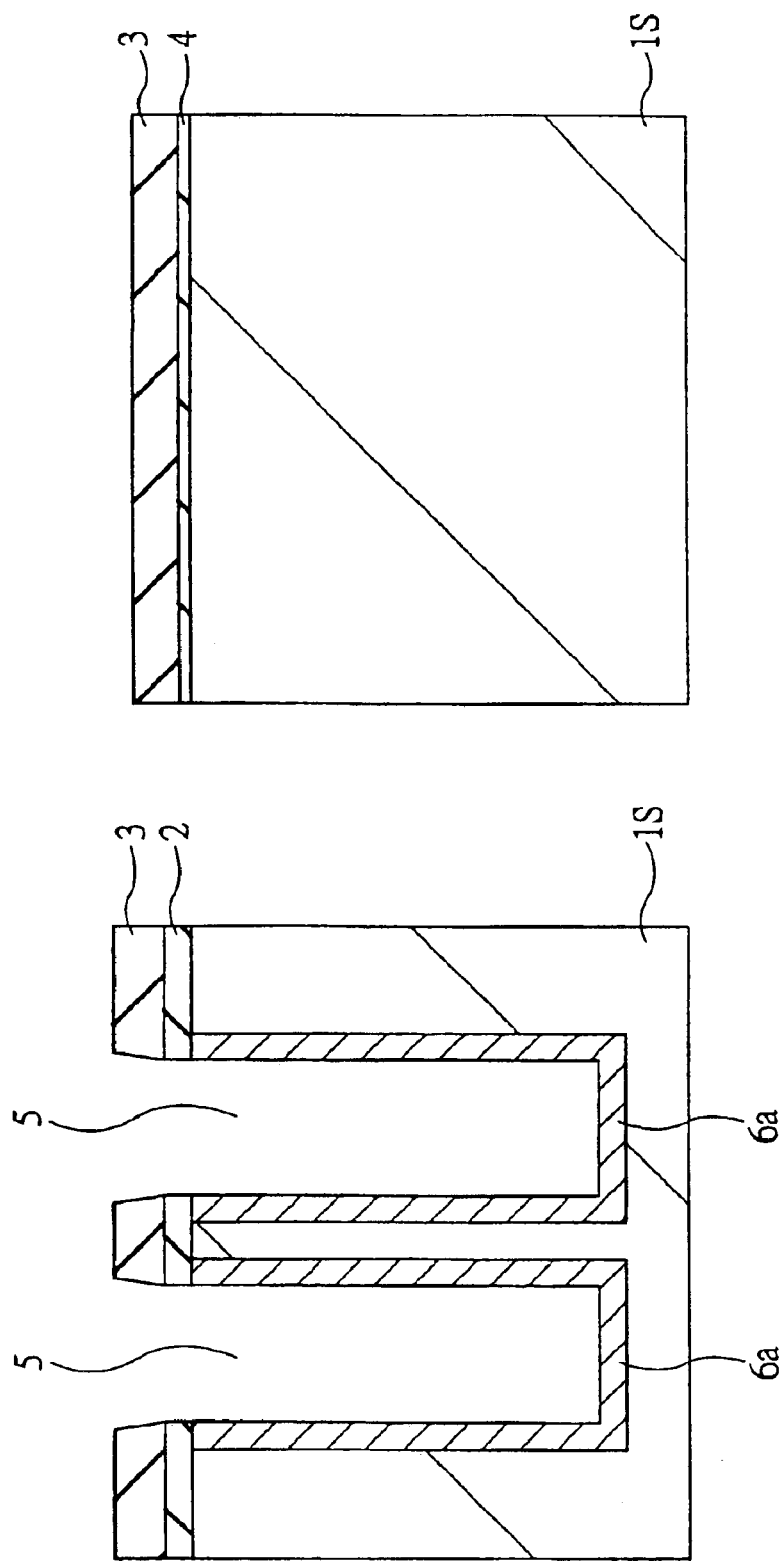
FIG. 4 is a sectional view showing the principal part of the memory cell forming region and the peripheral circuit forming region in the course of the manufacturing process of the semiconductor device subsequent to FIG. 3.

FIG. 4 is a sectional view showing the principal part of the memory cell forming region and the peripheral circuit forming region in the course of the manufacturing process of the DRAM subsequent to FIG. 3.

In this step, an $n^+$ type semiconductor region 6a is formed in each trench 5 (on the sidewall and bottom surface of the trench 5) by the vapor phase diffusion of phosphorus (P) or arsenic (As) into the trench 5 in the substrate 1S in the memory cell forming region. This $n^+$ type semiconductor region 6a is a region on which one electrode (plate electrode) of the data storage capacitor of the DRAM is to be formed.

Figure 5:
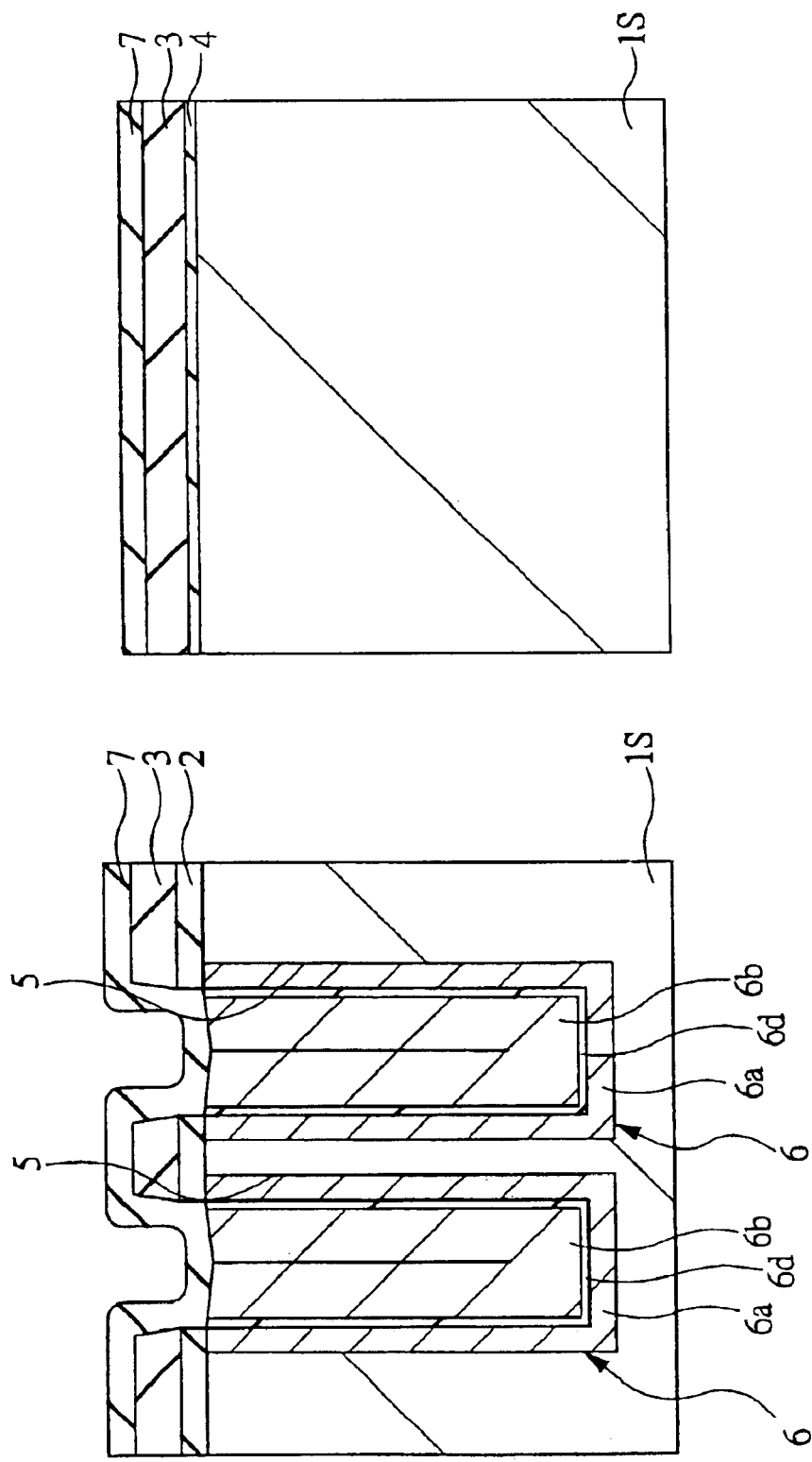
FIG. 5 is a sectional view showing the principal part of the memory cell forming region and the peripheral circuit forming region in the course of the manufacturing process of the semiconductor device subsequent to FIG. 4.

FIG. 5 is a sectional view showing the principal part of the memory cell forming region and the peripheral circuit forming region in the course of the manufacturing process of the DRAM subsequent to FIG. 4.

First, the inner surface (sidewall and bottom surface) of the trench 5 is nitrided by the use of $NH_3$ gas. Thereafter, an insulating film made of a silicon nitride film having a thickness of about 7 nm is deposited on the inner surface of the trench 5 by the CVD method, and the surface of the insulating film is processed using the oxynitridation by the use of $N_2O$ gas. An insulating film 6d formed on the inner surface of the trench 5 is a film for forming the capacitor insulating film of the data storage capacitor. The structure of this data storage capacitor is not limited to that described above, and can be modified in various manners. For example, a film made of tantalum oxide ($Ta_2O_5$), a ferroelectric film or a high dielectric film can be used as the capacitor insulating film.

Subsequently, an $n^+$ type low-resistance polycrystalline silicon film that contains phosphorus is deposited to a thickness of about 70 nm on the main surface of the substrate 1S by the CVD method. Thereafter, the polycrystalline silicon film is etched back by the dry etching method, thereby burying an $n^+$ type conductor film 6b made of the polycrystalline silicon film into the trench 5. This conductor film 6b forms the other electrode (storage electrode) of the data storage capacitor, and also, the upper part thereof forms semiconductor layers for the source and drain of the later-described vertical transistor. As described above, the data storage capacitor (hereinafter, referred to as a capacitor) 6 of the DRAM is formed in the trench 5. Subsequently, an insulating film 7 made of a silicon oxide film with a thickness of about 30 nm is formed on the main surface of the substrate 1S by the CVD method.

FIG. 6 is a sectional view showing the principal part of the memory cell forming region and the peripheral circuit forming region in the course of the manufacturing process of the DRAM subsequent to FIG. 5.

First, a photoresist film exposing an isolation part of the peripheral circuit forming region and covering the other region is formed on the main surface of the substrate 1S. Thereafter, the insulating films 7, 3, and 4 exposed through the photoresist film used as an etching mask are sequentially etched and removed, and then, the photoresist film used as an etching mask is removed by ashing. Subsequently, a part of the substrate 1S exposed through the remaining insulating films 7, 3, and 4 used as etching masks is etched and removed, thereby forming a shallow isolation trench 8 with a depth of about 0.2 to 0.35 $\mu$m in the peripheral circuit forming region on the substrate 1S. Thereafter, an insulating film 9 made of a silicon oxide film is deposited on the main surface of the substrate 1S by the CVD method, and then, the thermal treatment at 1000 to 1100° C. is performed to the substrate 1S. The insulating film 9 is buried also in the trench 8. Thereafter, a photoresist film covering the isolation part of the peripheral circuit forming region and exposing the other region is formed on the insulating film 9, and then, the insulating film 9 exposed through the photoresist film used as an etching mask is etched, thereby improving the flatness of the upper surface of the insulating film 9.

FIG. 7 is a sectional view showing the principal part of the memory cell forming region and the peripheral circuit forming region in the course of the manufacturing process of the DRAM subsequent to FIG. 6.

In this step, after the above-described planarization of the upper surface of the insulating film 9, the insulating film 9 is polished by the CMP (Chemical Mechanical Polishing) method or the like, thereby forming the isolation insulating film 9a in the isolation trench 8. As described above, a shallow trench isolation (STI) or a shallow groove isolation (SGI) 10 is formed in the peripheral circuit forming region. In addition, the insulating film 7 on the conductor film 6b in the memory cell forming region is not removed. The isolation part of the memory cell forming region is formed of the insulating film 2.

In the first embodiment described above, the insulating film 3 made of a silicon nitride film used to form the trench 5 for the capacitor is also used to form the trench 8 for forming the isolation part. More specifically, since it is possible to reduce one manufacturing step by using the insulating film 3 in common, the reduction in the number of manufacturing steps and the manufacturing time of the DRAM can be achieved.

Also, in the CMP process of the insulating film 9, the insulating film 3 made of a silicon nitride film is left also in the memory cell forming region, which makes it possible to protect the upper portion of the capacitor 6 below the insulating film 3 by the insulating film 3. Therefore, the damages on the capacitor 6 due to the CMP process can be reduced or prevented. Thus, it is possible to improve the yield, the reliability and electric properties of the DRAM.

Furthermore, it is possible to improve the yield, the reliability and electric properties of the DRAM by forming an isolation part (second isolation part) 10 after forming the trench 5 for the capacitor. More specifically, assuming that the trench 5 for the capacitor is formed after forming the isolation part 10, the part or most of the insulating film 9 of the isolation part 10 is etched and removed in the RCA cleaning performed after forming the trench 5, resulting in the reduction of the yield and the reliability. Meanwhile, since the problem that the insulating film 9 is etched and removed can be prevented by forming an isolation part 10 after forming the trench 5 for the capacitor, it is possible to improve the yield and the reliability of the DRAM.

Figure 8:
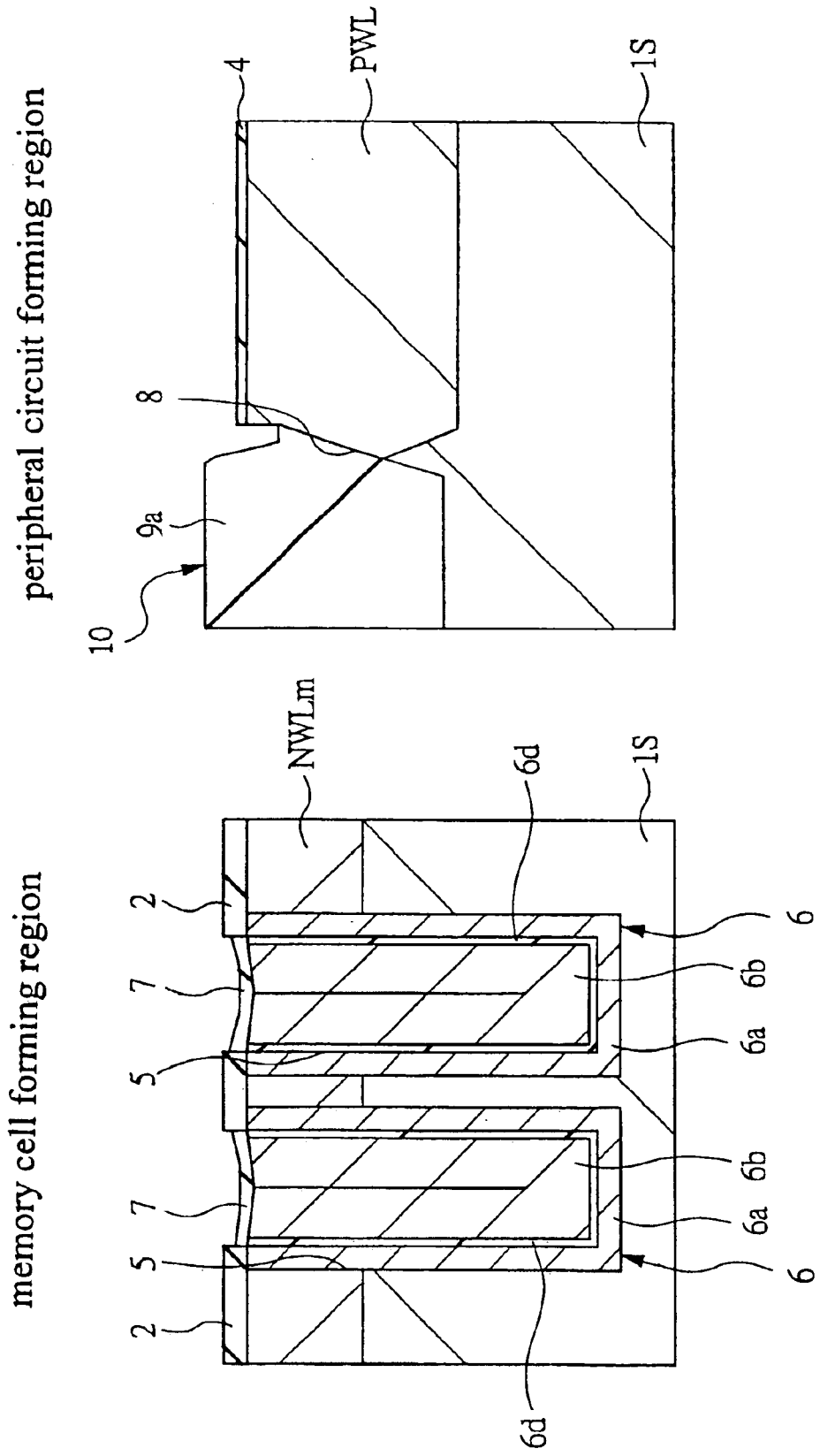
FIG. 8 is a sectional view showing the principal part of the memory cell forming region and the peripheral circuit forming region in the course of the manufacturing process of the DRAM subsequent to FIG. 7.

FIG. 8 is a sectional view showing the principal part of the memory cell forming region and the peripheral circuit forming region in the course of the manufacturing process of the DRAM subsequent to FIG. 7.

First, a natural oxide film and the insulating film 3 (refer to FIG. 7) are removed. In this case, the isolation part 10 in the peripheral circuit forming region is relatively thicker than the isolation part (insulating film 2) in the memory cell forming region, and a part of the isolation part 10 is buried in the trench 5 in the substrate 1S. More specifically, the bottom surface of the isolation part 10 is located at a position lower than that of the main surface of the substrate 1S. The part of the isolation part 10 buried in the trench 5 has a thickness larger than that of the part of the isolation part 10 not buried in the trench 5. However, the structure of the isolation part 10 is not limited to the trench type. For example, a field insulating film formed by the LOCOS (Local Oxidation of Silicon) method can also be employed.

Meanwhile, the isolation part (second isolation part) constituted of the insulating film 2 in the memory cell forming region functions to electrically isolate the conductor films (storage electrode) 6b of the capacitors 6 from each other, and is deposited on the main surface of the substrate 1S by the CVD method. The reason why the insulating film 2 is used to form the isolation part in the memory cell forming region is as follows. That is, since the capacitors 6 are densely arranged in the memory cell forming region when viewed in plan, the burying of the isolation part becomes difficult if the trench type is employed as the isolation part. In addition, even if the isolation trench can be buried, the stress is inevitably increased, resulting in the reduction of the yield and the reliability. Therefore, it is needed to increase the distance between adjacent capacitors 6 in the case of using the trench-type isolation part. In a case where the isolation part is formed by the use of the LOCOS method, the adjacent pitch is increased, which hinders the downsizing and the high integration. Also in the case of the LOCOS method, the reduction of the yield and the reliability is caused due to the undesirable stress increase described above. Contrary to this, the above-described disadvantages do not arise in the case where the insulating film 2 is used to form the isolation part. Therefore, it is possible to increase the yield and the reliability of the DRAM. In addition, since it is possible to reduce the distance between the adjacent capacitors 6 constituting the memory cell, the integration of the capacitors 6 can be improved while maintaining the performance and reliability of the isolation between the adjacent capacitors 6.

Subsequently, a photoresist film exposing the n well forming region and covering the other region is formed on the main surface of the substrate 1S, and phosphorus or arsenic is ion-implanted into the peripheral circuit forming region (pMIS forming region) and the n well forming region in the memory cell forming region with using the photoresist film as a mask. By so doing, the n well is formed in the peripheral circuit forming region and the n well NWLm is formed in the memory cell forming region. The n well NWLm in the memory cell forming region functions to electrically connect the n+ type semiconductor regions (plate electrode) of the plurality of capacitors 6 to each other.

Next, after the removal of the photoresist film used to form the n well, a photoresist film exposing the p well forming region and covering the other region is formed on the main surface of the substrate 1S, and boron or boron difluoride ($BF_2$) is ion-implanted into the p well forming region (nMIS forming region) in the peripheral circuit forming region with using the photoresist film as a mask. By so doing, a p well PWL is formed in the peripheral circuit forming region. It is also possible to form the p well in advance of the formation of the n well.

The above-described wells can be formed in the following manner as well. That is, after forming the n well (NWLm) by the ion-implantation of phosphorus or arsenic on the entire main surface of the substrate 1S without forming the photoresist film, the p well PWL is formed in the same manner as that of the p well PWL described above (It is possible to form the p well in advance of the formation of the n well.). In this case, it is necessary to set the impurity concentration at the time of forming the p well higher than that in the above-described method so as to reverse the conductivity type of the n well formed in the p well forming region. According to such a method, it is possible to reduce one step of the photolithography process including a sequence of steps such as exposure, development, baking and the like. Therefore, the reduction in the number of manufacturing steps and the manufacturing time of the DRAM can be achieved.

After the ion implantation process for forming the well as described above, the substrate 1S is subjected to the thermal treatment to activate the impurities introduced in the well. Thereafter, the insulating film 4 is removed.

Figure 9:
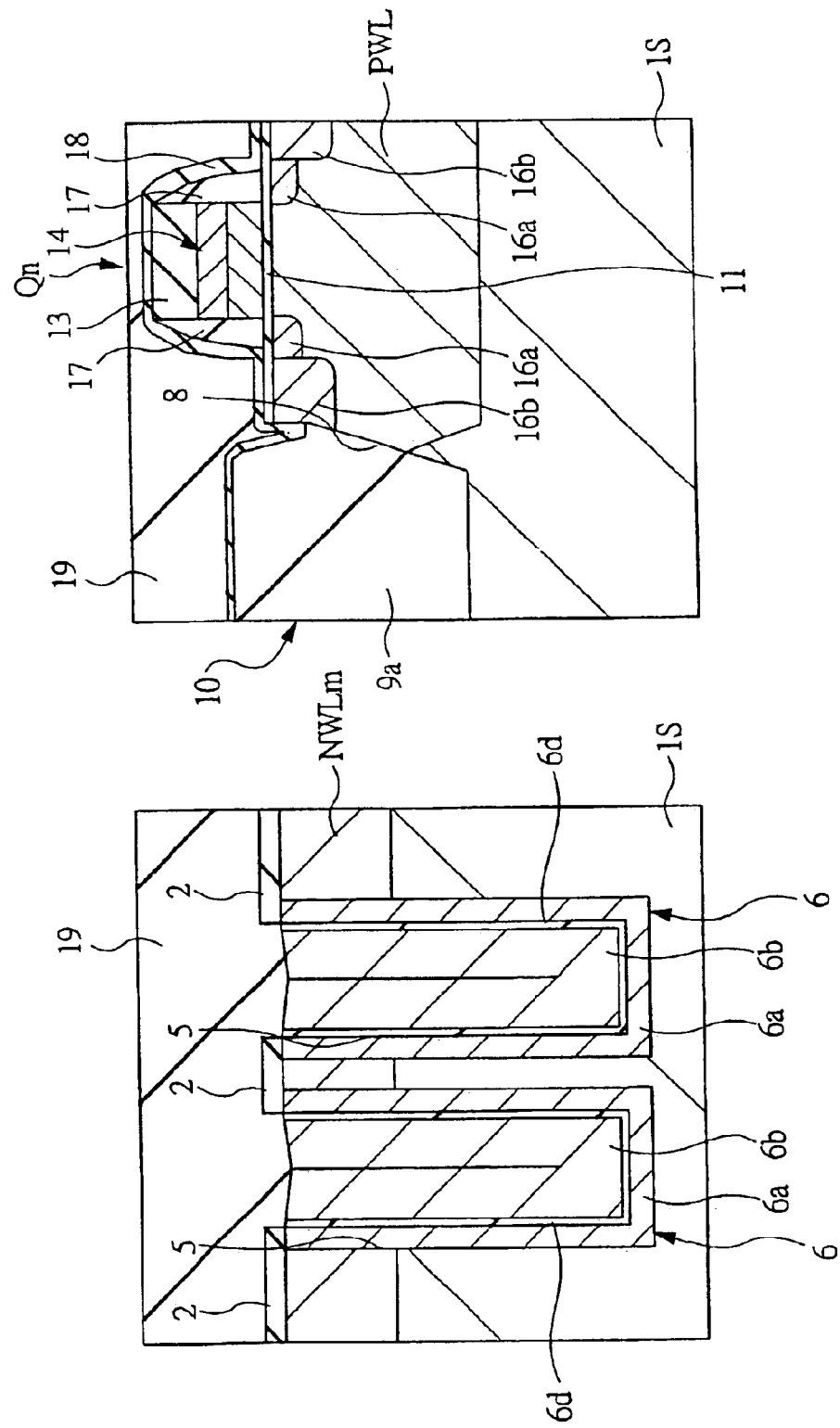
FIG. 9 is a sectional view showing the principal part of the memory cell forming region and the peripheral circuit forming region in the course of the manufacturing process of the semiconductor device subsequent to FIG. 8.

FIG. 9 is a sectional view showing the principal part of the memory cell forming region and the peripheral circuit forming region in the course of the manufacturing process of the DRAM subsequent to FIG. 8.

First, a gate insulating film 11 is formed on the main surface of the substrate 1S in the peripheral circuit forming region. The gate insulating film 11 is made of, for example, a silicon oxynitride film with a thickness of about 3 nm. The gate insulating film 11 constituted of the oxynitride silicon film makes it possible to improve the hot carrier resistance and the insulation strength of the gate insulating film 11. The oxynitride silicon film can be formed by performing the thermal treatment to the substrate 1S in the atmosphere containing nitrogen gas such as NO, $NO_2$, or $NH_3$.

Also, it is also possible to use a combined insulating film made of a silicon nitride film or a silicon oxide film and a silicon nitride film to form the gate insulating film 11. In a case where the thickness of the gate insulating film 11 made of silicon oxide is reduced to 5 nm or less, in particular, to 3 nm or less in terms of the thickness of a silicon dioxide film, the reduction of the insulation strength becomes conspicuous due to the generation of the direct tunnel current and the hot carriers by the stress. Since the silicon nitride film has a higher dielectric constant than that of the silicon oxide film, it is possible to make the actual thickness of the silicon nitride film larger than that obtained in terms of the thickness of the silicon dioxide film. More specifically, even if the silicon nitride film is used and the thickness thereof is physically large, the capacitance equivalent to that of the relatively thin silicon dioxide film can be obtained. Accordingly, by using a single silicon nitride film or a combined film of a silicon nitride film and a silicon oxide film to constitute the gate insulating film 11, the effective thickness of the gate insulating film can be made larger than that of the gate insulating film constituted of a silicon oxide film. As a result, it is possible to improve the reduction in the insulation strength due to the occurrence of the tunnel leak current and the hot carrier.

Subsequently, a conductor film such as a polycrystalline silicon film containing phosphorus with a thickness of about 70 nm, a barrier conductor film with a thickness of about 5 nm made of tungsten nitride (WN), and a conductor film with a thickness of about 80 nm made of tungsten are sequentially deposited on the main surface of the substrate 1S from below by the CVD method. Thereafter, an insulating film 13 made of a silicon nitride film with a thickness of about 200 nm is deposited on the conductor film by the CVD method, and then, a photoresist film (pattern covering a gate electrode forming region and exposing the other region) for forming a gate electrode is formed thereon. Then, after the insulating film 13 exposed through the photoresist film used as an etching mask is etched and removed, the photoresist film is removed by ashing.

Subsequently, the above-described three conductor films exposed through the remaining insulating film 13 used as an etching mask are etched and removed, thereby forming a gate electrode 14 in the peripheral circuit forming region. Then, after forming a photoresist film exposing the nMIS forming region and covering the other region in the peripheral circuit forming region, phosphorus or arsenic is ion-implanted into the substrate 1S with using the photoresist film as a mask. Subsequently, after removing the photoresist film, a photoresist film exposing the pMIS forming region and covering the other region is formed in the peripheral circuit forming region. Thereafter, boron or boron difluoride is ion-implanted into the substrate 1S with using the photoresist film as a mask (The impurity introduction steps can be performed in reverse order.). Then, by performing the thermal treatment to the substrate 1S, an n− type semiconductor region 16a and a p− type semiconductor region for forming an LDD (Lightly Doped Drain) structure of the MIS are formed on the substrate 1S in the peripheral circuit forming region.

Next, an insulating film made of a silicon nitride film with a thickness of about 80 nm is deposited on the main surface of the substrate 1S by the CVD method. Thereafter, the insulating film is etched back by the dry etching method, thereby forming a sidewall 17 on the side surface of the gate electrode 14. Then, after a photoresist film exposing the nMIS forming region and covering the other region is formed in the peripheral circuit forming region, phosphorus or arsenic is ion-implanted into the substrate 1S with using the photoresist film as a mask. Subsequently, after removing the photoresist film, a photoresist film exposing the pMIS forming region and covering the other region is formed in the peripheral circuit forming region. Thereafter, boron or boron fluoride is ion-implanted into the substrate 1S with using the photoresist film as a mask (The impurity introduction steps can be performed in reverse order.). Then, the thermal treatment is performed to the substrate 1S, thereby forming an $n^+$ type semiconductor region 16b and a $p^+$ type semiconductor region for forming a source region and a drain region of the MIS on the substrate 1S in the peripheral circuit forming region. In this manner, the nMIS Qn and the pMIS for forming the peripheral circuit are formed in the peripheral circuit forming region. The nMIS Qp and the pMIS for forming the peripheral circuit are formed as the lateral MIS. The lateral MIS is a transistor having a structure in which the channel current flows along the main surface of the substrate 1S. Thereafter, an insulating film 18 made of a silicon nitride film with a thickness of about 5 nm is deposited on the main surface of the substrate 1S by the CVD method. This insulating film 18 functions as an etching stopper in the later-described hole forming step.

Subsequently, an insulating film 19 made of a silicon oxide film with a thickness of about 300 nm is deposited on the main surface of the substrate 1S by the CVD method. Thereafter, the insulating film 19 is polished by the CMP method so as to planarize the upper surface thereof.

In this embodiment described above, the nMIS Qn and the pMIS for the peripheral circuit are formed after forming the capacitor 6. Assuming that the capacitor 6 is formed after forming the MIS for the peripheral circuit, the thermal treatment performed to form the capacitor 6 (thermal treatment performed in the process of forming an $n^+$ type semiconductor region, an $n^+$ type conductor film, and a capacitor insulating film) causes the diffusion of the impurities in the semiconductor region constituting the MIS for the peripheral circuit and the deterioration of the gate insulating film. As a result, the reliability and the electric properties of the MIS for the peripheral circuit are deteriorated. Contrary to this, such a problem can be prevented by forming the MIS of the peripheral circuit after forming the capacitor 6. Therefore, it is possible to improve the reliability and the electric properties of the nMIS Qn and the pMIS constituting the peripheral circuit.

Also, since the MIS constituting the peripheral circuit is designed to be a lateral type, not a vertical type described later, the wiring arrangement of the peripheral circuit forming region can be facilitated. Also, since the MIS of the peripheral circuit is formed separately from the MIS for the memory cell, the gate insulating film structure suitable to the MIS of the peripheral circuit (with respect to thickness and material) can be obtained. Therefore, it is possible to obtain the desirable on-current of the MIS of the peripheral circuit.

Figure 10:
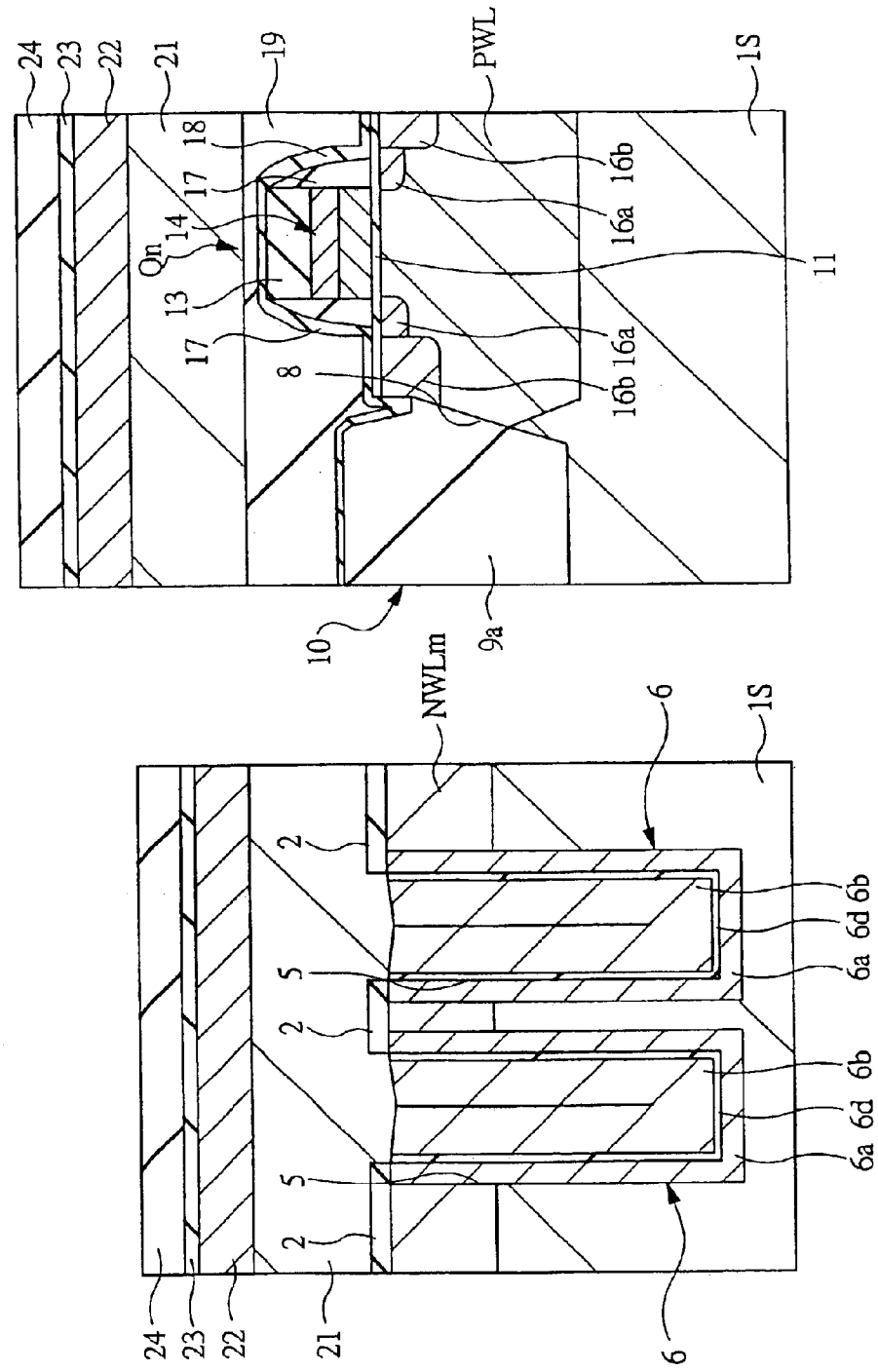
FIG. 10 is a sectional view showing the principal part of the memory cell forming region and the peripheral circuit forming region in the course of the manufacturing process of the semiconductor device subsequent to FIG. 9.
Figure 11:
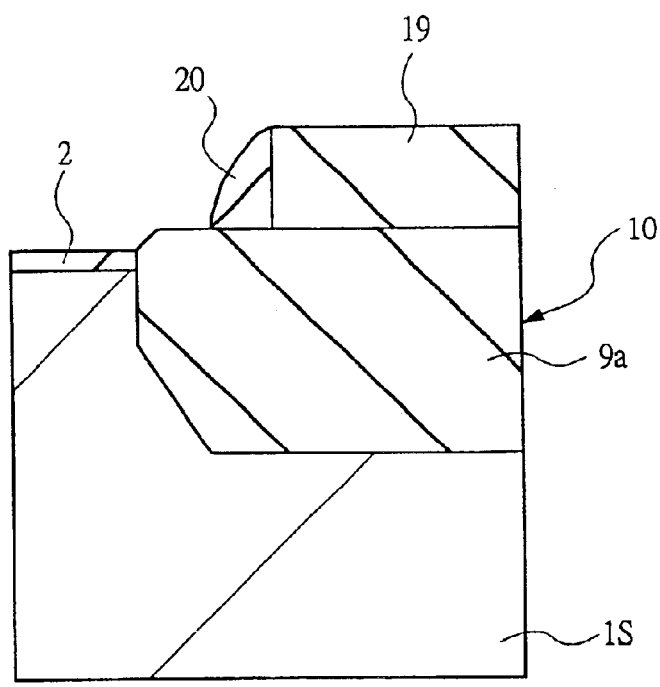
FIG. 11 is an enlarged sectional view showing the principal part of a boundary between the memory cell forming region and the peripheral circuit forming region of the semiconductor device.

FIG. 10 is a sectional view showing the principal part of the memory cell forming region and the peripheral circuit forming region in the course of the manufacturing process of the DRAM subsequent to FIG. 9. FIG. 11 is an enlarged sectional view showing the principal part of the boundary between the memory cell forming region and the peripheral circuit forming region.

First, a photoresist film exposing the memory cell forming region and covering the peripheral circuit forming region is formed on the insulating film 19 shown in FIG. 9. Thereafter, the insulating film 19 is etched and removed with using the photoresist film as an etching mask, thereby removing the insulating film in the memory cell forming region and leaving the insulating film 19 in the peripheral circuit forming region as shown in FIG. 10. Subsequently, an insulating film made of a silicon oxide film with a thickness of about 300 nm is deposited on the main surface of the substrate 1S by the CVD method. Thereafter, the insulating film is etched back by the dry etching method, thereby forming a sidewall insulating film 20 made of the silicon oxide film on the side surface of the insulating film 19 at the boundary between the memory cell forming region and the peripheral circuit forming region as shown in FIG. 11. The surface of the sidewall insulating film 20 is tapered so as to smooth the step part at the boundary between the memory cell forming region and the peripheral circuit forming region. If there is such a step part at the boundary, the etching residue of the conductor film (e.g., a conductor film 21 made of a polycrystalline silicon film) is left in this step part, which causes problems of the short-circuit and the break of the upper layer wiring running across the boundary. In this embodiment, however, the step part at the boundary can be reduced by providing the sidewall insulating film 20. Therefore, it is possible to prevent the problems of the short-circuit and the break of the upper layer wiring caused from the etching residue.

Subsequently, an undoped amorphous silicon film with a thickness of about 400 nm is deposited by the CVD method. Thereafter, the thermal treatment at 600° C. is performed for 12 hours, thereby forming a polycrystalline silicon film (first semiconductor layer) 21 to be a channel portion. This channel (amorphous silicon film) portion can also be formed in such a manner as follows. First, the upper surface of the conductor film 6b is nitrided by the $NH_3$ gas to form a thin silicon nitride film (first ultrathin insulating film) with a thickness of about 1 nm thereon. Thereafter, a film made of undoped amorphous silicon with a thickness of about 200 nm is deposited on the main surface of the substrate 1S by the CVD method. Subsequently, after the thermal treatment at 600° C. for 12 hours, the upper surface of the film made of amorphous silicon is nitrided by the $NH_3$ gas to form a silicon nitride film (second ultrathin insulating film) with a thickness of about 2 to 3 nm thereon. Then, a film made of undoped amorphous silicon is deposited on the silicon nitride film by the CVD method. Further, after the thermal treatment at 600° C. for 12 hours, the upper surface of the film made of amorphous silicon is nitrided by the $NH_3$ gas to form a thin silicon nitride film (third ultrathin insulating film) with a thickness of about 1 nm thereon. This is an example of the method of manufacturing the PLED (Phase-state Low Electron Number Drive) transistor.

Next, an $n^+$ type conductor film (second semiconductor layer) 22 made of a silicon film doped with phosphorus and with a thickness of about 200 nm is deposited on the main surface of the substrate 1S by the CVD method. Subsequently, an insulating film (first insulating film) 23 made of a silicon oxide film with a thickness of about 10 nm is deposited on the conductor film 22 by the CVD method. Thereafter, an insulating film 24 made of a silicon nitride film with a thickness of about 100 nm is deposited thereon by the CVD method.

Figure 12:
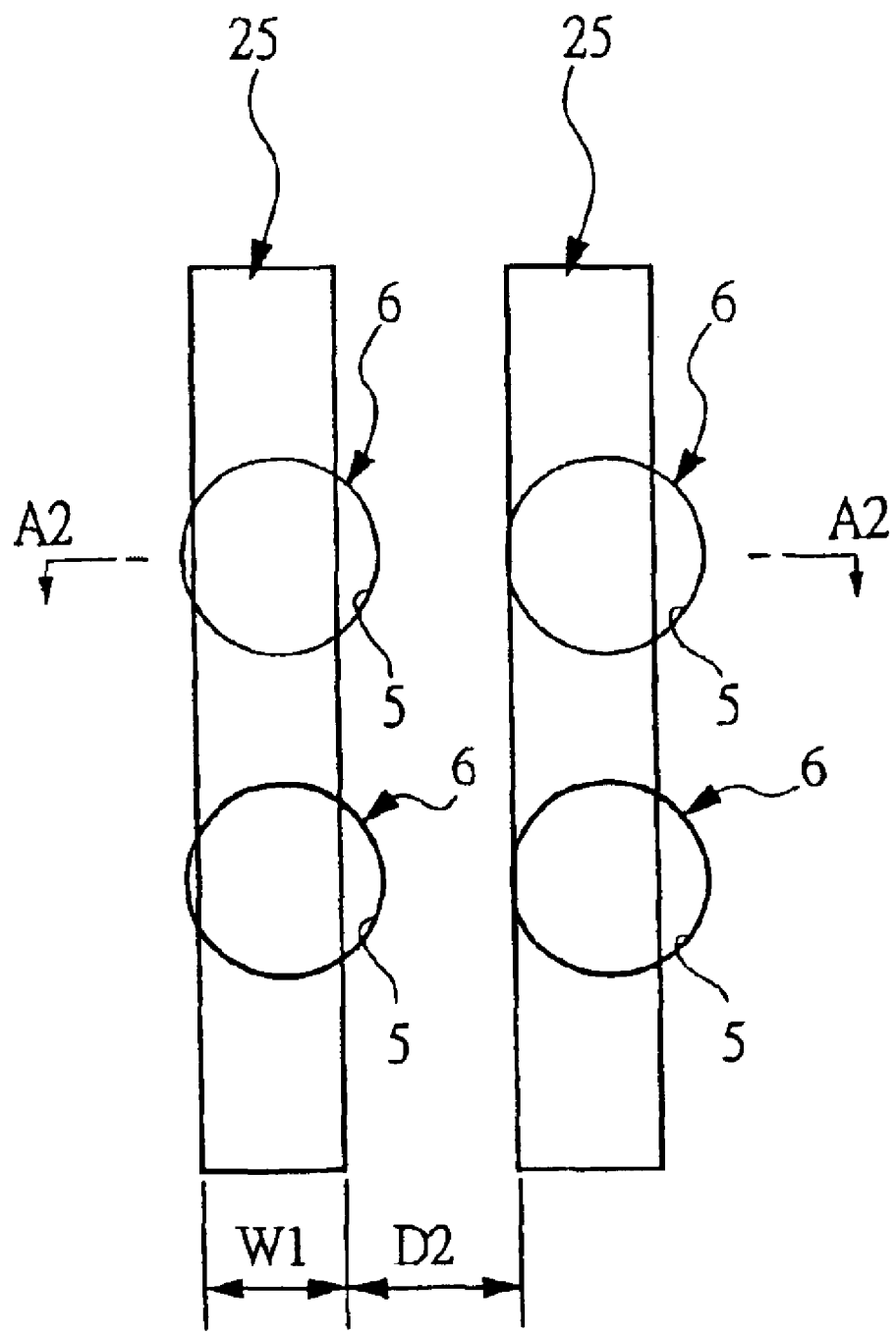
FIG. 12 is a plan view showing the principal part of the memory cell forming region in the course of the manufacturing process of the semiconductor device subsequent to FIG. 10.
Figure 13:
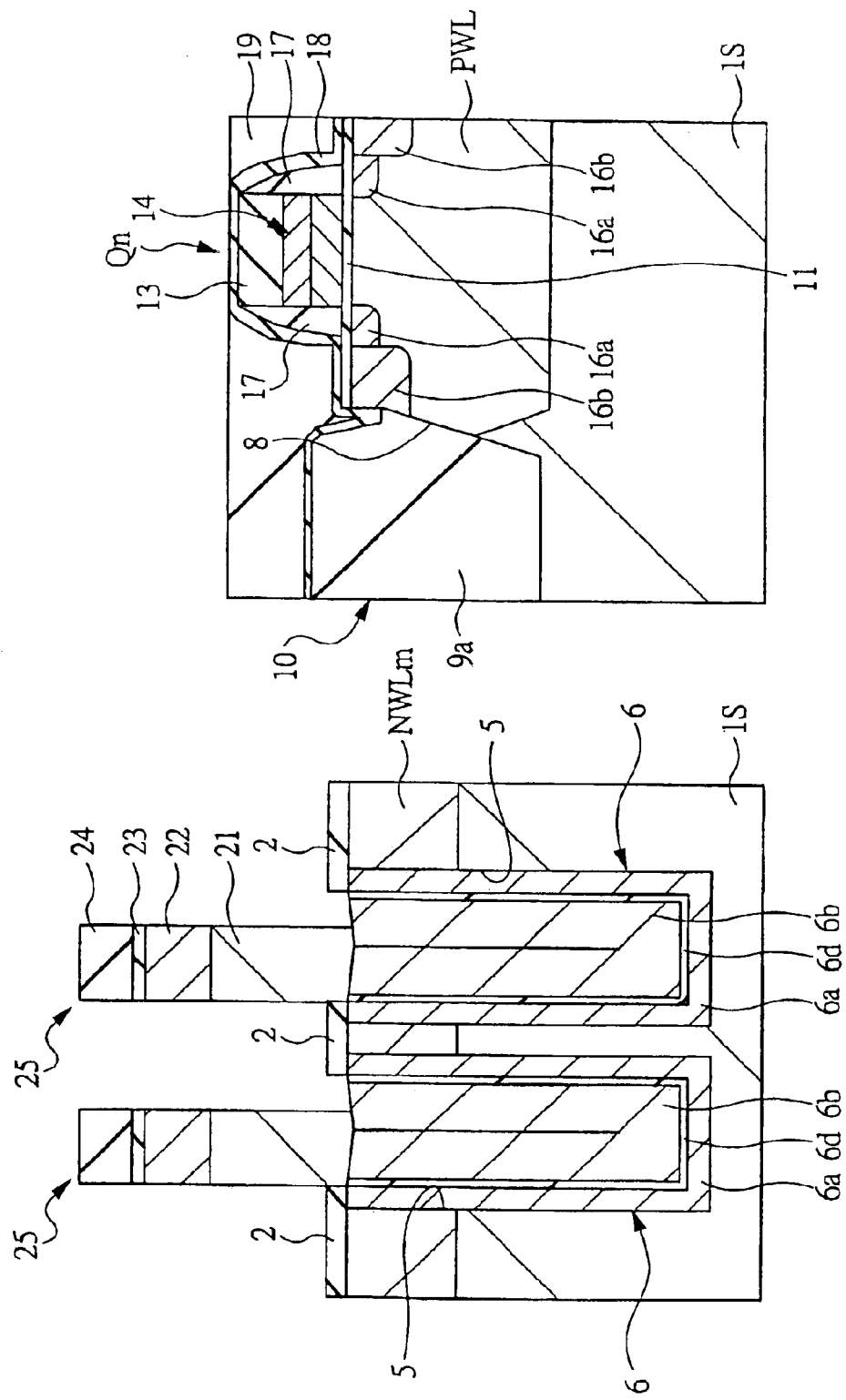
FIG. 13 is a sectional view showing the principal part of the memory cell forming region (taken along the line A2—A2 in FIG. 12) and that of the peripheral circuit forming region in the course of the manufacturing process of the semiconductor device.

FIG. 12 is a plan view showing the principal part of the memory cell forming region in the course of the manufacturing process of the DRAM subsequent to FIG. 10. FIG. 13 is a sectional view showing the principal part of the memory cell forming region (taken along the line A2—A2 in FIG. 12) and that of the peripheral circuit forming region shown in FIG. 12 in the course of the manufacturing process of the DRAM.

First, a photoresist film covering a plurality of strip-shaped pattern regions formed in parallel to each other in the vertical direction in FIG. 12 and exposing the other region is formed on the insulating film 24 in the memory cell forming region. Thereafter, the insulating films 24 and 23 exposed through the photoresist film used as an etching mask are sequentially etched. Subsequently, the photoresist film is removed by ashing, and then, the conductor film 22 and the channel forming portion 21 exposed through the remaining insulating films 24 and 23 used as etching masks are etched and removed. By so doing, a plurality of wall bodies (first pattern) 25 are formed in the memory cell forming region. The plurality of wall bodies 25 extend in the vertical direction (first direction) in FIG. 12 and are arranged in parallel to each other in the lateral direction in FIG. 12. The wall bodies 25 are formed so as to two-dimensionally overlap the plurality of capacitors 6 arranged in the extending direction of the wall body 25. Each wall body 25 is composed by sequentially laminating the polycrystalline silicon film 21, the $n^+$ type conductor film 22, the insulating films 23 and 24 on the main surface of the substrate 1S. The wall body 25 stands on the main surface of the substrate 1 and extends in the vertical direction with respect to the same. The width (dimension in the lateral direction in FIG. 12) W1 of the wall body 25 and the distance D2 between the wall bodies 25 adjacent in the width direction (lateral direction in FIG. 12) of the wall body 25 are about 90 nm. Meanwhile, in the peripheral circuit forming region, the insulating films 23 and 24, the conductor film 22, and the polycrystalline silicon film 21 are removed, and the insulating film 19 made of a silicon oxide film and the insulating film 18 made of a silicon nitride film on the gate electrode 14 are exposed.

Figure 14:
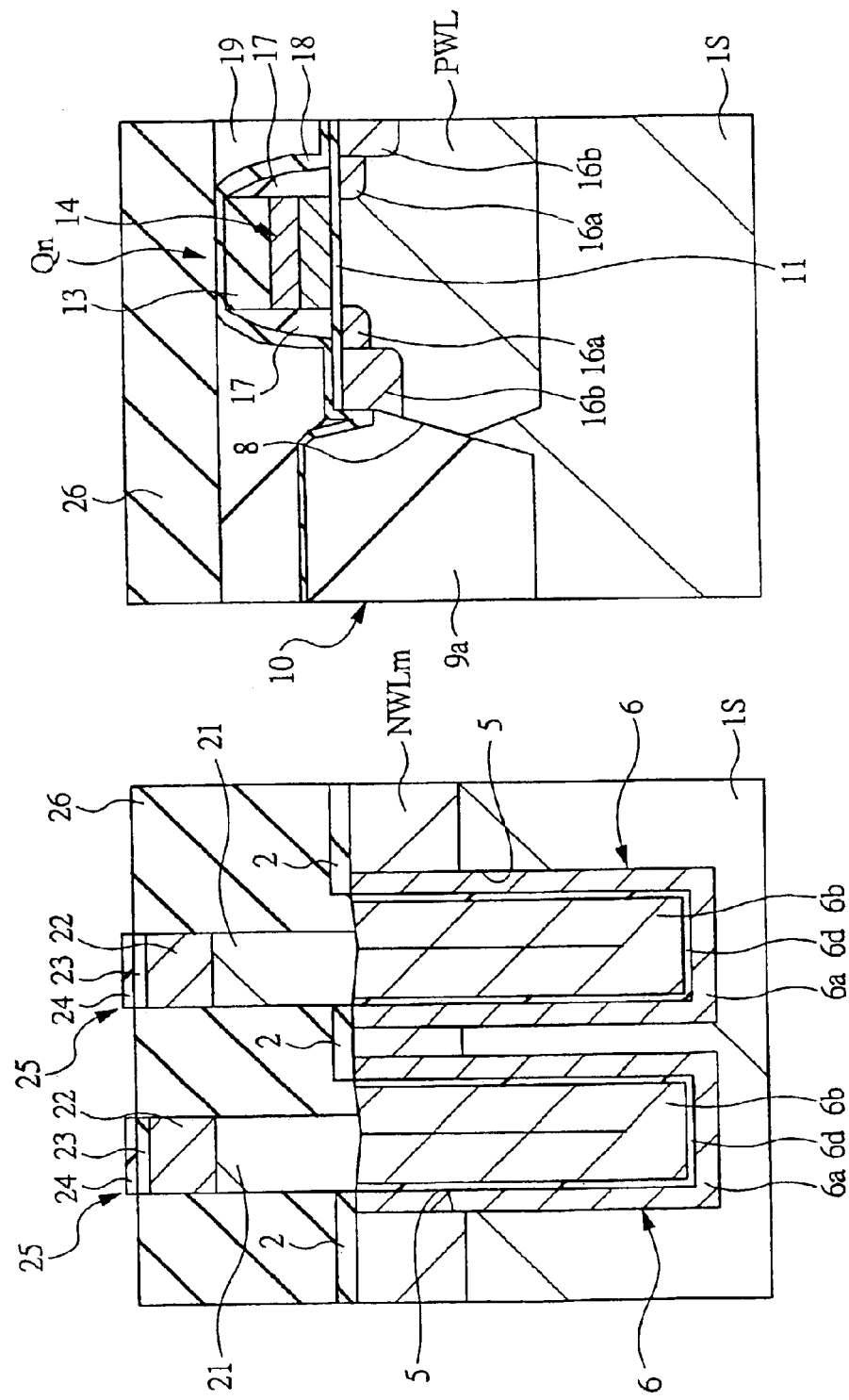
FIG. 14 is a sectional view showing the principal part of the memory cell forming region and the peripheral circuit forming region in the course of the manufacturing process of the semiconductor device subsequent to FIG. 13.

FIG. 14 is a sectional view showing the principal part of the memory cell forming region and the peripheral circuit forming region in the course of the manufacturing process of the DRAM subsequent to FIG. 13.

In this step, an insulating film (second insulating film) 26 made of a silicon oxide film with a thickness of about 500 nm is deposited on the main surface of the substrate S1 by the CVD method. Thereafter, the upper surface of the insulating film 26 is polished by the CMP method to planarize the same. By so doing, the insulating film 26 is buried in the spaces between the adjacent wall bodies 25.

Figure 15:
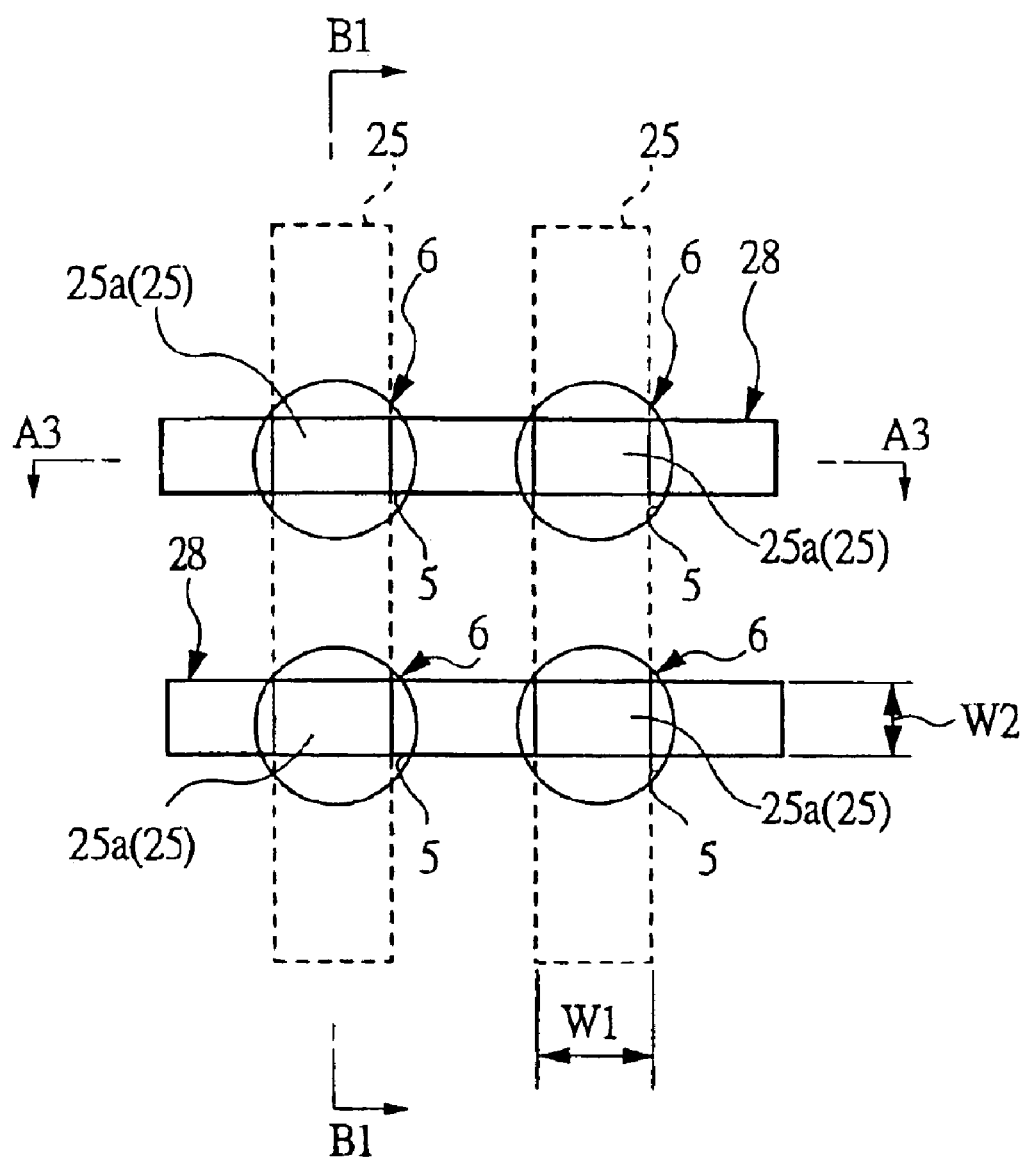
FIG. 15 is a plan view showing the principal part of the memory cell forming region in the course of the manufacturing process of the DRAM subsequent to FIG. 14.
Figure 16:
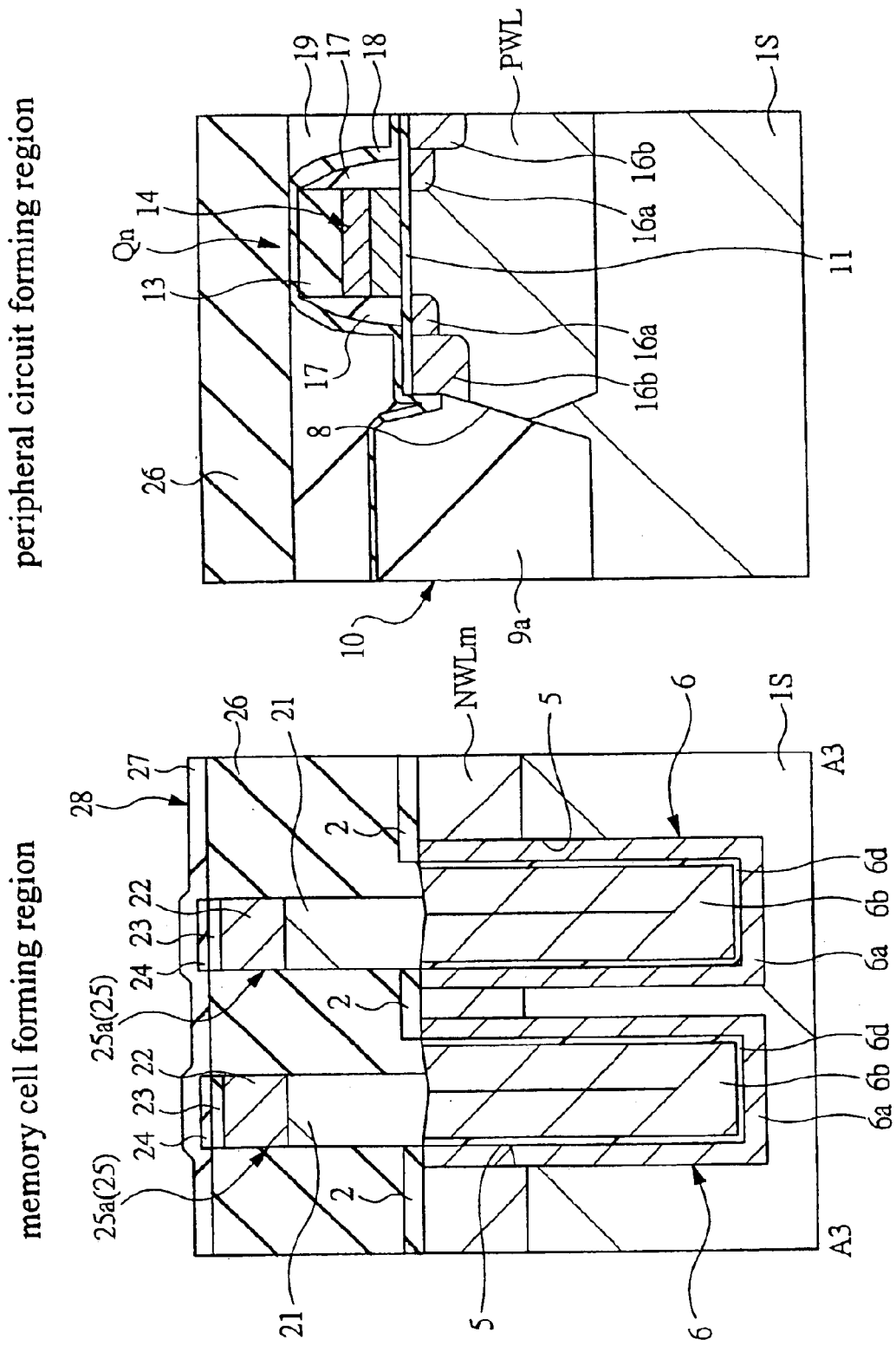
FIG. 16 is a sectional view showing the principal part of the memory cell forming region (taken along the line A3—A3 in FIG. 15) and that of the peripheral circuit forming region in FIG. 15 in the course of the manufacturing process of the DRAM.
Figure 17:
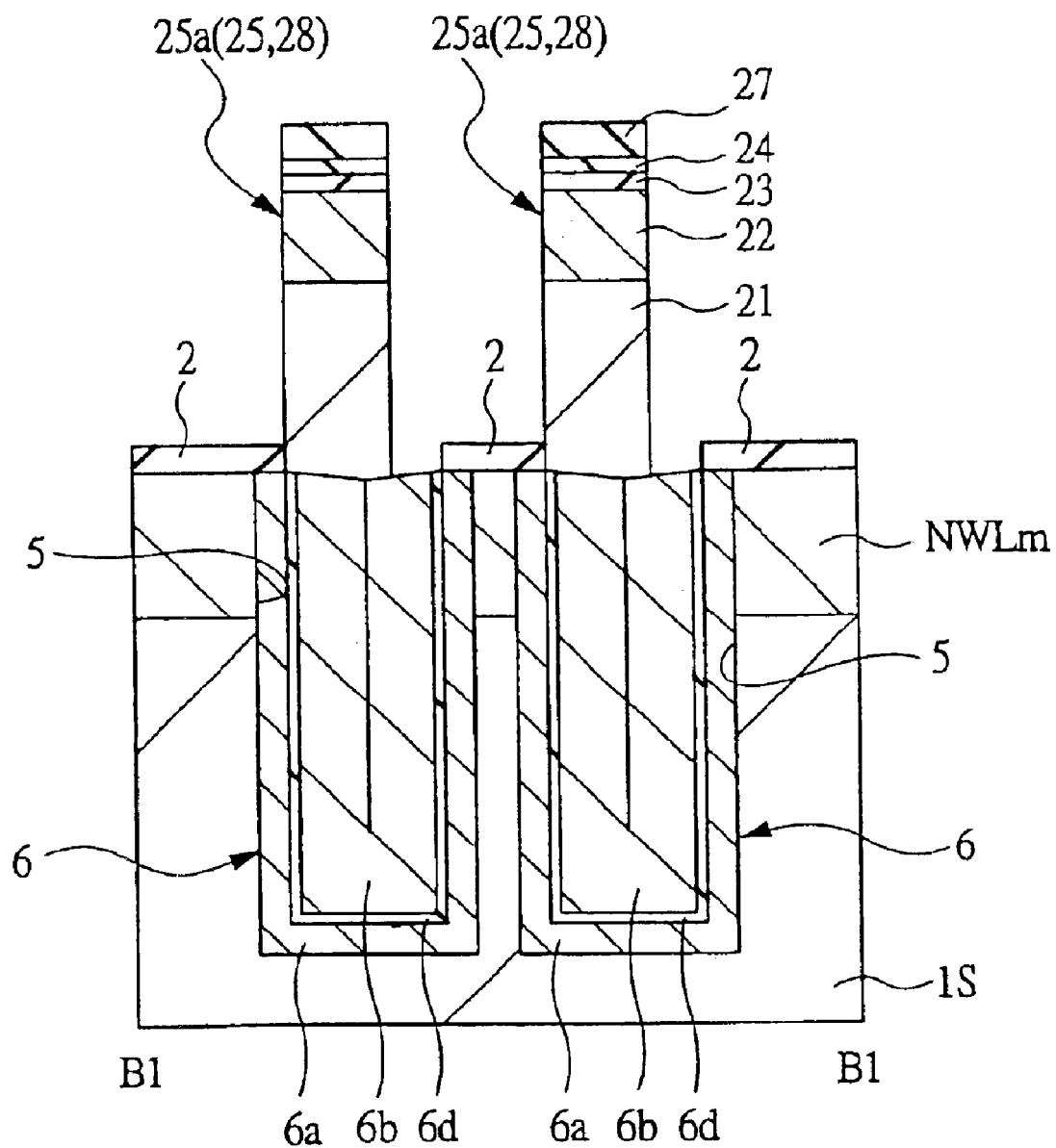
FIG. 17 is a sectional view taken along the line B1—B1 in FIG. 15.

FIG. 15 is a plan view showing the principal part of the memory cell forming region in the course of the manufacturing process of the DRAM subsequent to FIG. 14. FIG. 16 is a sectional view showing the principal part of the memory cell forming region (taken along the line A3—A3 in FIG. 15) and that of the peripheral circuit forming region in FIG. 15 in the course of the manufacturing process of the DRAM. FIG. 17 is a sectional view taken along the line B1—B1 in FIG. 15.

First, an insulating film 27 made of a silicon oxide film with a thickness of about 100 to 150 nm on the main surface of the substrate 1S by the CVD method. Thereafter, a photoresist film covering a plurality of strip-shaped pattern regions formed in parallel to each other in the lateral direction in FIG. 15 and exposing the other region is formed on the insulating film 27 in the memory cell forming region. Then, the insulating film 27 exposed through the photoresist film used as an etching mask is etched and removed. Subsequently, after the removal of the photoresist film, the insulating films 24, 23, and 26, the conductor film 22, and the polycrystalline silicon film 21 exposed through the remaining insulating film 27 used as an etching mask are etched and removed, thereby forming a plurality of wall bodies (second pattern) 28. The wall bodies 28 extend in parallel to each other in the lateral direction (second direction) in FIG. 15 so as to cross the extending direction of the wall body 25 at right angles. The plurality of wall bodies 28 extend in the lateral direction in FIG. 15 and are arranged in parallel to each other in the vertical direction in FIG. 15. The wall bodies 28 are formed so as to two-dimensionally overlap the plurality of capacitors 6 arranged in the extending direction of the wall body 28. In this wall body 28, a columnar body 25a formed by etching the wall body 25 is formed on the capacitor 6. The columnar body 25a is composed by sequentially laminating the polycrystalline silicon film 21, the $n^+$ type conductor film 22, the insulating films 23 and 24 on the main surface of the substrate 1S. The wall body 25 stands on the main surface of the substrate 1 and extends in the vertical direction with respect to the same. Note that the columnar body 25a has two side surfaces (first and second surfaces) crossing to the main surface of the substrate 1S, two side surfaces (third and fourth surfaces) crossing to the main surface of the substrate 1S and the above-mentioned two side surfaces, and an upper surface (fifth surface) crossing to these four side surfaces and along (approximately parallel to) the main surface of the substrate 1S.

In the first embodiment, the width W2 of the wall body 28 is set relatively shorter than the width W1 of the wall body 25. Therefore, the two-dimensional shape of the columnar body 25a (shape of the fifth surface) is a rectangular shape with the longer sides as long as the width W1 and the shorter sides as long as the width W2. More specifically, since the width W1 of the side surface related to the channel current of the later-described vertical transistor is kept relatively long in the columnar body 25a, it is possible to sufficiently obtain the on-current of the vertical transistor. Meanwhile, since the width W2 of the side surface little related to the channel current of the later-described vertical transistor is set short in the columnar body 25a, it is possible to reduce the sectional area of the columnar body 25a, and the defect density can be reduced in proportion to the reduced area. Therefore, the leak current (off-current) between the source and drain of the vertical transistor can be reduced. Accordingly, it is possible to improve the on-off ratio and to set the large margin in the circuit operation. As a result, the yield of the DRAM can be improved. Also, since the vertical transistor is connected to the capacitor 6 to constitute the memory cell selecting transistor, the reduction in the leak current of the transistor makes it possible to improve the refresh characteristic of the DRAM. In addition, since it is possible to reduce the off-current while sufficiently maintaining the on-current of the vertical transistor, both of the improvement of the operation speed and the reduction in the power consumption of the DRAM can be achieved. Note that the polycrystalline silicon film 21 of the columnar body 25a is electrically connected to the $n^+$ type conductor film 22 and the $n^+$ type conductor film 6b of the capacitor 6.

Figure 19:
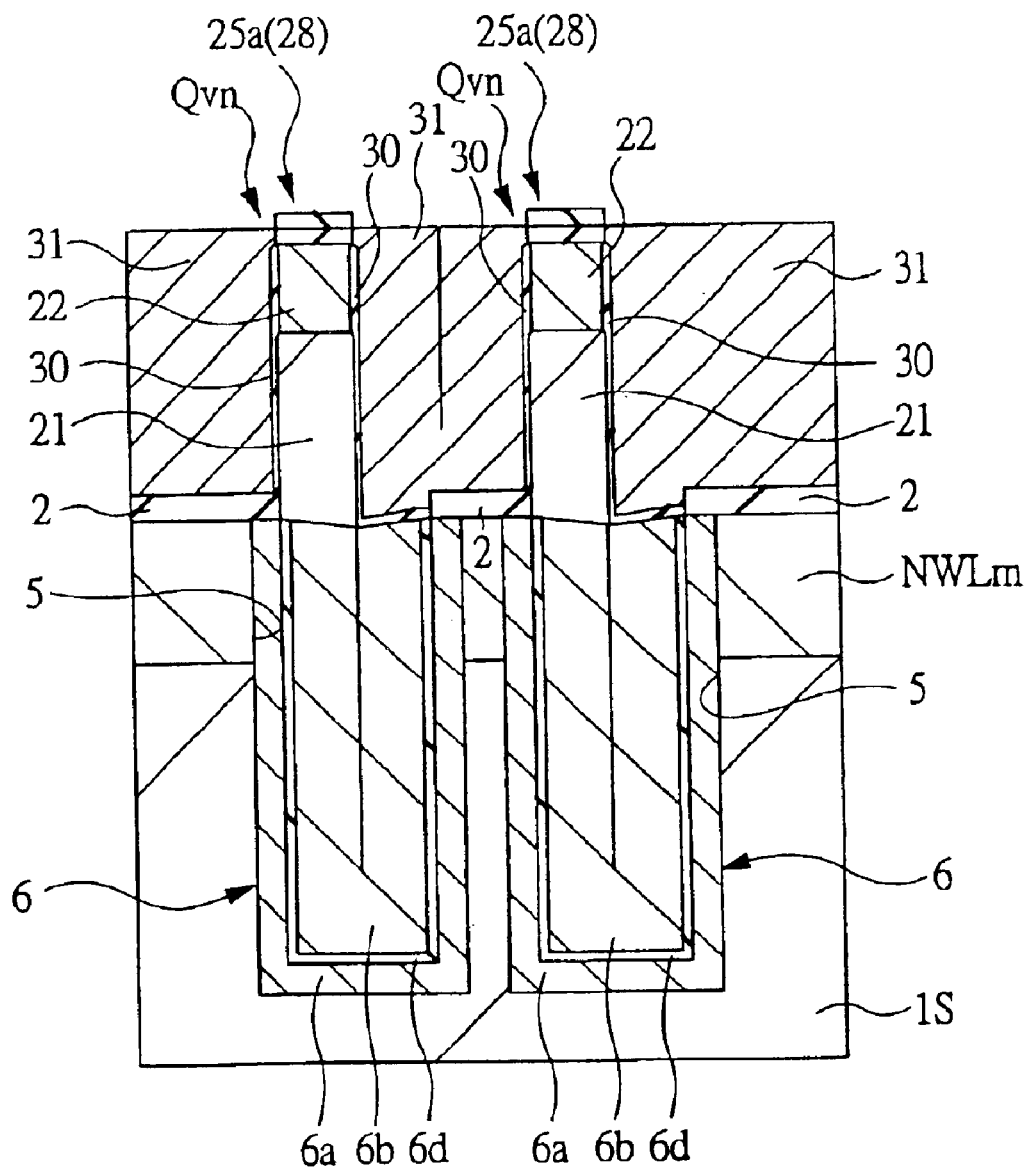
FIG. 19 is a sectional view showing the principal part of the memory cell forming region (taken along the line A3—A3 in FIG. 15) of the semiconductor device shown in FIG. 18 in the course of the manufacturing process of the same.
Figure 20:
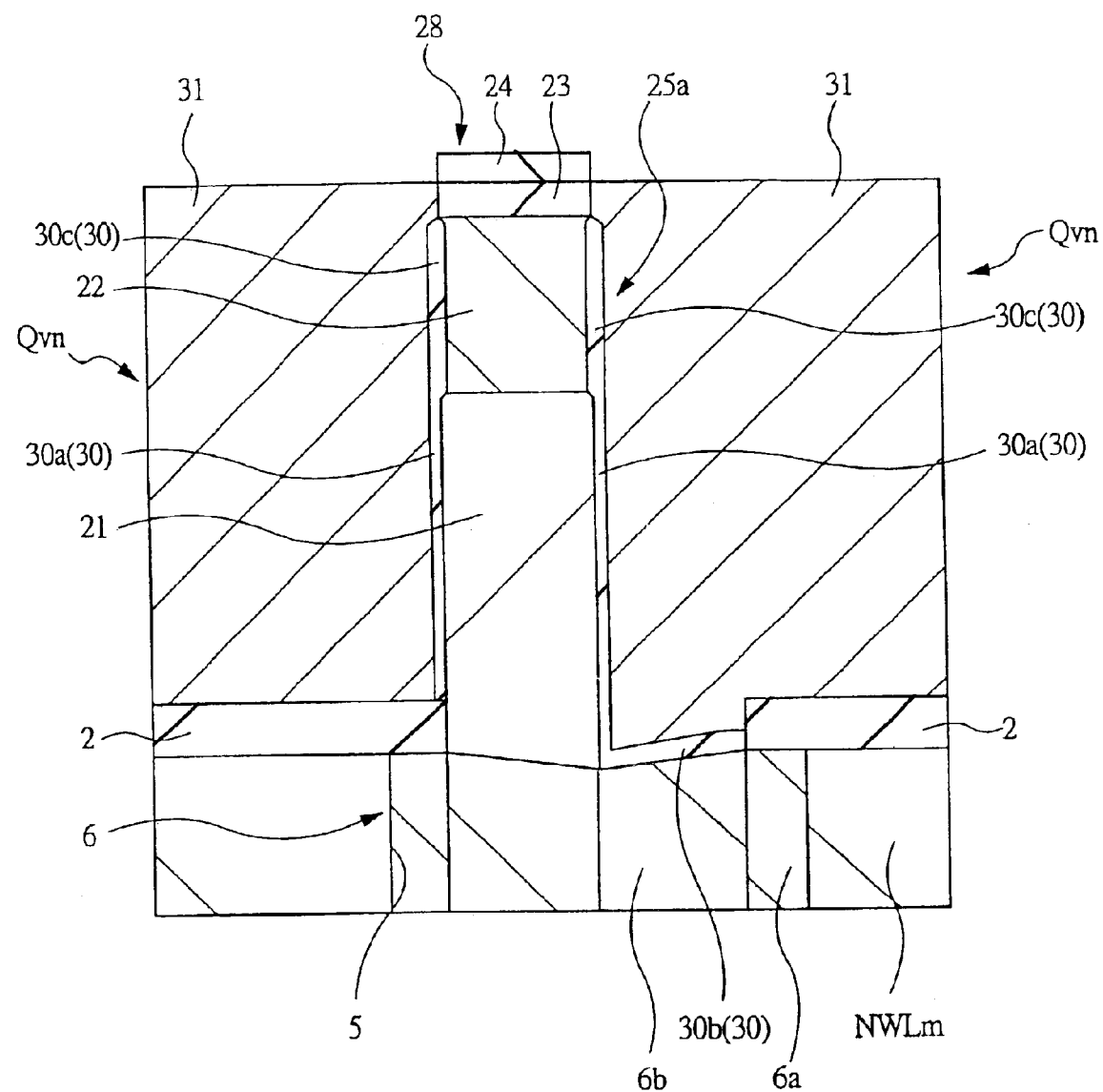
FIG. 20 is an enlarged sectional view showing the principal part of FIG. 19.

FIG. 18 is a sectional view showing the principal part of the memory cell forming region and the peripheral circuit forming region in the course of the manufacturing process of the DRAM subsequent to FIGS. 15 to 17. FIG. 19 is a sectional view showing the principal part of the memory cell forming region (taken along the line A3—A3 in FIG. 15)

shown in FIG. 18 in the course of the manufacturing process of the DRAM. FIG. 20 is an enlarged sectional view showing the principal part of FIG. 19.

First, the thermal treatment is performed to the substrate 1S, thereby forming an insulating film 30 made of a silicon oxide film with a thickness of about 5 to 20 nm on the side surface with a larger width (W1) of the columnar body 25a and on the exposed upper surface of the conductor film 6b of the capacitor 6. The insulating film 30 constitutes the gate insulating film of the above-described vertical transistor, and the thickness thereof changes depending on the forming positions as shown in FIG. 20. More specifically, an insulating film 30a (30) formed in contact with the polycrystalline silicon film 21 with a relatively low impurity concentration is formed relatively thinly. On the other hand, insulating films 30b and 30c (30) formed in contact with the conductor films 6b and 22 with a relatively high impurity concentration are formed relatively thickly. The relatively small thickness of the insulating film 30a formed in contact with the polycrystalline silicon film 21 makes it possible to improve the channel current (drain current) of the vertical transistor. Therefore, the operation performance of the vertical transistor can be improved. As a result, the operation speed of the DRAM can be improved. Meanwhile, the relatively large thickness of the insulating films 30b and 30c formed in contact with the conductor films 6b and 22 makes it possible to reduce the electric field applied from the gate electrode of the vertical transistor to the drain terminal. Therefore, the GIDL (Gate Induced Drain Leakage) can be reduced. Accordingly, it is possible to improve the on-off ratio and to set the large margin in the circuit operation. As a result, the yield of the DRAM can be improved. Furthermore, it is possible to improve the refresh characteristic of the DRAM. In addition, since it is possible to reduce the off-current while sufficiently maintaining the on-current of the vertical transistor, both of the improvement of the operation speed and the reduction in the power consumption of the DRAM can be achieved. Also, since the thickness of the gate insulating film is varied by one gate oxidation process in the first embodiment, it is possible to obtain the gate insulating film with the above-described structure and also the above-described advantages without increasing the number of manufacturing steps.

Subsequently, a conductor film (first conductor film) 31 made of a low-resistance polycrystalline silicon film containing boron or a low-resistance polycrystalline silicon-germanium mixed crystal film containing boron is deposited to a thickness of about 150 nm on the main surface of the substrate 1S by the CVD method. Thereafter, the upper surface of the conductor film 31 is polished by the CMP method to planarized the same. By so doing, the conductor film 31 made of the low-resistance polycrystalline silicon film is buried in the space between the adjacent wall bodies 28. By using the polycrystalline silicon film as a material of the conductor film 31, the conductor film 31 can be favorably buried in the space between the adjacent wall bodies 28.

The n channel type vertical MIS Qvn is formed in this manner. This vertical MIS Qvn is a transistor having a structure in which the channel current thereof flows in the direction orthogonal to the main surface of the substrate 1S, and the vertical MIS Qvn constitutes the memory cell selecting transistor of the DRAM memory cell. The vertical MIS Qvn is formed on each of the two side surfaces (surfaces parallel to each other) of one columnar body 25a, and the source region and the drain region thereof are constituted of the $n^+$ type conductor film 6b of the capacitor 6 and the $n^+$ type conductor film 22.

The gate insulating film of the vertical MIS Qvn is constituted of the insulating film 30 formed on the two side surfaces of the columnar body 25a. In this first embodiment as described above, the gate insulating film of the vertical MIS Qvn is formed on each of the two side surfaces of the columnar body 25a. Therefore, it is possible to easily align the vertical MIS Qvn and the word line in comparison to the case where the gate insulating film is formed on each of the four side surfaces of the columnar body 25a. And so, the failure due to its misalignment can be reduced or prevented, and the yield of the DRAM can be improved.

In addition, the gate electrode of the vertical MIS Qvn is constituted of the p type conductor film 31 provided on the two side surfaces of the columnar body 25a via the gate insulating film (insulating film 30). This gate electrode is formed by burying the conductor film 31 into the space between the wall bodies 28. Therefore, the gate electrode is formed in a self alignment manner with the columnar body 25a. Accordingly, the alignment margin between the gate electrode and the columnar body 25a becomes unnecessary, and thus, the entire size of the memory cell forming region can be reduced. In addition, the vertical MIS Qvn is provided immediately above the capacitor 6 in the first embodiment. Therefore, the occupancy area of the memory cell can be reduced, and thus, the integration of the memory cell can be improved. In addition, the entire size of the memory cell can be reduced. Furthermore, since the entire size of the memory cell can be reduced as described above, it is possible to shorten the length of the wiring, and thus, the transmission speed of the signal can be improved. As a result, the operation speed of the DRAM can be improved.

Also, in the first embodiment, the MIS of the peripheral circuit is formed before forming the vertical MIS Qvn in the memory cell forming region. Assuming that the MIS of the peripheral circuit is formed after forming the vertical MIS Qvn, the step part formed between the memory cell forming region and the peripheral circuit forming region is enlarged, causing the uneven coating of a photoresist film in the peripheral circuit forming region at the time of the photolithography for forming various patterns of the peripheral circuit. As a result, such problems occur that the pattern resolution is deteriorated and the desired pattern cannot be formed. Contrary to this, the MIS of the peripheral circuit is formed before forming the vertical MIS Qvn in the first embodiment. Therefore, the above-mentioned problems can be prevented. As a result, the various patterns of the MIS of the peripheral circuit can be desirably formed, and thus, the reliability and the electric properties of the MIS of the peripheral circuit can be improved.

Figure 21:
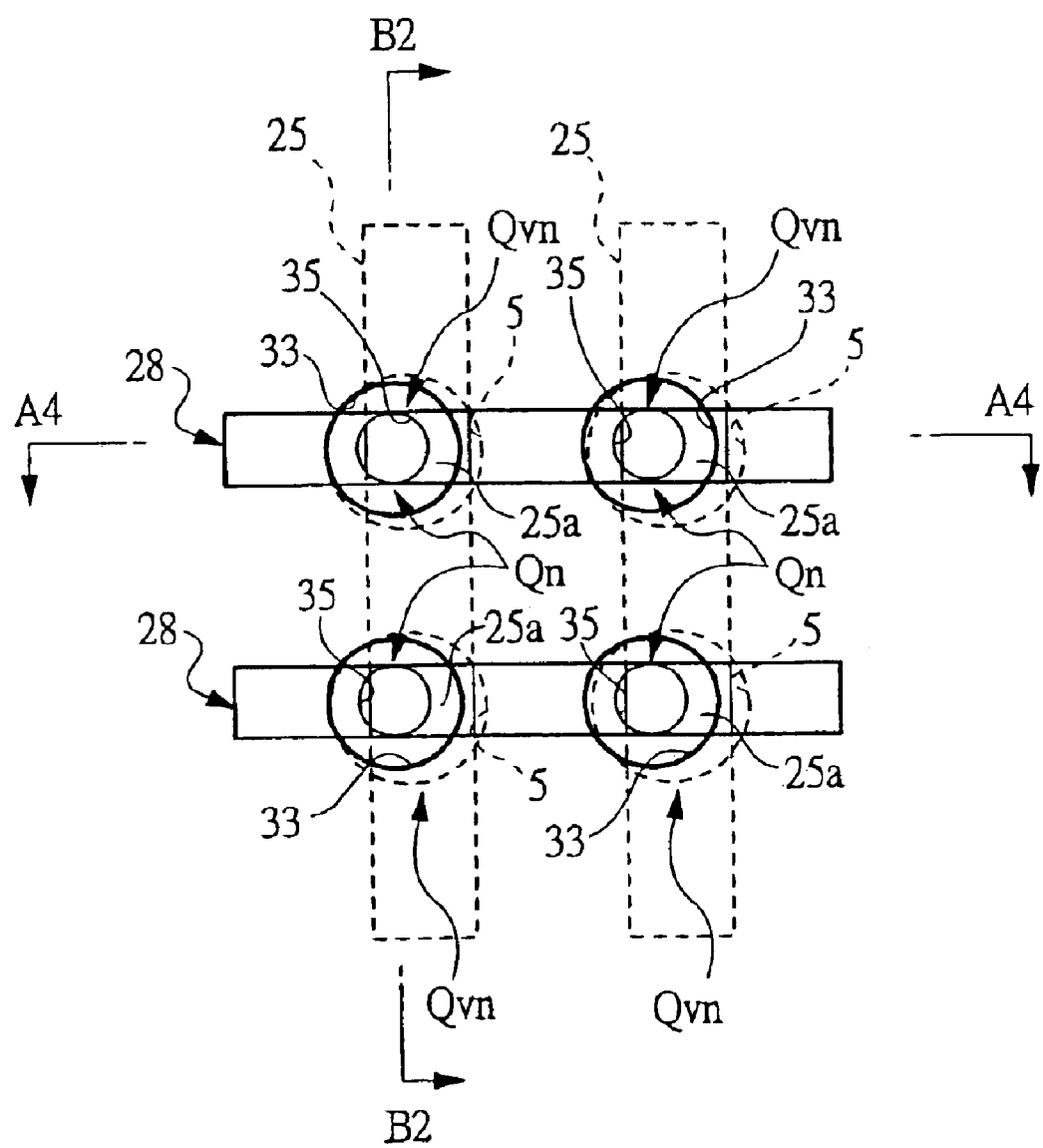
FIG. 21 is a plan view showing the principal part of the memory cell forming region in the course of the manufacturing process of the semiconductor device subsequent to FIGS. 18 to 20.
Figure 22:
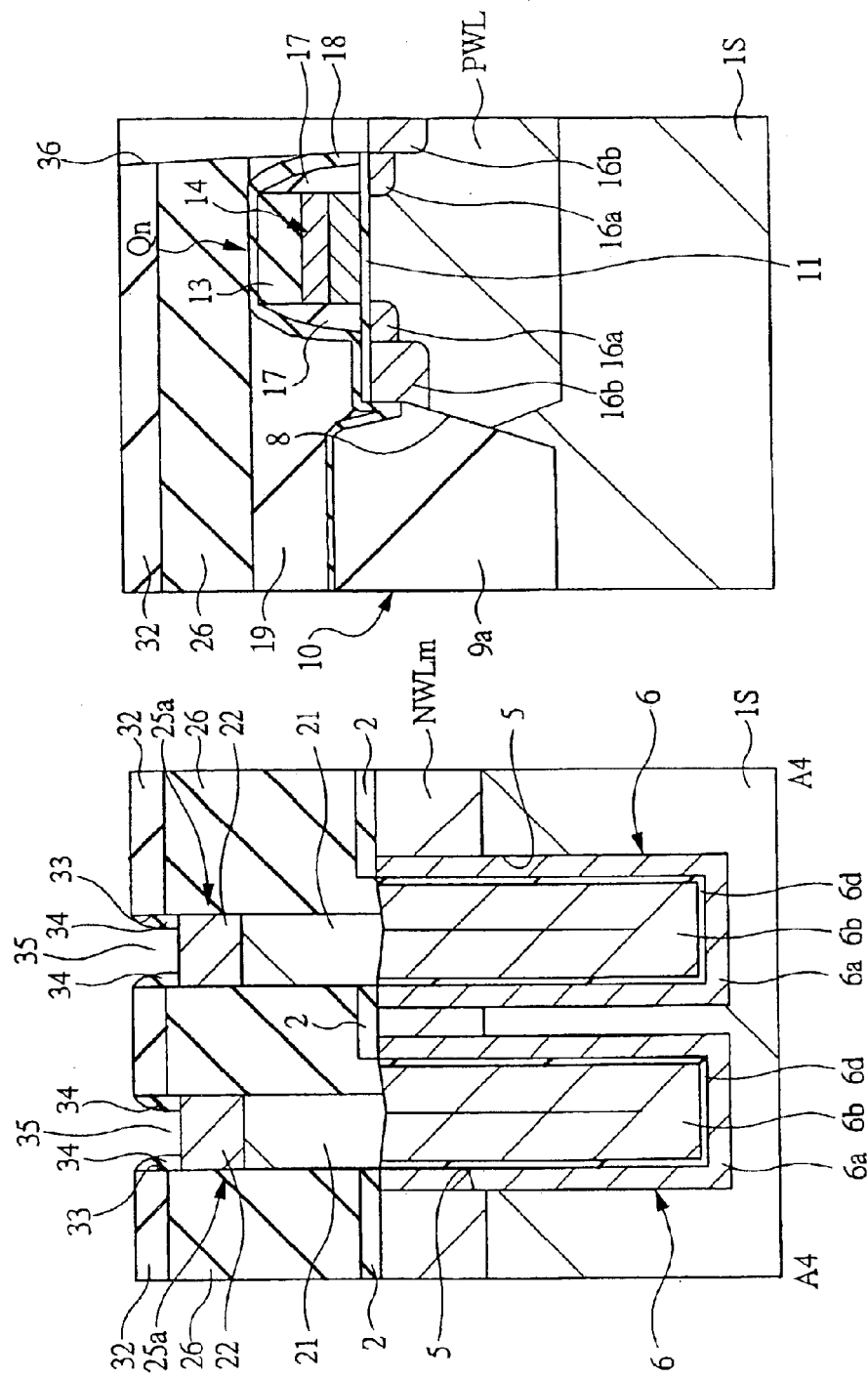
FIG. 22 is a sectional view showing the principal part of the memory cell forming region (taken along the line A4—A4 in FIG. 21) and that of the peripheral circuit forming region of the semiconductor device shown in FIG. 21 in the course of the manufacturing process of the same.
Figure 23:
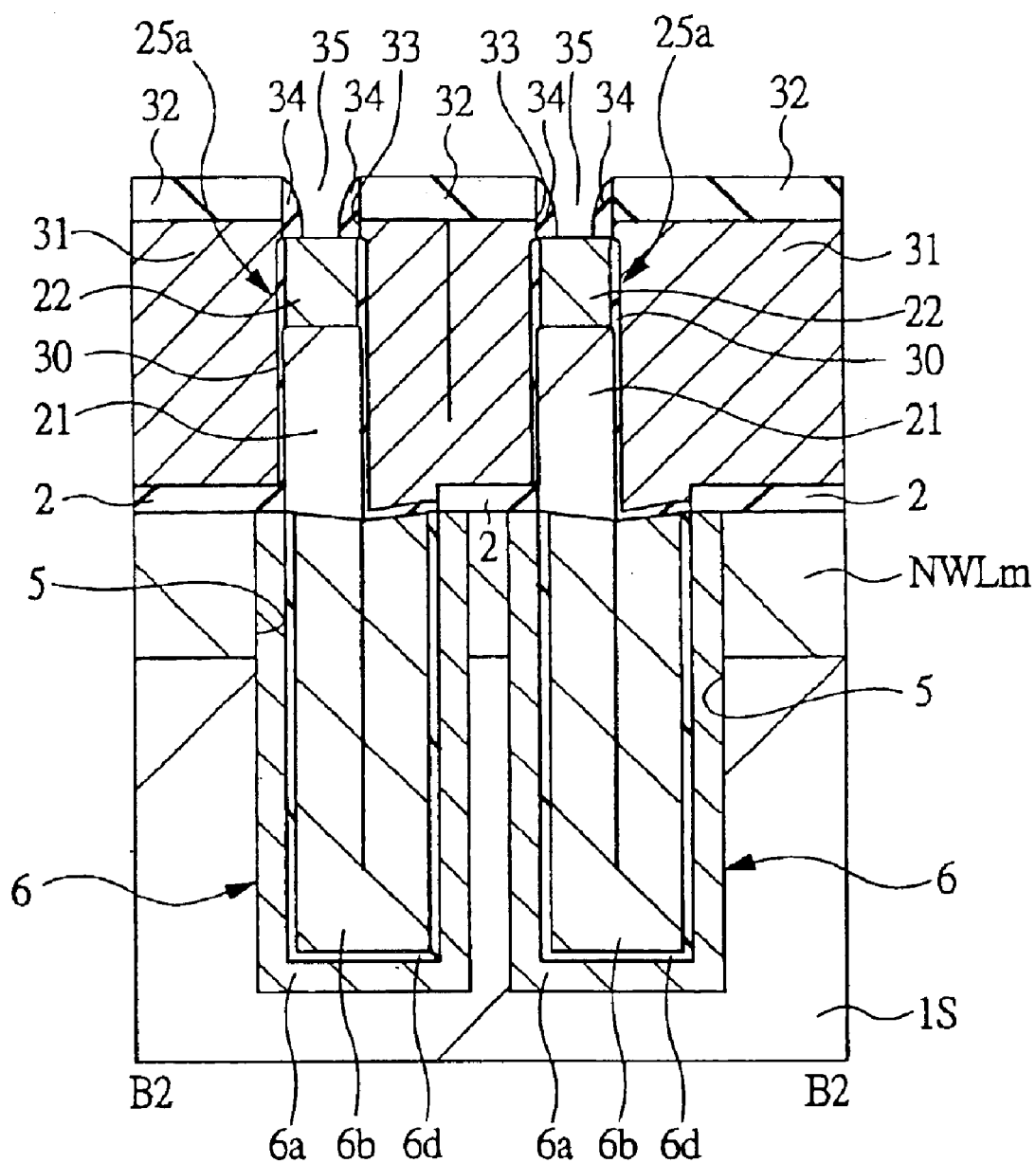
FIG. 23 is a sectional view taken along the line B2—B2 in FIG. 21.

FIG. 21 is a plan view showing the principal part of the memory cell forming region in the course of the manufacturing process of the DRAM subsequent to FIGS. 18 to 20. FIG. 22 is a sectional view showing the principal part of the memory cell forming region (taken along the line A4—A4 in FIG. 21) and that of the peripheral circuit forming region in the step shown in FIG. 21 in the course of the manufacturing process of the DRAM. FIG. 23 is a sectional view taken along the line B2—B2 in FIG. 21.

First, an insulating film 32 made of a silicon oxide film with a thickness of about 100 nm is deposited on the main surface of the substrate 1S by the CVD method. Thereafter, a photoresist film used to form a bit line contact hole is formed thereon and patterned. This photoresist film is formed in a pattern that exposes the forming region of the bit line contact hole in the circular shape and covers the other region. Subsequently, the insulating films 32, 24, and 23 exposed through the photoresist film used as an etching mask are sequentially etched and removed, thereby forming a hole 33 through which the upper surface of the conductor film 22 of the columnar body 25a is exposed. Thereafter, the photoresist film is removed by ashing, and then, an insulating film made of a silicon oxide film with a thickness of about 30 nm is deposited on the main surface of the substrate 1S by the CVD method. Further, the insulating film is etched back by the dry etching method, thereby forming a sidewall insulating film 34 on the sidewall of the hole 33. At the step where the insulating film for forming the sidewall insulating film is deposited, the upper surface of the conductor film 22 at the bottom of the hole 33 is covered with the insulating film. However, the upper surface is exposed by the etch back process of the insulating film. More specifically, by the above-described method, a hole 35 for a bit line contact with a diameter smaller than the processing limit of the photolithography is formed in the hole 33 that can be processed by the photolithography.

Next, a photoresist film for forming a contact hole of the peripheral circuit forming region is formed on the main surface of the substrate 1S. This photoresist film is patterned so as to expose the semiconductor region for the source and drain of the MIS for the peripheral circuit and a part of the gate electrode and to cover the other region. Subsequently, the etching is performed with using the photoresist film as an etching mask, thereby forming a contact hole 36 in the insulating films 32, 26, 19, and 18. In the formation of the contact hole 36, the etching selectivity of the silicon oxide film and the silicon nitride film is set high and the insulating film 18 made of a silicon nitride film is functionally used as an etching stopper, thereby preventing the overetching in the hole. Thereafter, the photoresist film is removed.

Figure 24:
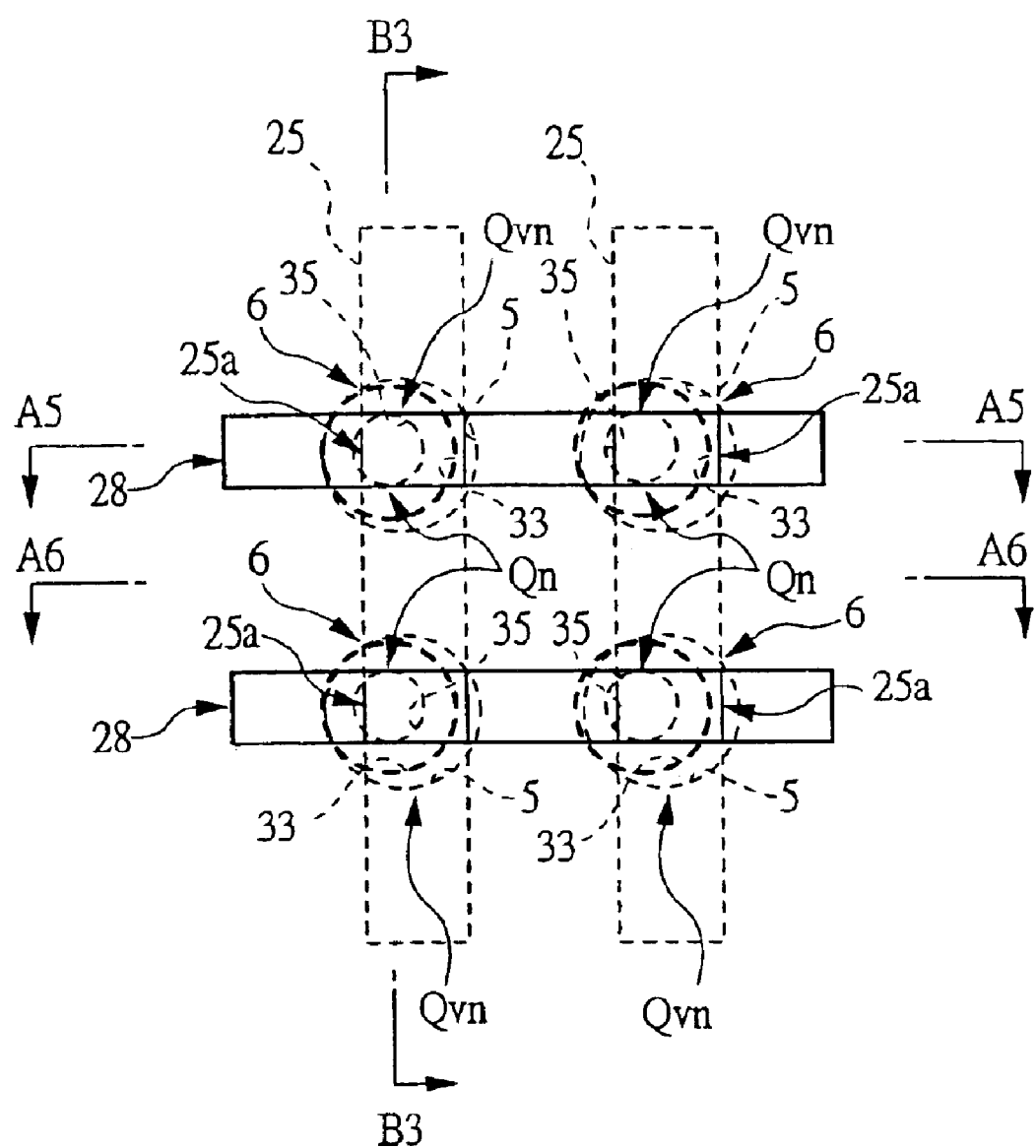
FIG. 24 is a sectional view showing the principal part of the memory cell forming region in the course of the manufacturing process of the semiconductor device subsequent to FIGS. 21 to 23.
Figure 25:
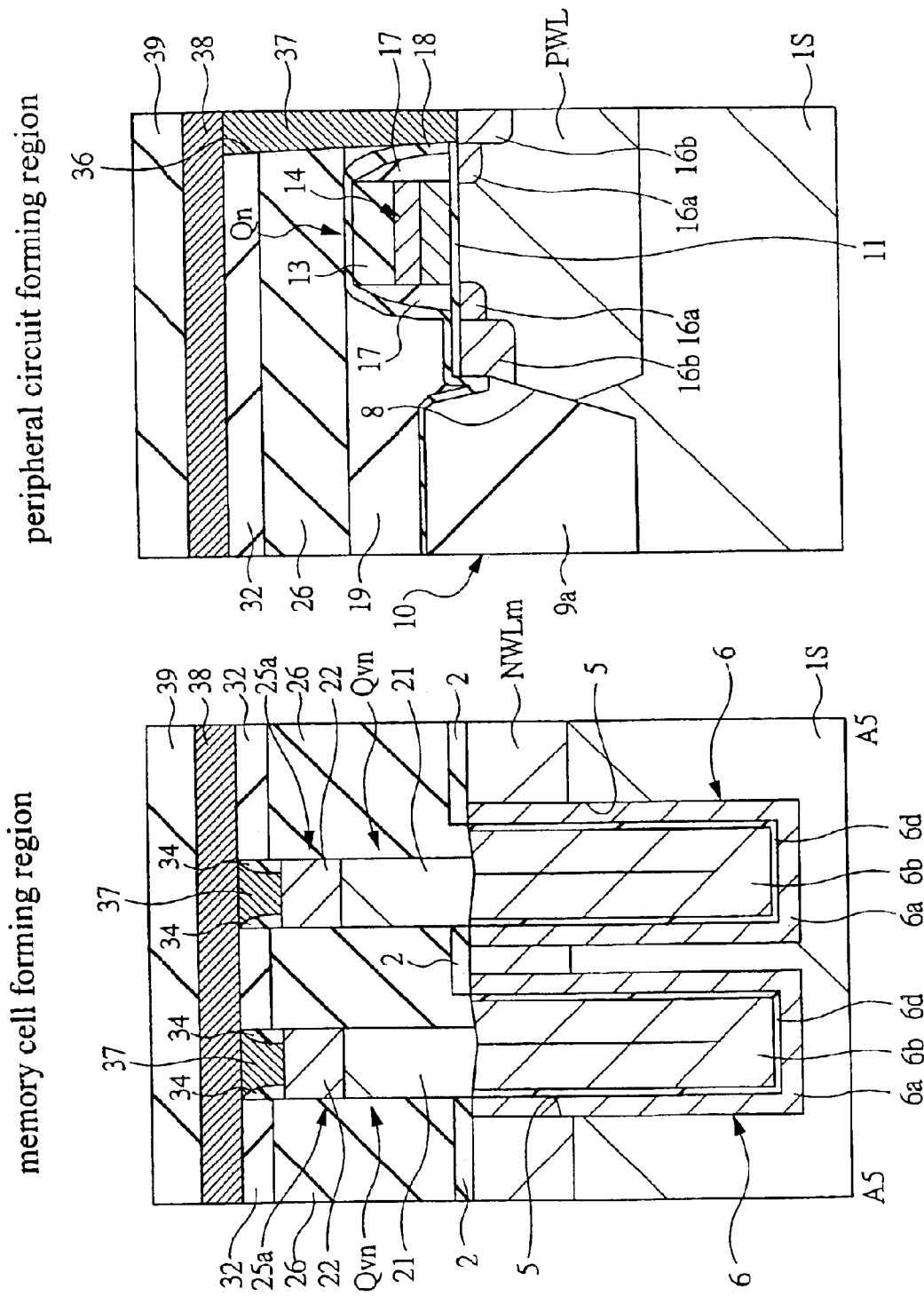
FIG. 25 is a sectional view showing the principal part of the memory cell forming region (taken along the line A5—A5 in FIG. 24) and that of the peripheral circuit forming region of the semiconductor device shown in FIG. 24 in the course of the manufacturing process of the same.
Figure 26:
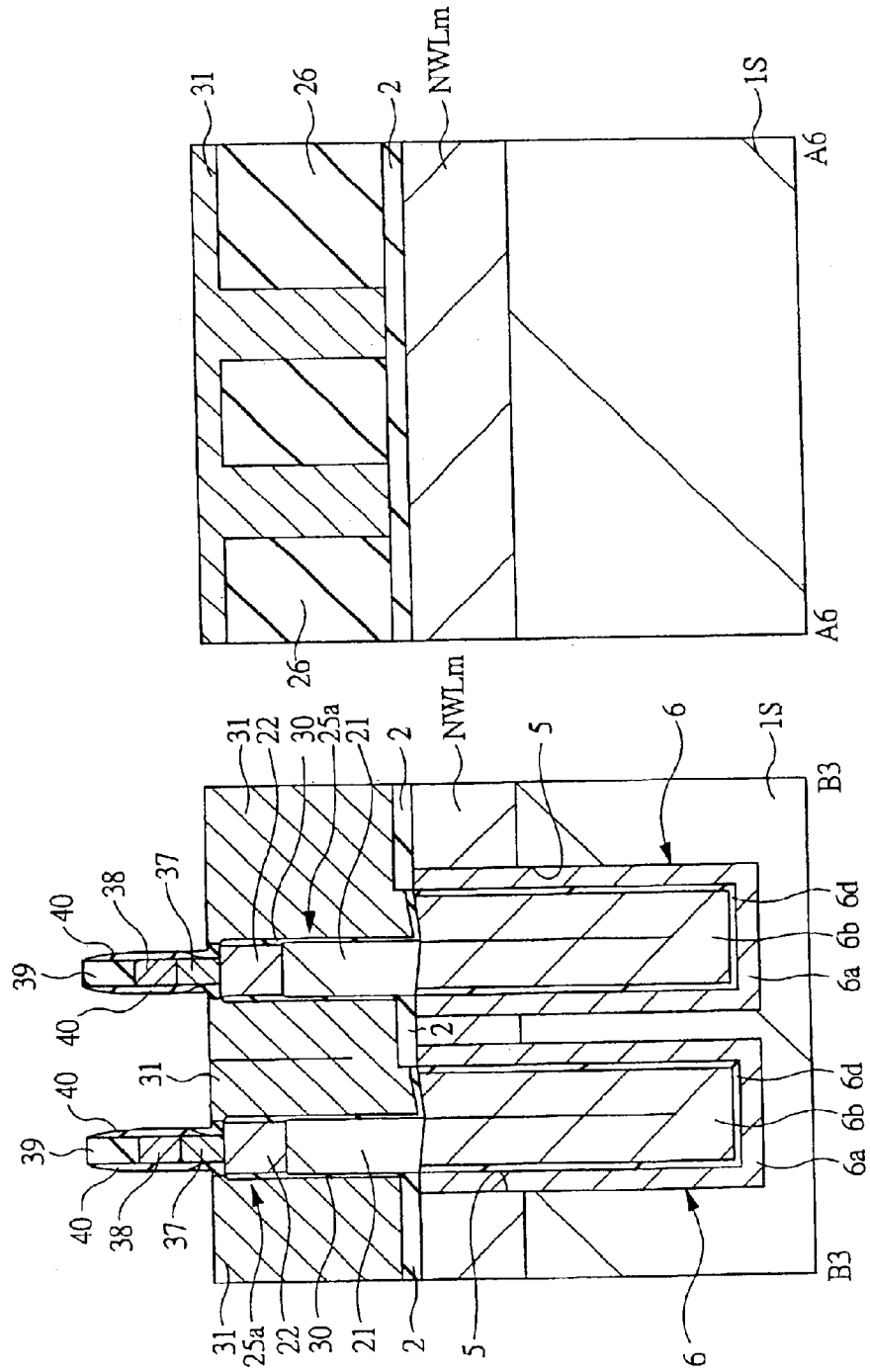
FIG. 26 is a sectional view taken along the line B3—B3 and that taken along the line A6—A6 in FIG. 24.

FIG. 24 is a plan view showing the principal part of the memory cell forming region in the course of the manufacturing process of the DRAM subsequent to FIGS. 21 to 23. FIG. 25 is a sectional view showing the principal part of the memory cell forming region (taken along the line A5—A5 in FIG. 24) and that of the peripheral circuit forming region shown in FIG. 24 in the course of the manufacturing process of the DRAM. FIG. 26 is a sectional view taken along the line B3—B3 and that taken along the line A6—A6 in FIG. 24.

First, films of titanium (Ti) with a thickness of about 30 nm, titanium nitride (TiN) with a thickness of about 25 nm, and tungsten (W) with a thickness of about 400 nm are sequentially deposited from below, and then, polished by the CMP method, thereby forming a plug 37 in the hole 35 and the contact hole 36. Subsequently, a conductor film 38 made of tungsten (W) with a thickness of about 100 nm is deposited on the main surface of the substrate 1S by the sputtering method or the CVD method. Thereafter, an insulating film 39 made of a silicon oxide film with a thickness of about 50 nm is deposited thereon by the CVD method. Then, a photoresist film for forming bit line is formed on the insulating film 39. This photoresist film is formed so as to cover the bit line forming region and expose the other region. Subsequently, after the insulating film 39 is etched with using the photoresist film as an etching mask, the photoresist film is removed by ashing, and then, the conductor films 38 and 37 exposed through the remaining insulating film 39 used as an etching mask are etched and removed. In this manner, the bit line composed of the remaining conductor film 38 is patterned. The bit line composed of the conductor film 38 is formed in a strip-shaped pattern extending in the direction orthogonal to the extending direction of the wall body 25 (lateral direction in FIG. 24) when viewed in plan. The bit line is electrically connected to the $n^+$ type conductor films 22 of the plurality of columnar bodies 25a arranged adjacent to each other along the extending direction (second direction) of the bit line via each of the plugs 37. After forming the bit lines in this manner, an insulating film made of a silicon oxide film with a thickness of about 50 nm is deposited on the substrate 1S by the CVD method. Thereafter, the insulating film is etched back by the dry etching method, thereby forming a sidewall insulating film 40 on the side surfaces of the conductor film 38 and the insulating film 39. By this etching back, the upper surface of the conductor film 31 constituting the gate electrode of the vertical MIS Qvn is exposed as shown in the sectional view in the left of FIG. 26.

Figure 27:
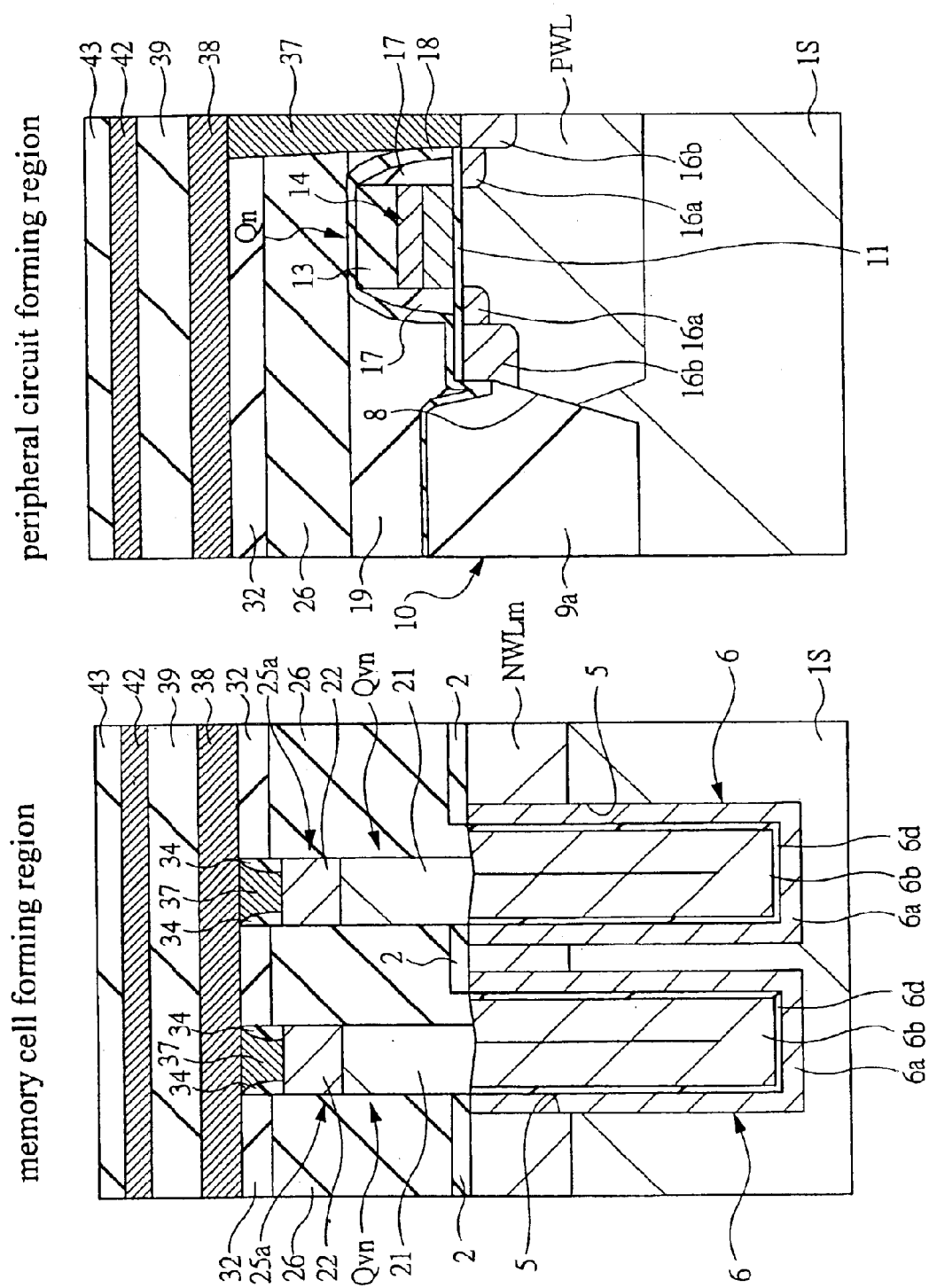
FIG. 27 is a sectional view showing the principal part of the memory cell forming region (at a position taken along the line A5—A5 in FIG. 24) and the peripheral circuit forming region in the course of the manufacturing process of the semiconductor device subsequent to FIGS. 24 to 26.
Figure 28:
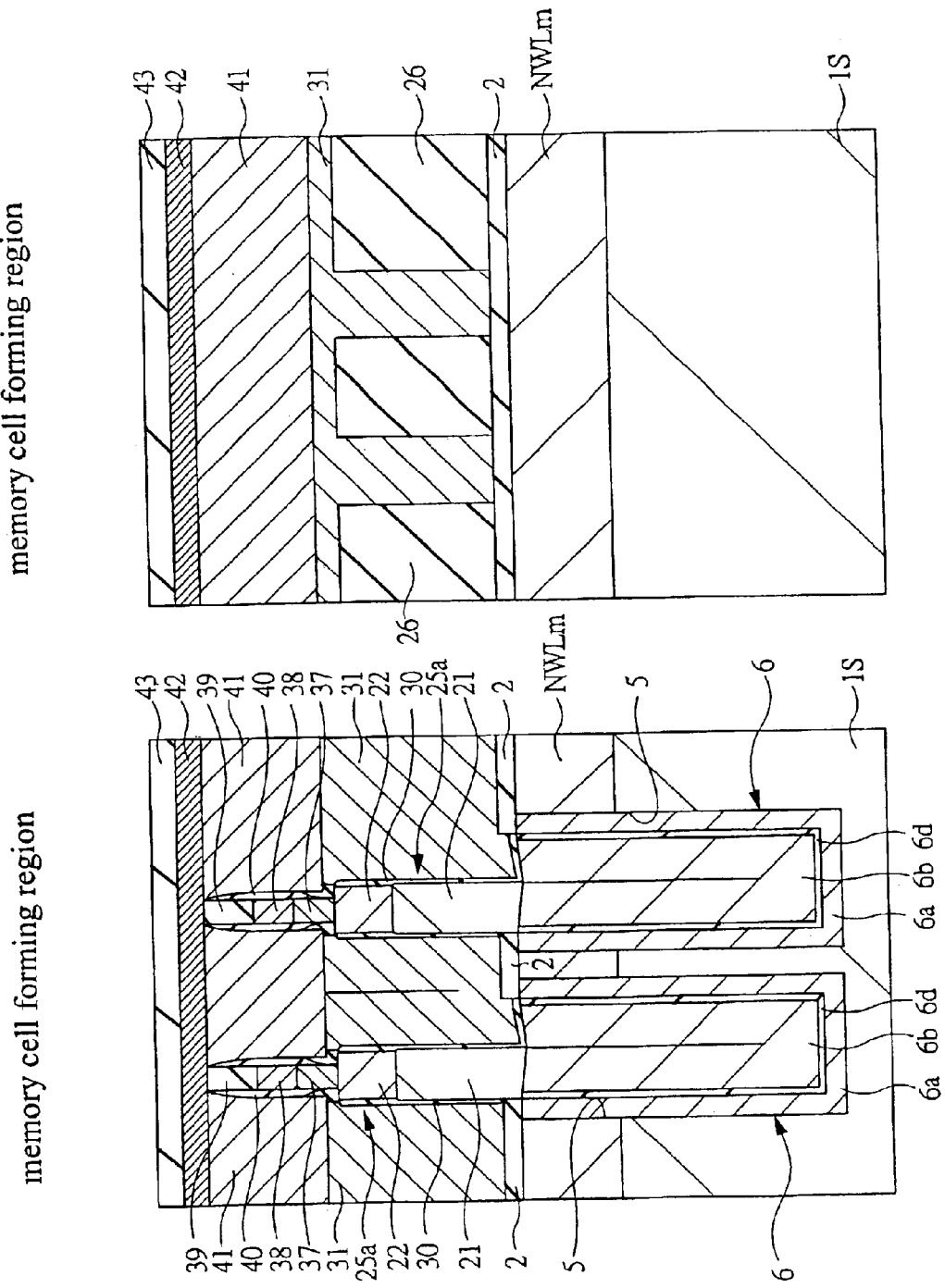
FIG. 28 is a sectional view showing the principal part of the memory cell forming region (at a position taken along the line B3—B3 in FIG. 24) and that of the peripheral circuit forming region (at a position taken along the line A6—A6 in FIG. 24) FIG. 27 in the course of the manufacturing process of the semiconductor device.

FIG. 27 is a sectional view showing the principal part of the memory cell forming region (at a position taken along the line A5—A5 in FIG. 24) and that of the peripheral circuit forming region in the course of the manufacturing process of the DRAM subsequent to FIGS. 24 to 26. FIG. 28 is a sectional view showing the principal part of the memory cell forming region (at a position taken along the line B3—B3 in FIG. 24) and that of the peripheral circuit forming region (at a position taken along the line A6—A6 in FIG. 24) shown in FIG. 27 in the course of the manufacturing process of the DRAM.

First, a conductor film 41 made of a low-resistance polycrystalline silicon film containing boron with a thickness of about 100 nm is deposited on the main surface of the substrate 1S by the CVD method. Thereafter, the conductor film 41 is polished by the CMP method, thereby burying the conductor film (second conductor film) 41 into the space between the adjacent bit lines. The reason why the polycrystalline silicon film is used as a material of the conductor film 41 is the same as that of the above-described conductor film 31. This conductor film 41 is electrically connected to the conductor film 31 formed below it. Subsequently, after forming a predetermined contact hole, films of titanium with a thickness of about 30 nm, titanium nitride with a thickness of about 25 nm, and tungsten with a thickness of about 400 nm are sequentially deposited from below on the substrate 1S, and then, polished by the CMP method, thereby forming a plug in the predetermined contact hole. Subsequently, a conductor film 42 obtained by sequentially laminating a refractory metal nitride film such as tungsten nitride (WN) film with a thickness of about 5 nm and a refractory metal film such as a tungsten (W) film with a thickness of about 100 nm from below is deposited on the substrate 1S by the sputtering method or the CVD method. Then, an insulating film 43 made of a silicon oxide film with a thickness of about 100 nm is deposited thereon by the plasma CVD method. The tungsten nitride in the conductor film 42 functions as a barrier conductor film, which prevents the direct contact between the conductor film 41 made of the polycrystalline silicon film below the tungsten nitride and the tungsten on the tungsten nitride. By the function of the tungsten nitride in the conductor film 42, the problem of the silicide formed at the contact portion when the conductor film 41 and the tungsten are directly contacted to each other can be prevented. This barrier conductor film is not limited to the tungsten nitride, and various modifications and alterations can be made therein. For example, a refractory metal nitride film such as titanium nitride is also available.

Figure 29:
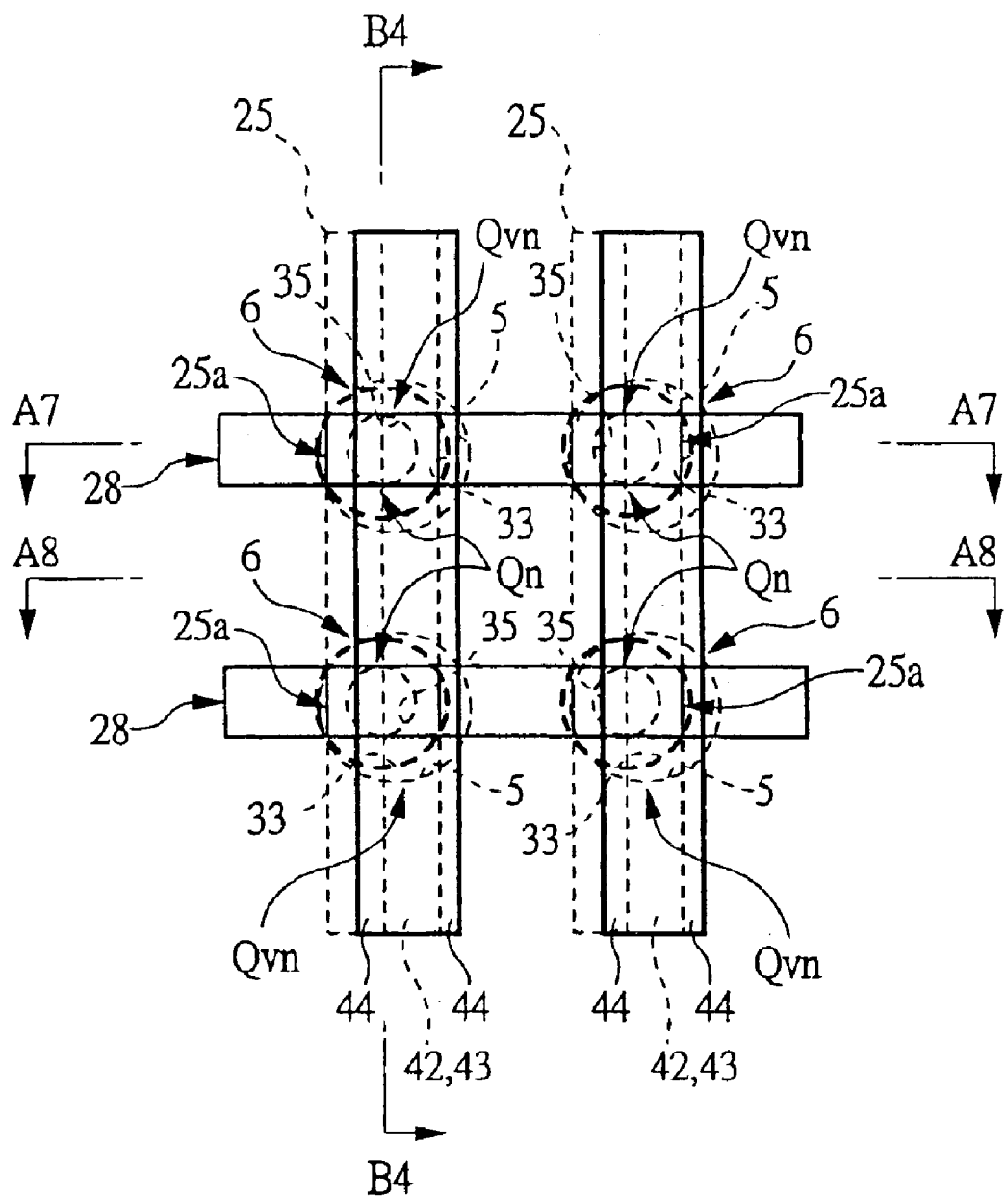
FIG. 29 is a plan view showing the principal part of the memory cell forming region in the course of the manufacturing process of the semiconductor device subsequent to FIGS. 27 and 28.
Figure 30:
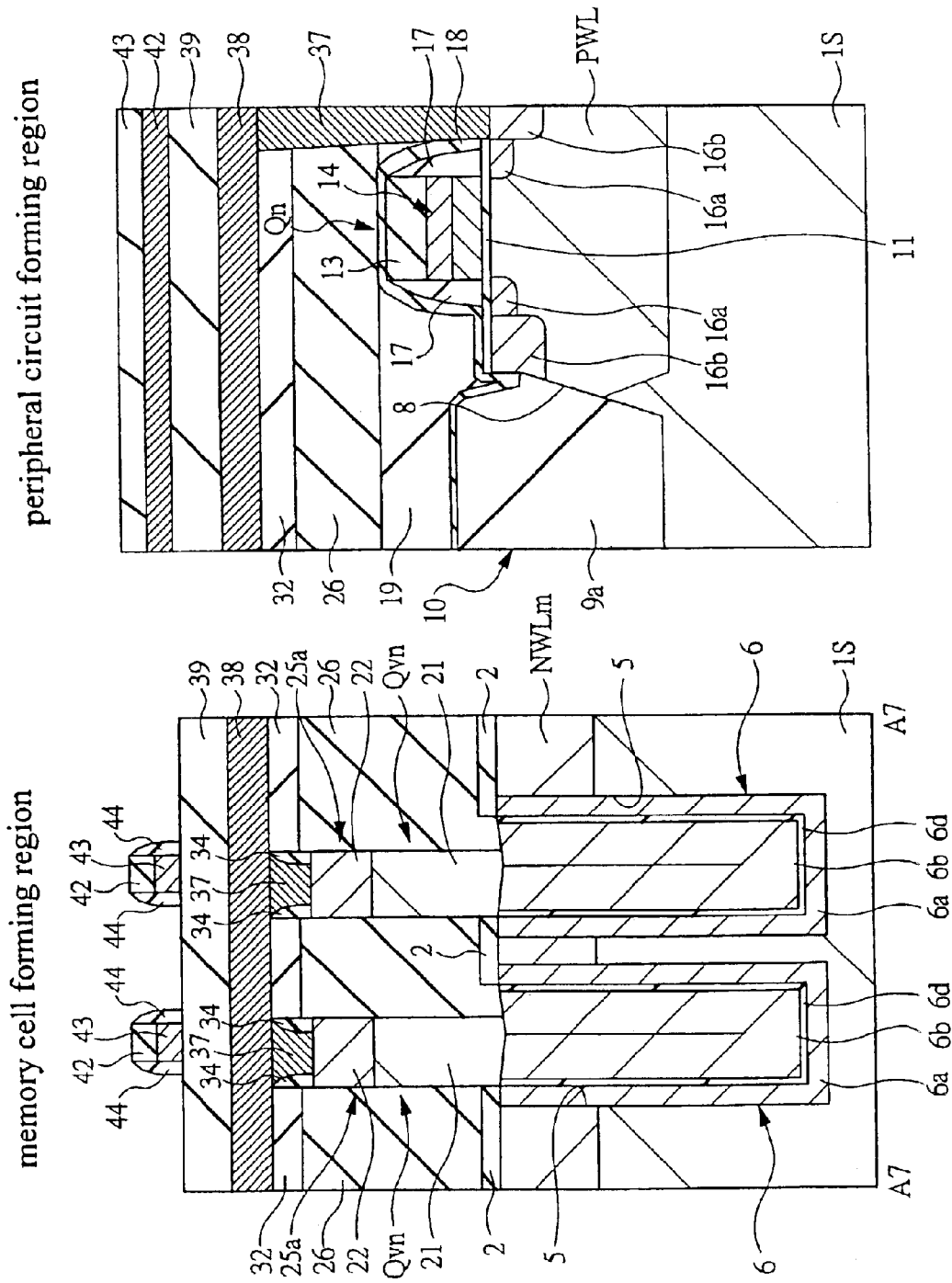
FIG. 30 is a sectional view showing the principal part of the memory cell forming region (taken along the line A7—A7 in FIG. 29) and that of the peripheral circuit forming region in the step of FIG. 29 in the course of the manufacturing process of the semiconductor device.
Figure 31:
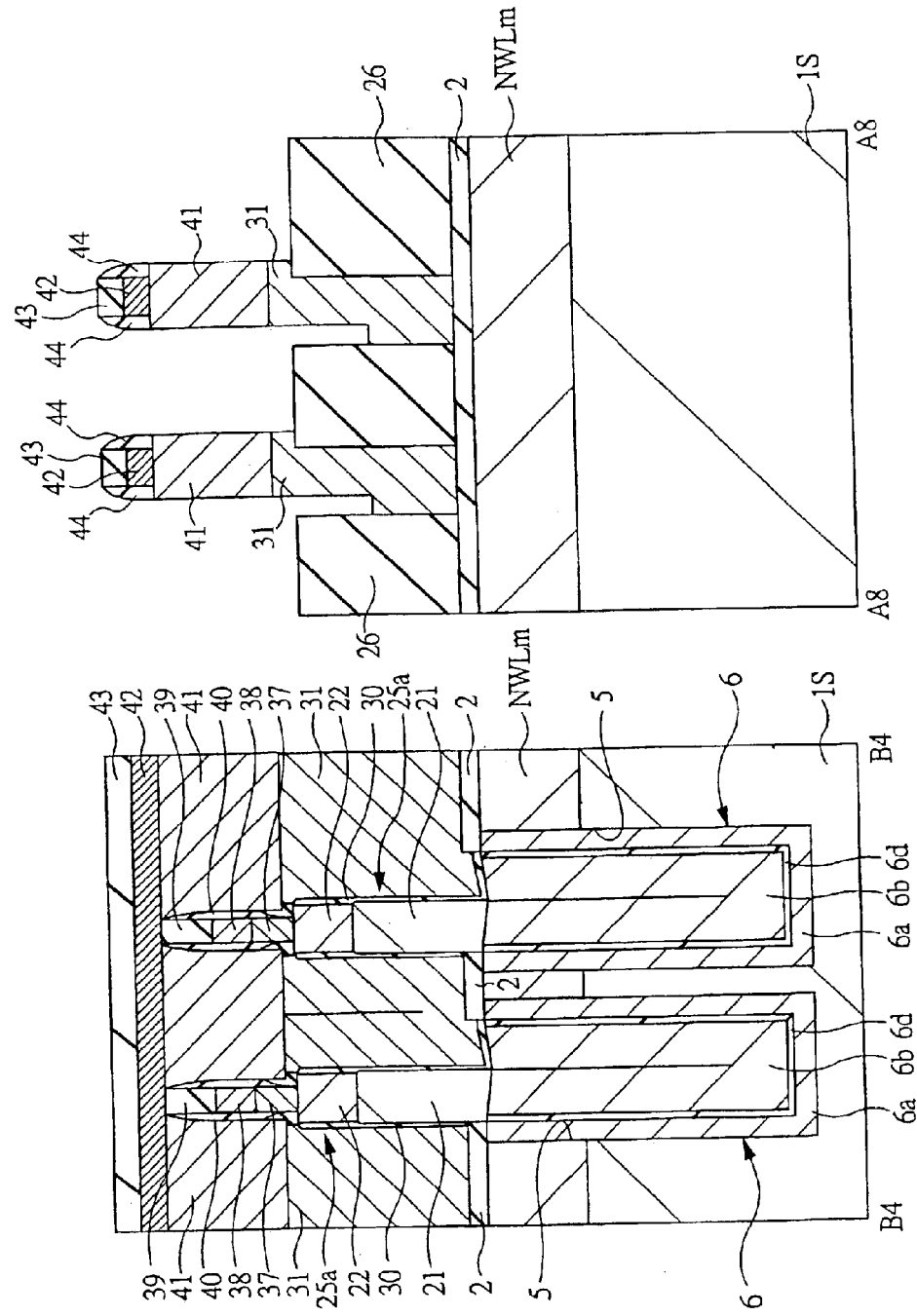
FIG. 31 is a sectional view taken along the line B4—B4 and that taken along the line A8—A8 in FIG. 29.

FIG. 29 is a plan view showing the principal part of the memory cell forming region in the course of the manufacturing process of the DRAM subsequent to FIGS. 27 and 28. FIG. 30 is a sectional view showing the principal part of the memory cell forming region (taken along the line A7—A7 in FIG. 29) and that of the peripheral circuit forming region shown in FIG. 29 in the course of the manufacturing process of the DRAM. FIG. 31 is a sectional view taken along the line B4—B4 and that taken along the line A8—A8 in FIG. 29.

First, a photoresist film for forming a word line is formed on the insulating film 43. This photoresist film is formed so as to cover the word line forming region and expose the other region. Subsequently, after the insulating film 43 is etched with using the photoresist film as an etching mask, the photoresist film is removed by ashing, and then, the conductor film 42 exposed through the remaining insulating film 43 used as an etching mask is etched and removed. By so doing, the word line composed of the remaining conductor film 42 is patterned. The word line composed of the conductor film 42 is formed in a strip-shaped pattern extending along the extending direction of the wall body 25 (vertical direction in FIG. 29) when viewed in plan. The word line is electrically connected to the plurality of conductor films 31 (or the gate electrodes of the plurality of vertical MIS Qvn) arranged adjacent to each other along the extending direction (first direction) of the word line. After forming the word lines in this manner, an insulating film made of a silicon oxide film is deposited on the substrate 1S by the plasma CVD method. Thereafter, the insulating film is etched back by the dry etching, thereby forming a sidewall insulating film 44 on the side surface of the conductor film 42 and that of the insulating film 43. Subsequently, the conductor films 41 and 31 exposed through the insulating films 43 and 44 used as etching masks are etched and removed by the dry etching method and the following isotropic etching method, thereby electrically isolating the gate electrodes (conductor films 41 and 31) of the vertical MIS Qvn adjacent to each other in the lateral direction in FIG. 29. More specifically, the gate electrode of the vertical MIS Qvn is formed in a self-alignment manner with the word line. By so doing, the alignment margin between the gate electrode and the word line becomes unnecessary, and thus, the entire size of the memory cell forming region can be reduced. Therefore, it is possible to shorten the length of the wiring in the memory cell forming region, and thus, the transmission speed of the signal can be improved. As a result, the operation speed of the DRAM can be improved.

Figure 32:
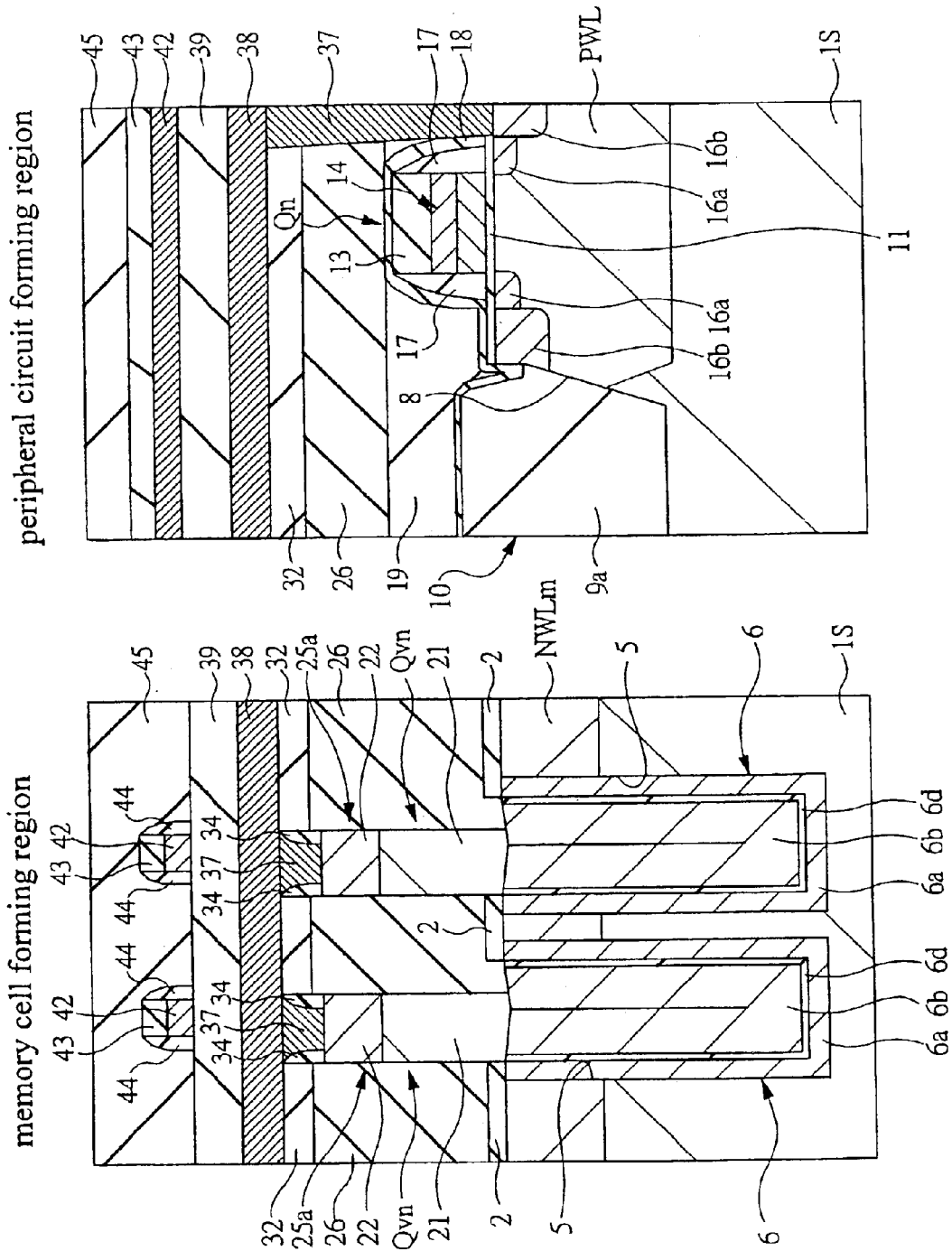
FIG. 32 is a sectional view showing the principal part of the memory cell forming region (at a position taken along the line A7—A7 in FIG. 29) and that of the peripheral circuit forming region in the course of the manufacturing process of the semiconductor device subsequent to FIGS. 29 to 31.
Figure 33:
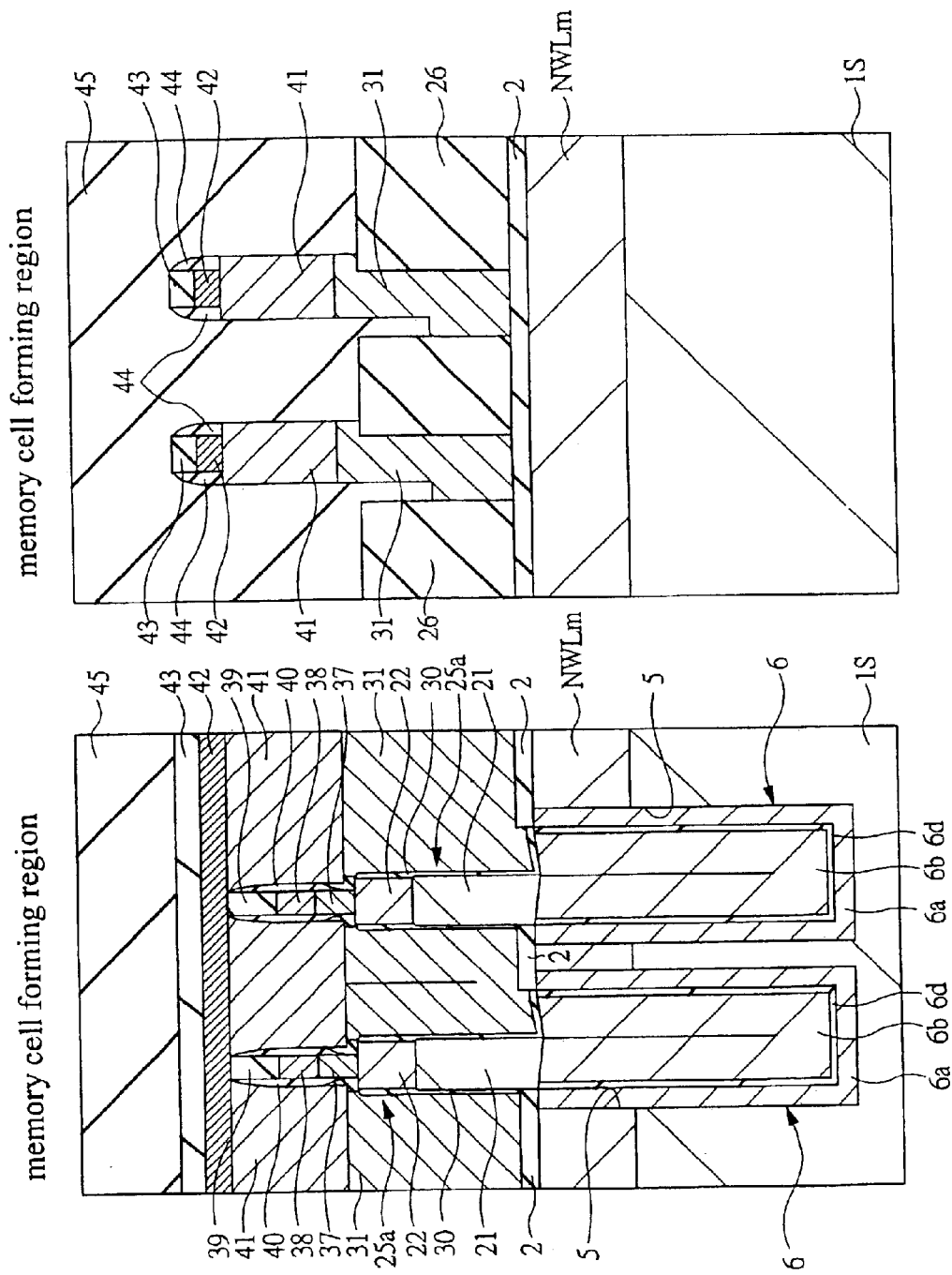
FIG. 33 is a sectional view taken along the line B4—B4 and that taken along the line A8—A8 in FIG. 32 showing the semiconductor device in FIG. 29 in the course of the manufacturing process of the same.

FIG. 32 is a sectional view showing the principal part of the memory cell forming region (at a position taken along the line A7—A7 in FIG. 29) and that of the peripheral circuit forming region in the course of the manufacturing process of the DRAM subsequent to FIGS. 29 to 31. FIG. 33 is a sectional view taken along the line B4—B4 and that taken along the line A8—A8 in FIG. 32 showing the DRAM in FIG. 29 in the course of the manufacturing process of the same.

In this step, after depositing an insulating film 45 made of a silicon oxide film with a thickness of about 100 nm on the main surface of the substrate 1S by the CVD method, the upper surface of the insulating film 45 is polished and planarized by the CMP method. This insulating film 45 is buried in the trench between the word lines adjacent to each other as shown in FIG. 33. As described above, the DRAM including a plurality of memory cells composed of the trench-type capacitor 6 (data storage capacitor) and the vertical MIS Qvn (memory cell selecting transistor) is manufactured.

Figure 34:
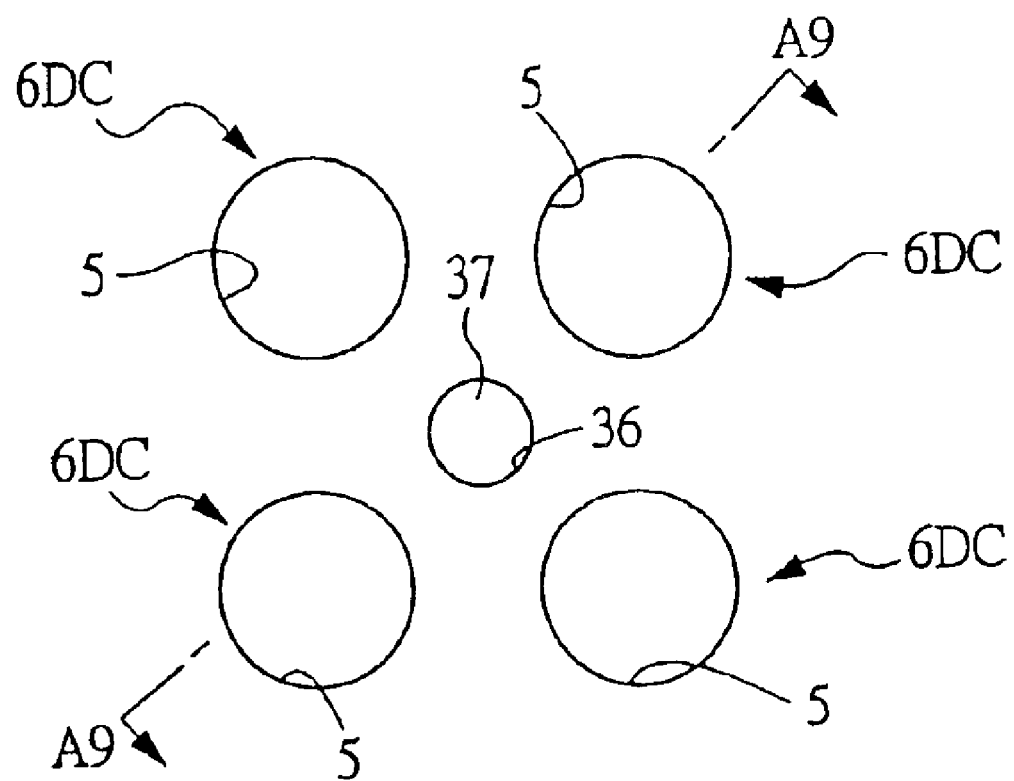
FIG. 34 is a plan view showing the principal part of a power supply region for supplying a predetermined voltage to an n well functioning to electrically connect the plate electrodes of the plurality of data storage capacitors in the semiconductor device according to the embodiment.
Figure 35:
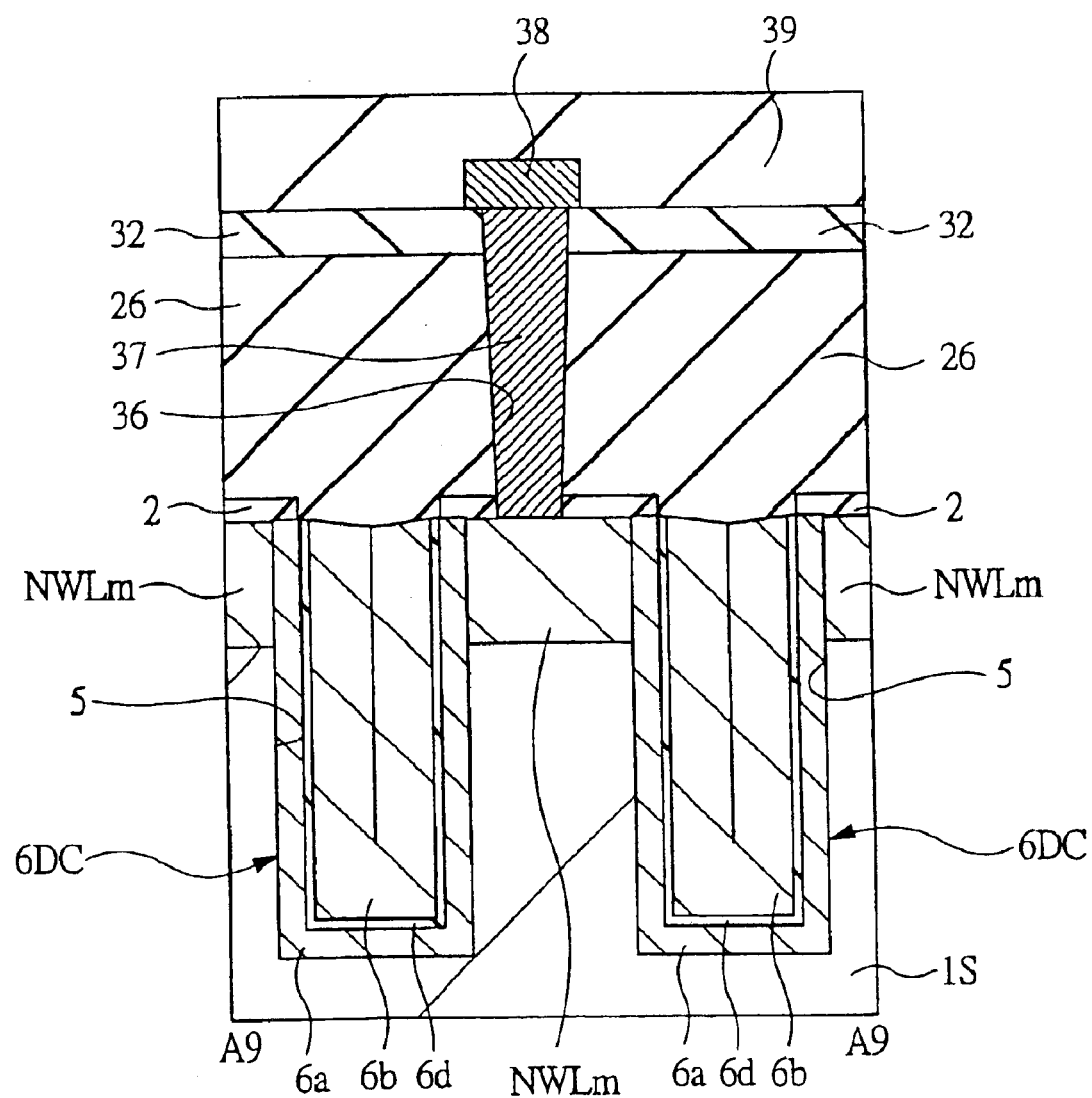
FIG. 35 is a sectional view taken along the line A9—A9 in FIG. 34.

Also, FIG. 34 is a plan view showing the principal part of a power supply region for supplying a predetermined voltage to the n well NWLm functioning to electrically connect the plate electrodes ($n^+$ type semiconductor region 6a) of the plurality of capacitors 6 in the DRAM. FIG. 35 is a sectional view taken along the line A9—A9 in FIG. 34.

The power supply region to the n well NWLm is provided in a region where a plurality of dummy capacitors 6 DC are arranged. No vertical MIS is provided on the dummy capacitors 6 DC. More specifically, the dummy capacitor 6DC does not contribute to the data storage of the DRAM. A circular contact hole 36 through which a part of the n well NWLm is exposed is formed in the insulating films 2, 26, and 32 in the power supply region. As shown in FIG. 34, this contact hole 36 is located at the center between the adjacent dummy capacitors 6 DC and 6 DC arranged obliquely to each other. The plug 37 is buried in this contact hole 36. A first layer wiring formed of the conductor film 38 is formed on the insulating film 32. This first layer wiring is electrically connected to the n well NWLm via the plug 37. The power supply to the n well NWLm is performed through this first layer wiring and the plug 37.

Second Embodiment

In this second embodiment, another example in which the present invention is applied to the method of manufacturing the DRAM will be described.

Figure 36:
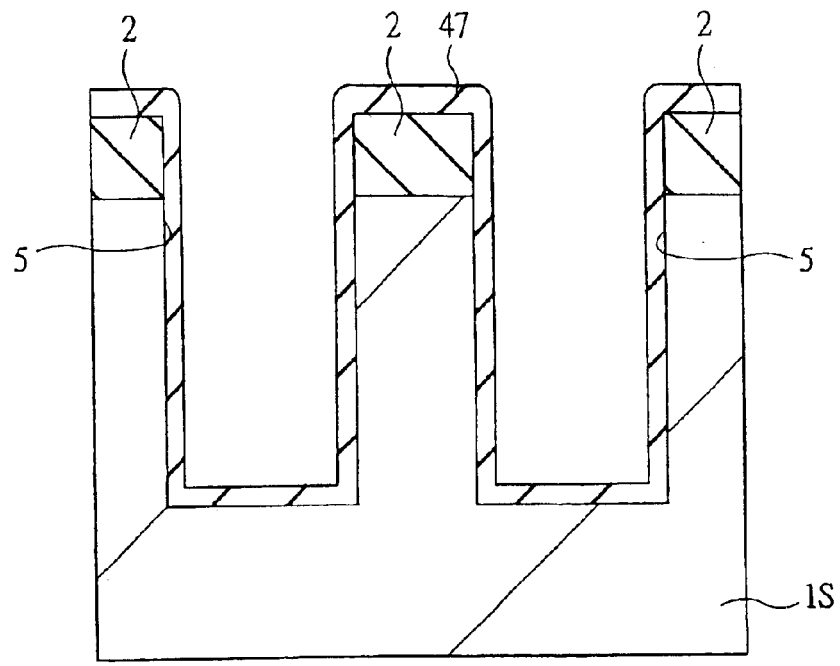
FIG. 36 is a sectional view showing the principal part of the memory cell forming region of a wafer in the course of the manufacturing process of the semiconductor device according to another embodiment of the present invention.

FIG. 36 is a sectional view showing the principal part of the memory cell forming region of a wafer in the course of the manufacturing process of the DRAM according to the second embodiment.

First, the insulating film 2 is deposited on the main surface of the substrate 1S and the trench 5 is formed in the substrate 1S in the same manner as the first embodiment. The sectional view showing the principal part of the memory cell forming region in this step is the same as FIG. 2. Subsequently, an insulating film 47 made of a silicon oxide film with a thickness of about 15 nm is deposited on the main surface of the substrate 1S by the CVD method. The insulating film 47 is deposited on the inner surface (side surface and bottom surface) of the trench 5 so as not to completely fill the trench 5.

Figure 37:
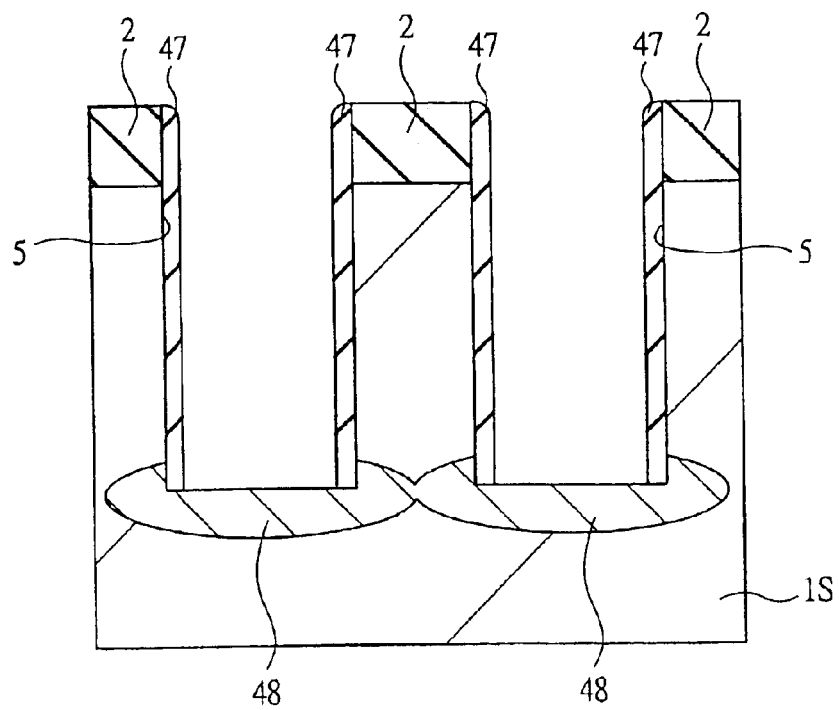
FIG. 37 is a sectional view showing the principal part of the memory cell forming region in the course of the manufacturing process of the semiconductor device subsequent to FIG. 36.

FIG. 37 is a sectional view showing the principal part of the memory cell forming region in the course of the manufacturing process of the DRAM subsequent to FIG. 36.

First, the insulating film 47 is etched back by the dry etching method. By so doing, the insulating film 47 is left only on the side surface of the trench 5 and the insulating film 47 on the upper surface of the insulating film 2 and that on the bottom surface of the trench 5 are removed. Therefore, a part of the substrate 1S is exposed on the bottom surface of the trench 5 in this step. Subsequently, phosphorus or arsenic is ion-implanted into the bottom of the trench 5 from the side of the main surface of the substrate 1S, and then, the thermal treatment is performed to the substrate 1S, thereby forming an $n^+$ type semiconductor region 48 in the substrate 1S in the vicinity of the bottom of the trench 5. This $n^+$ type semiconductor region 48 is a region functioning to electrically connect the plate electrodes of the capacitors. The $n^+$ type semiconductor regions 48 formed in the vicinity of the bottoms of the adjacent trenches 5 are partially overlapped and electrically connected to each other.

Figure 38:
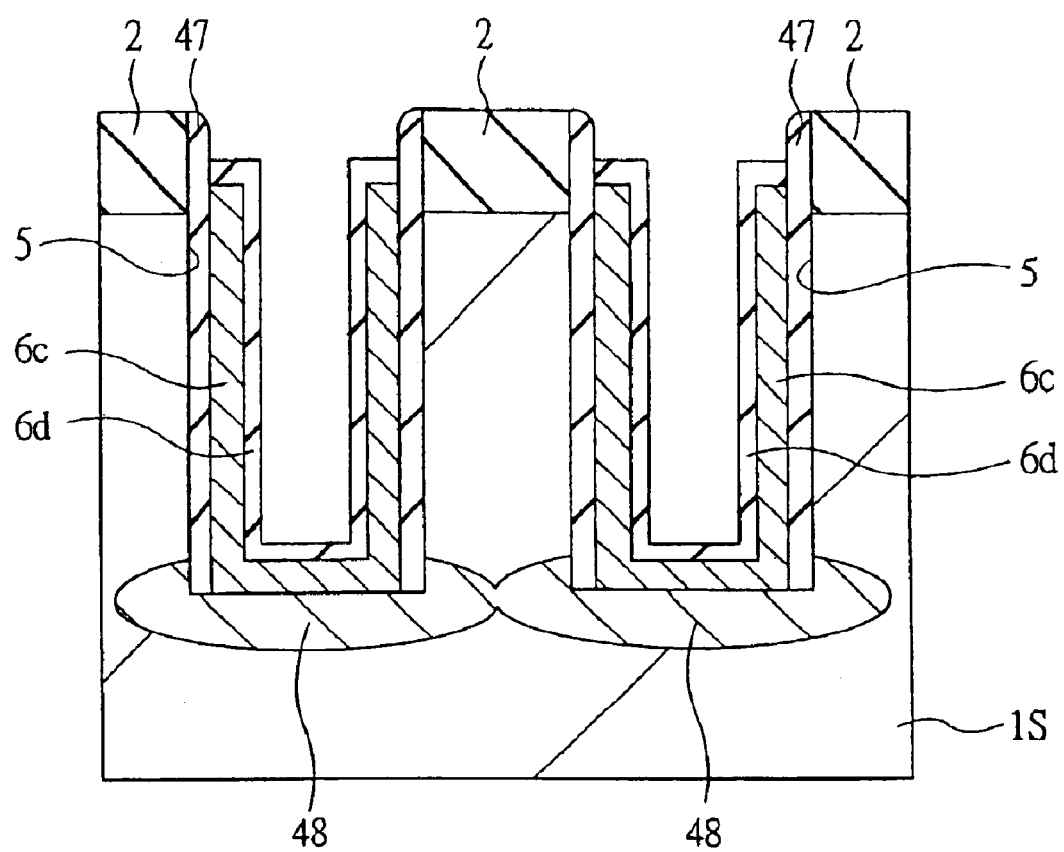
FIG. 38 is a sectional view showing the principal part of the memory cell forming region in the course of the manufacturing process of the semiconductor device subsequent to FIG. 37.

FIG. 38 is a sectional view showing the principal part of the memory cell forming region in the course of the manufacturing process of the DRAM subsequent to FIG. 37.

First, an $n^+$ type low-resistance polycrystalline silicon film with a thickness of about 10 nm is deposited on the main surface of the substrate 1S by the CVD method. Thereafter, the polycrystalline silicon film is patterned by the photolithography technique and the dry etching technique, thereby forming a conductor film 6c made of the low-resistance polycrystalline silicon film on the inner surface (side surface and bottom surface) of the trench 5. This conductor film 6c forms a plate electrode of the capacitor. Subsequently, an insulating film 6d is formed on the surface of the conductor film 6c. The insulating film 6d is a part that forms the capacitor insulating film of the capacitor, and is made by sequentially laminating a silicon oxide film, a silicon nitride film, and a silicon oxide film from the surface of the conductor film 6c.

Figure 39:
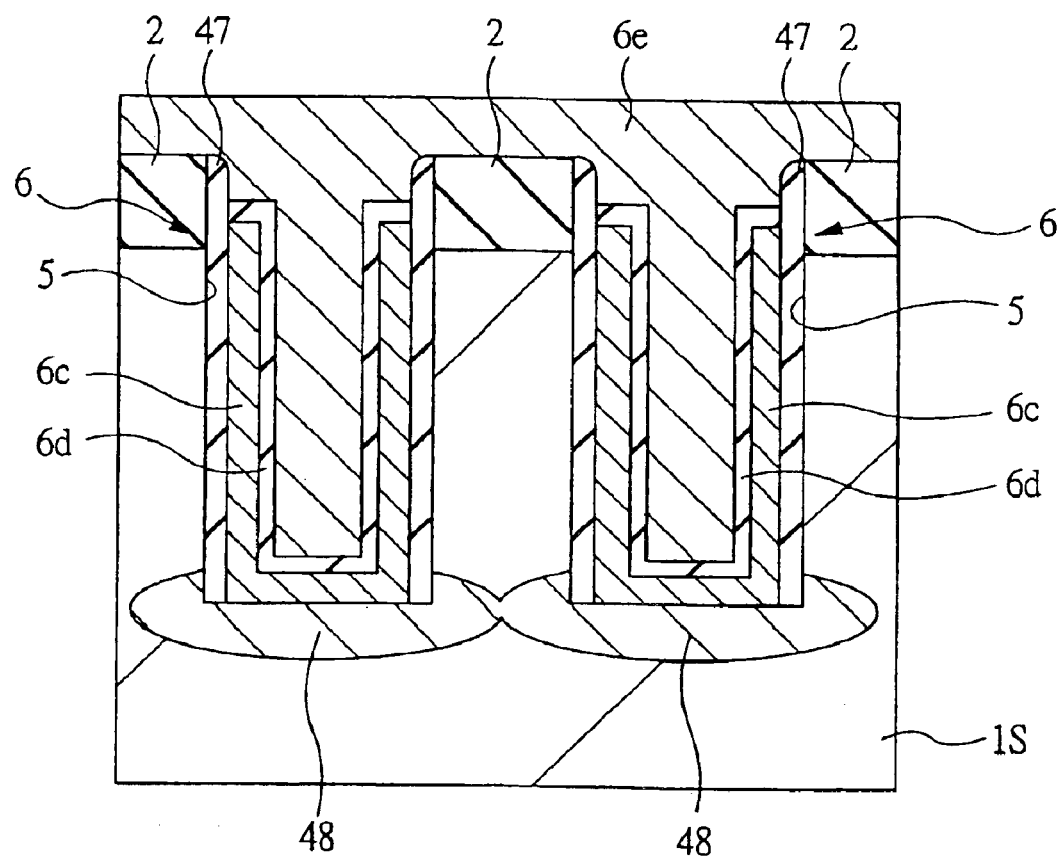
FIG. 39 is a sectional view showing the principal part of the memory cell forming region in the course of the manufacturing process of the semiconductor device subsequent to FIG. 38.

FIG. 39 is a sectional view showing the principal part of the memory cell forming region in the course of the manufacturing process of the DRAM subsequent to FIG. 38.

First, an $n^+$ type low-resistance polycrystalline silicon film that contains phosphorus is deposited by the CVD method. Thereafter, the upper surface of the polycrystalline silicon film is polished by the CMP method, thereby planarizing the upper surface of the polycrystalline silicon film, and simultaneously, burying an $n^+$ type conductor film 6e made of the polycrystalline silicon film into the trench 5. This conductor film 6e forms a storage electrode of the capacitor. In this manner, the capacitor 6 of the DRAM is formed in the trench 5.

Figure 40:
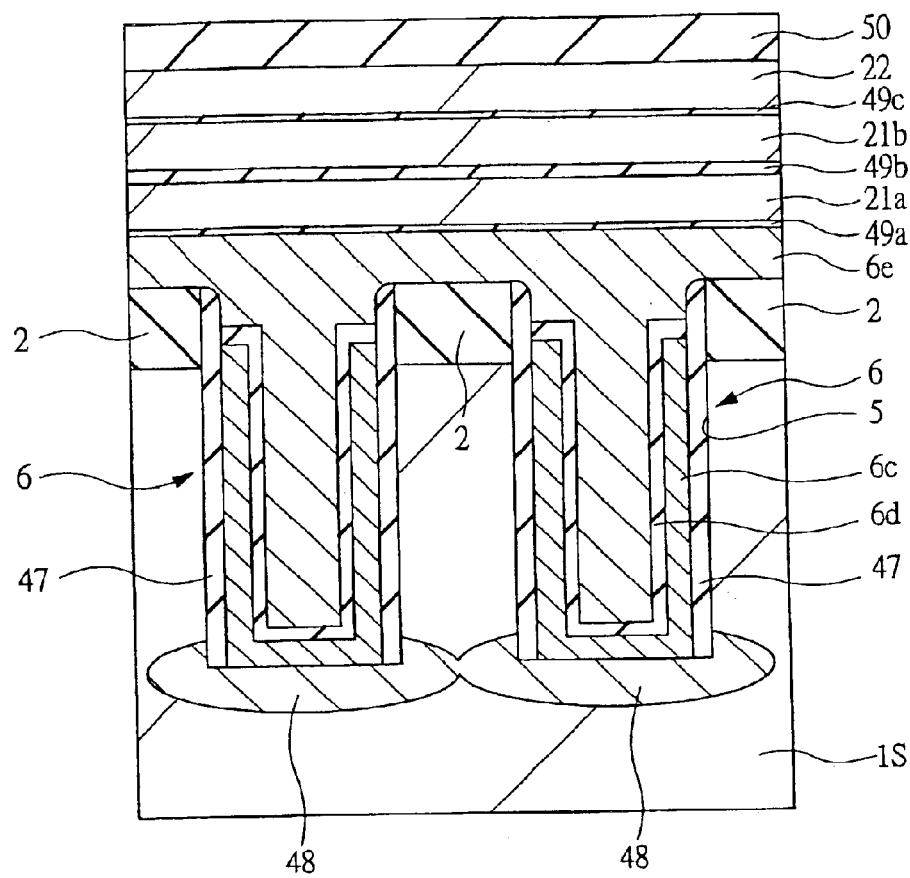
FIG. 40 is a sectional view showing the principal part of the memory cell forming region in the course of the manufacturing process of the semiconductor device subsequent to FIG. 39.
Figure 41:
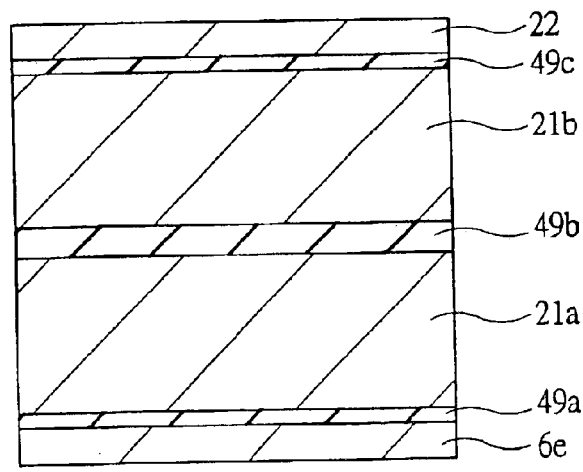
FIG. 41 is an enlarged sectional view showing the principal part of the semiconductor device shown in FIG. 40 in the course of the manufacturing process of the same.

FIG. 40 is a sectional view showing the principal part of the memory cell forming region in the course of the manufacturing process of the DRAM subsequent to FIG. 39. Also, FIG. 41 is an enlarged sectional view showing the principal part of the DRAM shown in FIG. 40 in the course of the manufacturing process of the same.

First, an insulating film 49a (first ultrathin insulating film), an undoped polycrystalline silicon film 21a (semiconductor layer), an insulating film 49b (second ultrathin insulating film), an undoped polycrystalline silicon film 21b (semiconductor layer), an insulating film 49c (third ultrathin insulating film), an $n^+$ type conductor film (second semiconductor layer) 22, and an insulating film (first insulating film) 50 are sequentially deposited from below by the CVD method. The insulating films 49a to 49c are made of, for example, a silicon nitride film. The thickness of the insulating films 49a and 49c is about 1 nm, and the thickness of the insulating film 49b is about 2 to 3 nm. The insulating films 49a and 49c are called as a diffusion barrier film and have a function to reduce the leak current between the source and drain of the PLED transistor by preventing punch through. The insulating film 49b is called as a shutter barrier film and has a function to reduce the leak current between the source and drain of the PLED transistor by controlling the band gap. In the PLED transistor provided with the insulating films 49a to 49c, it is possible to reduce the leak current between the source and drain by double digits in comparison to the normal vertical transistor without the insulating films 49a to 49c. Accordingly, since it is possible to further improve the on-off ratio by employing the PLED transistor, the yield of the DRAM can be further improved. In addition, the refresh characteristic of the DRAM can be improved. Also, the improvement of the operation speed and the reduction in the consumption power of the DRAM can be further promoted. The thickness of the polycrystalline silicon films 21a and 21b is about 50 nm. The insulating film 50 is made of, for example, a silicon nitride film and has a thickness of about 50 nm. However, as the structure of the PLED transistor, the structure can also be employed, in which the insulating film 49b is removed and only the insulating films 49a and 49c in contact with the source and drain of the PLED transistor are provided. Furthermore, contrary to this, the structure can also be employed, in which the insulating films 49a and 49c are removed and only the insulating film 49b as a body part is provided.

Figure 42:
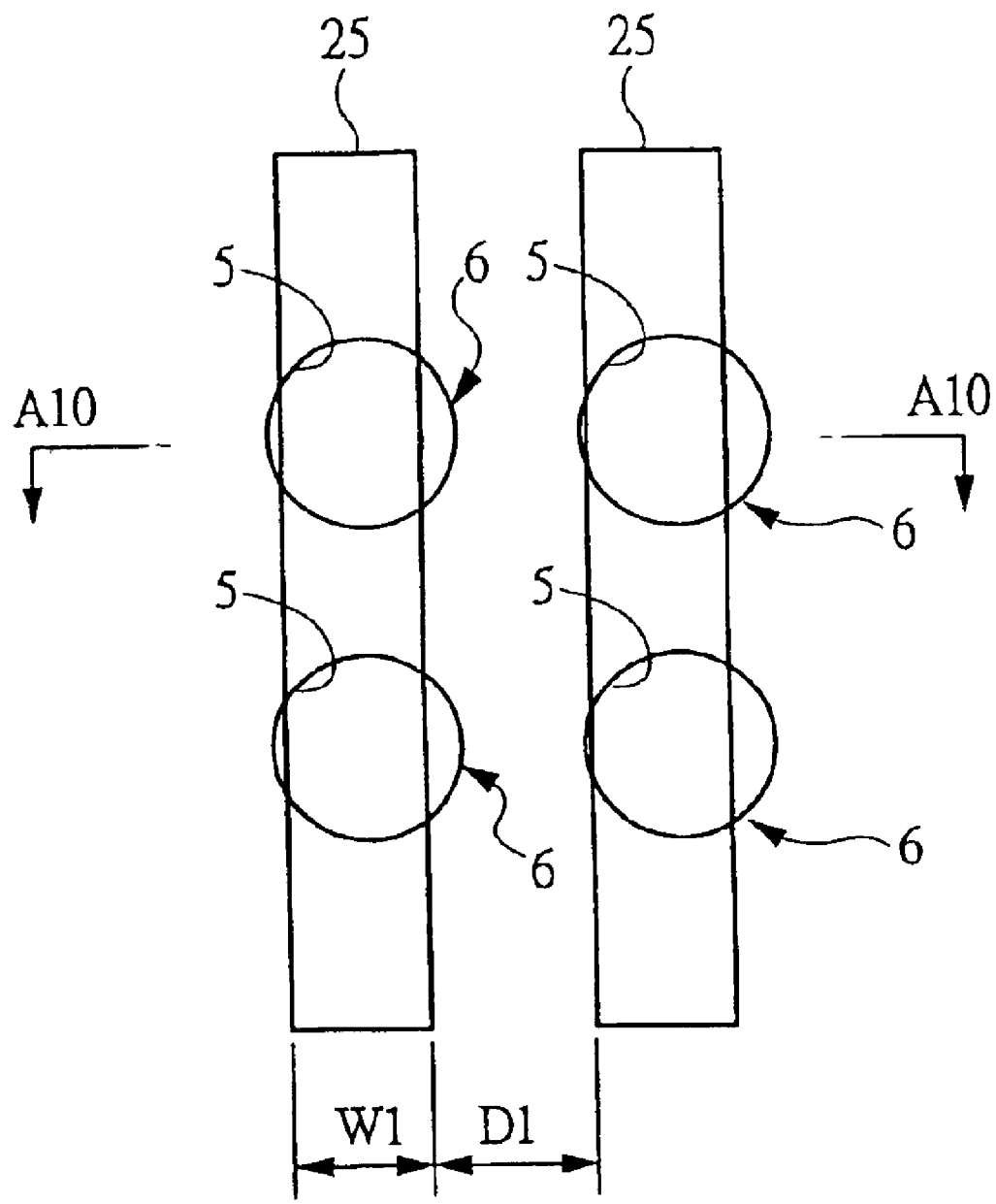
FIG. 42 is a sectional view showing the principal part of the memory cell forming region in the course of the manufacturing process of the semiconductor device subsequent to FIG. 40.

FIG. 42 is a plan view showing the principal part of the memory cell forming region in the course of the manufacturing process of the DRAM subsequent to FIG. 40. Also, FIG. 43 is a sectional view of the DRAM taken along the line A10—A10 in FIG. 42 in the course of the manufacturing process of the same.

In this step, a plurality of wall bodies 25 are formed in the memory cell forming region in the same manner as that described with reference to FIGS. 12 and 13. The plurality of wall bodies 25 extend in the vertical direction in FIG. 42 and are arranged in parallel to each other in the lateral direction in FIG. 42. The wall bodies 25 are formed so as to two-dimensionally overlap the plurality of capacitors 6 arranged in the extending direction of the wall body 25. Each wall body 25 is composed by sequentially laminating the $n^+$ type conductor film 6e, the insulating film 49a, the polycrystalline silicon film 21a, the insulating film 49b, the polycrystalline silicon film 21b, the insulating film 49c, the $n^+$ type conductor film 22, and the insulating film 50 on the main surface of the substrate 1S. The wall body 25 stands on the main surface of the substrate 1 and extends in the vertical direction with respect to the same. The width W1 and the distance D1 are the same as those described above.

Figure 43:
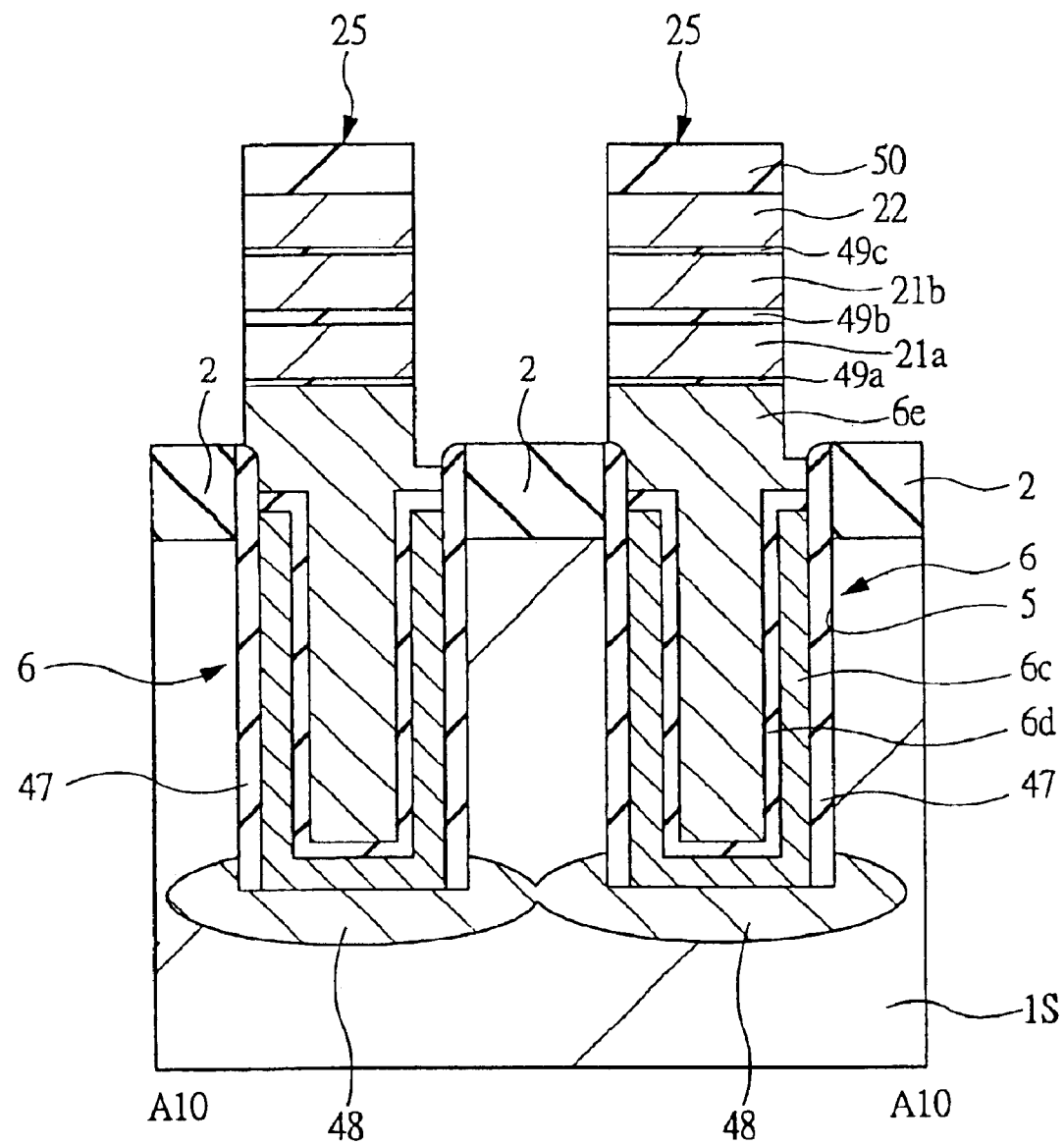
FIG. 43 is a sectional view of the semiconductor device shown in FIG. 42 taken along the line A10—A10 in the course of the manufacturing process of the same.
Figure 44:
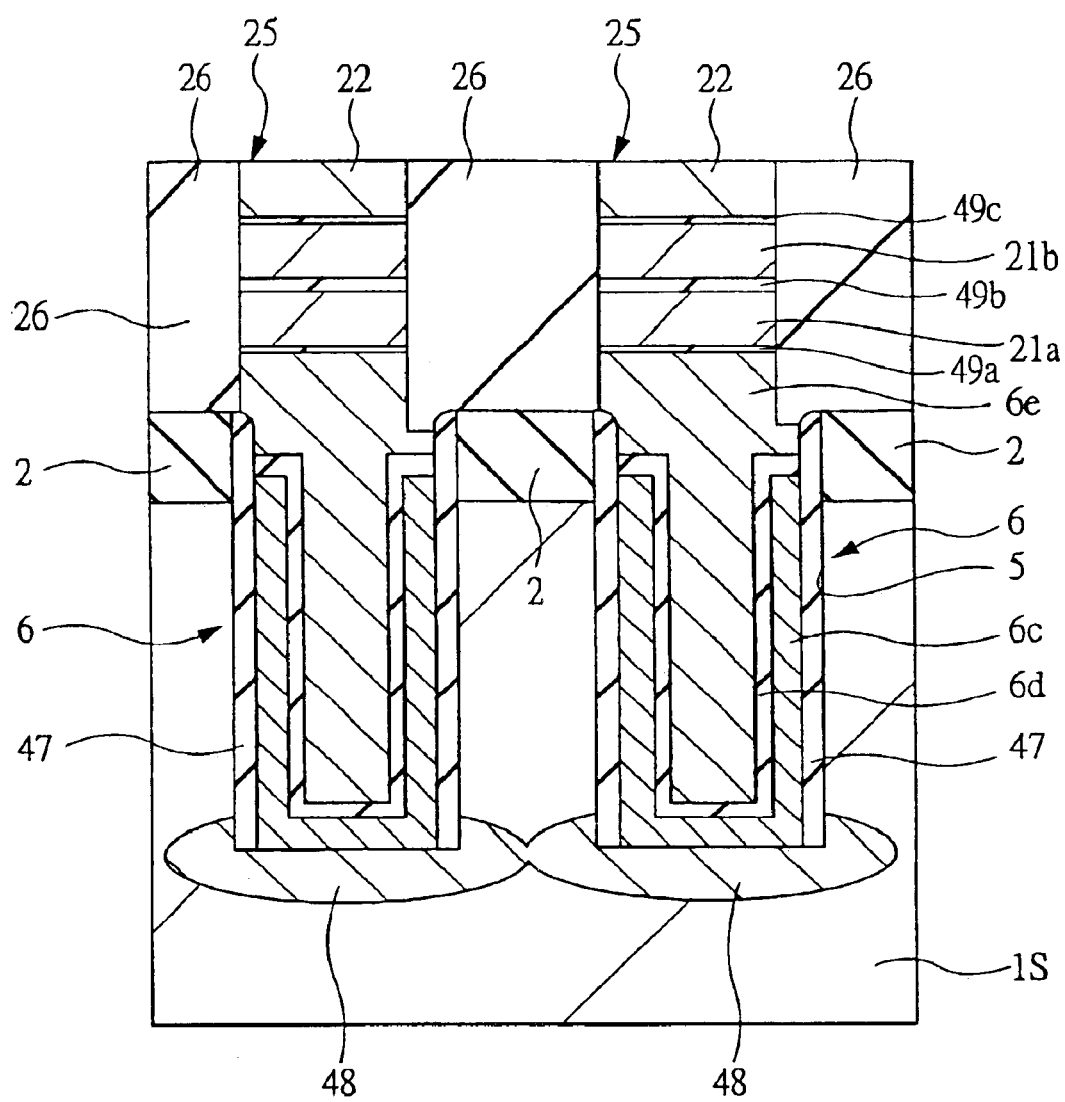
FIG. 44 is a sectional view showing the principal part of the memory cell forming region in the course of the manufacturing process of the semiconductor device subsequent to FIGS. 42 and 43.

FIG. 44 is a sectional view showing the principal part of the memory cell forming region in the course of the manufacturing process of the DRAM subsequent to FIGS. 42 and 43.

In this step, the insulating film 26 is deposited on the main surface of the substrate 1S in the same manner as described above. Thereafter, the insulating film 26 is polished by the CMP method until the upper surface of the $n^+$ type conductor film 22 of the wall body 25 is exposed. By so doing, the insulating film 26 is buried in the space between the adjacent wall bodies 25.

Figure 45:
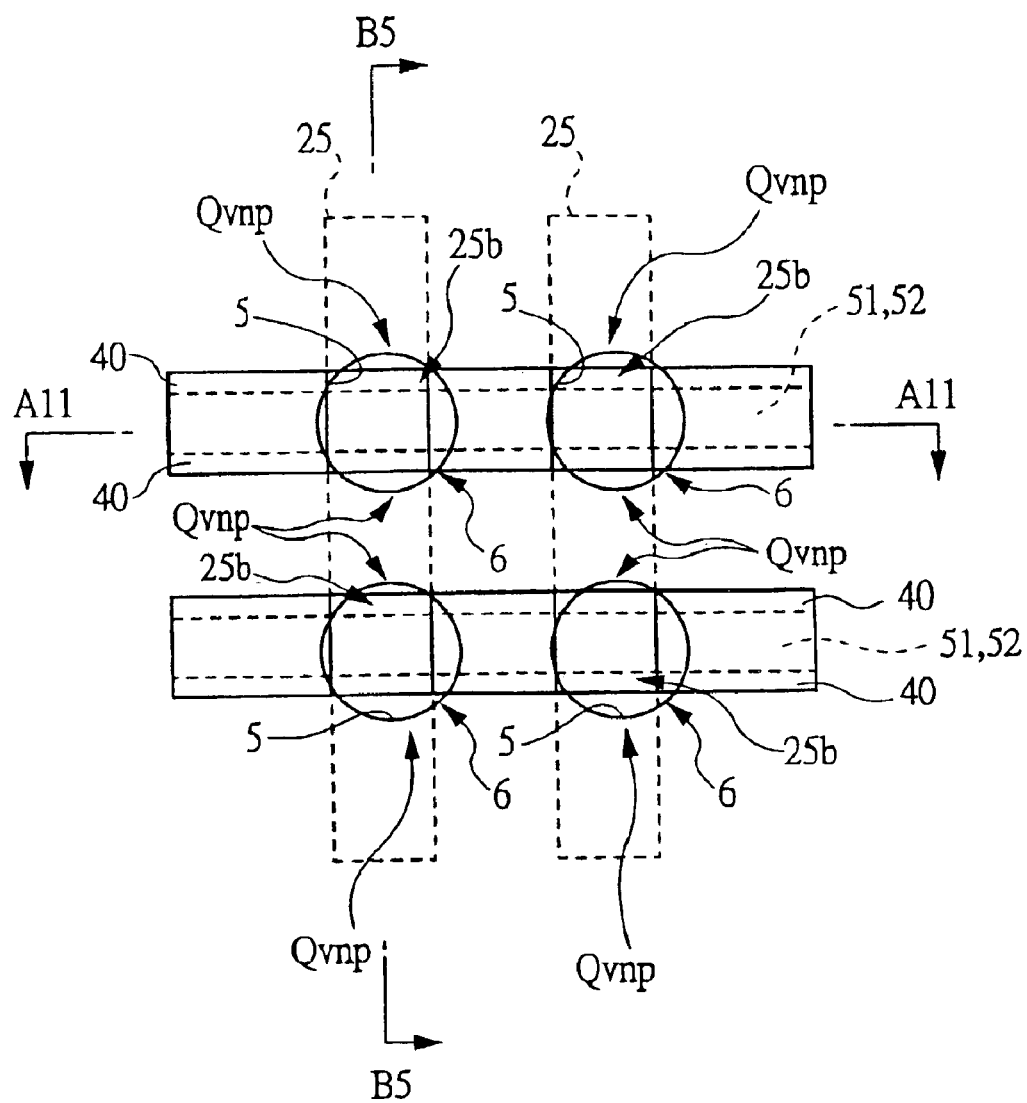
FIG. 45 is a plan view showing the principal part of the memory cell forming region in the course of the manufacturing process of the semiconductor device subsequent to FIG. 44.
Figure 46:
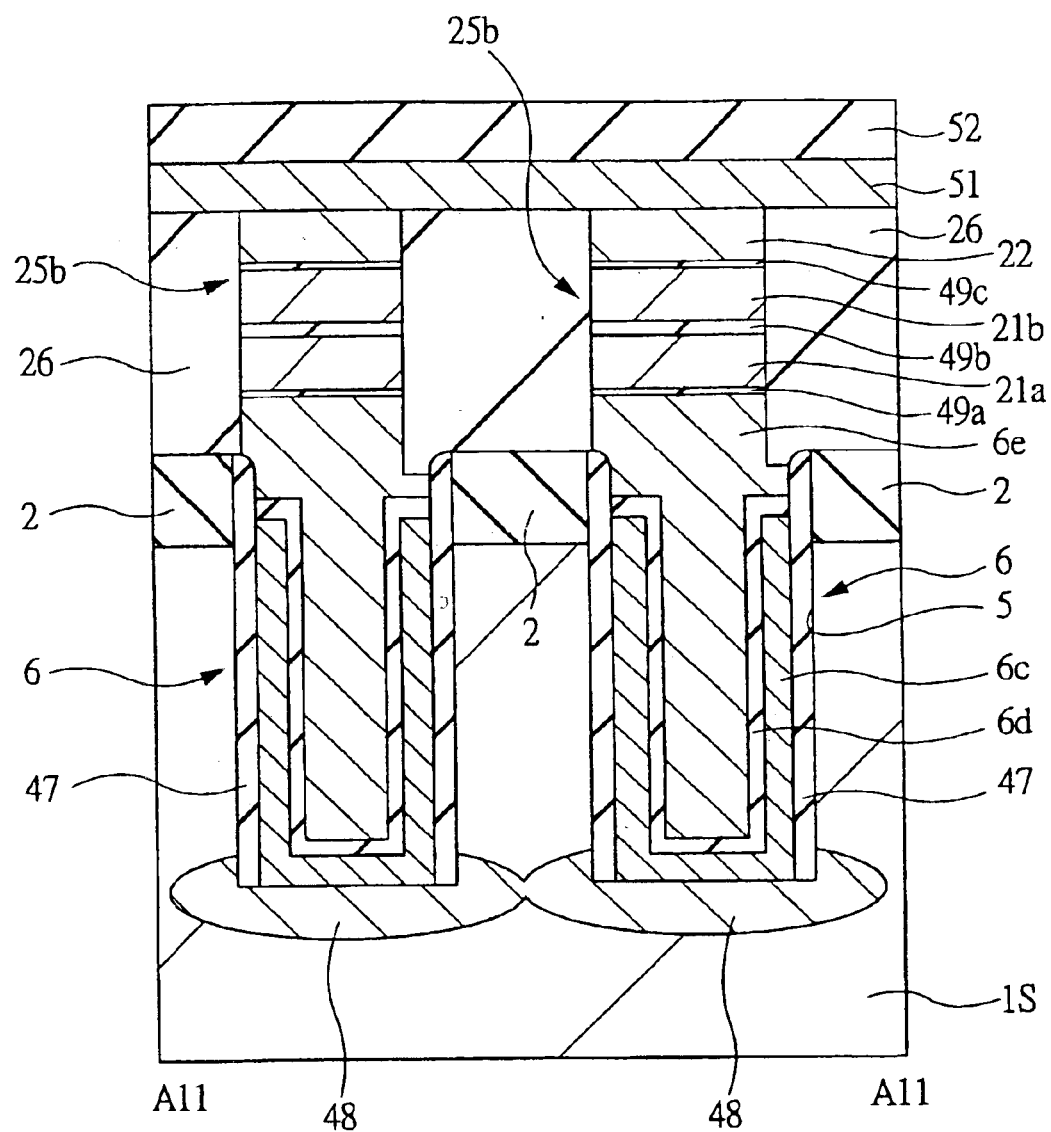
FIG. 46 is a sectional view of the semiconductor device shown in FIG. 45 taken along the line A11—A11 in the course of the manufacturing process of the same.
Figure 47:
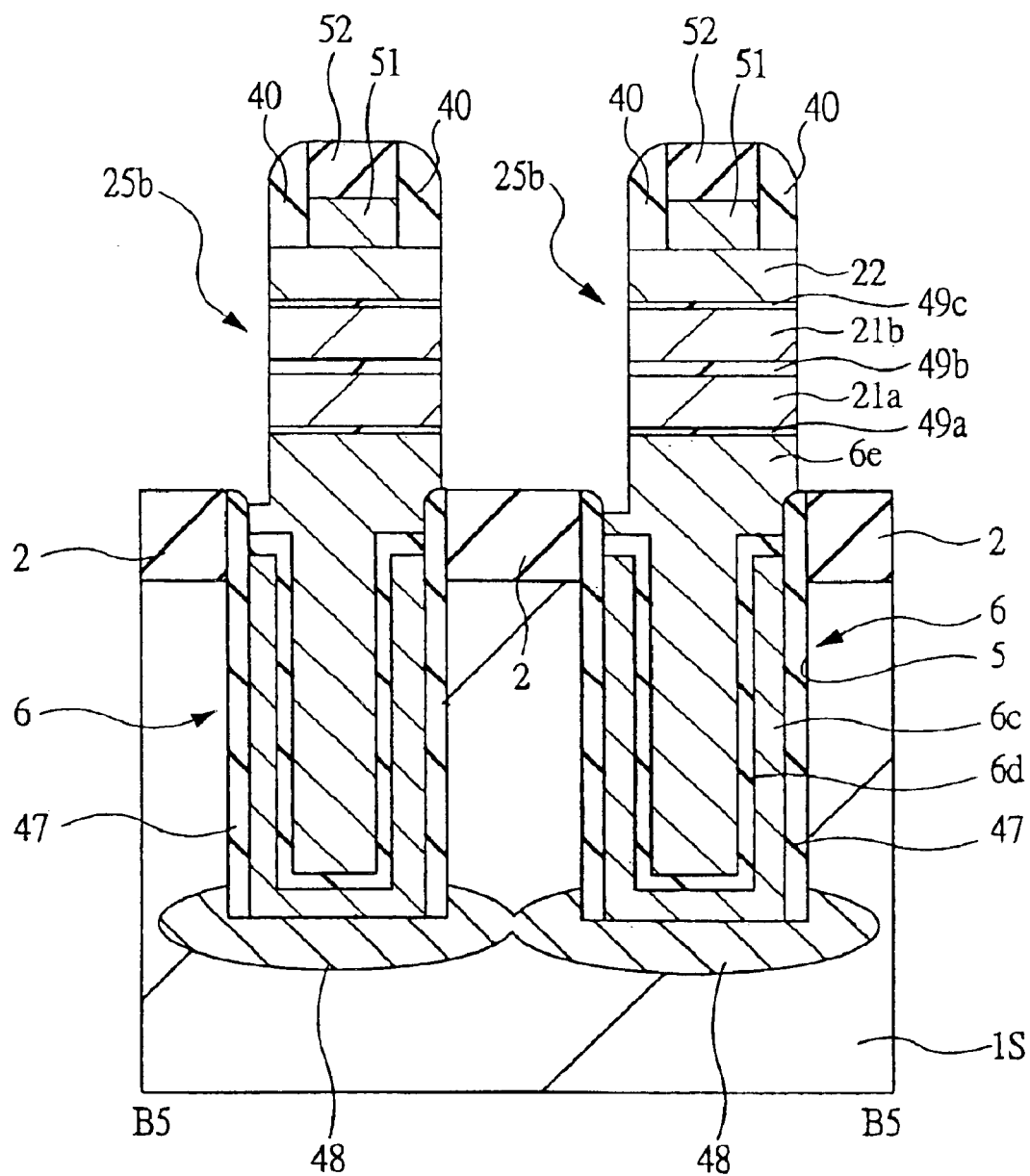
FIG. 47 is a sectional view of the semiconductor device shown in FIG. 45 taken along the line B5—B5 in the course of the manufacturing process of the same.

FIG. 45 is a plan view showing the principal part of the memory cell forming region in the course of the manufacturing process of the DRAM subsequent to FIG. 44. FIG. 46 is a sectional view of the DRAM taken along the line A11—A11 in FIG. 45 in the course of the manufacturing process of the same. FIG. 47 is a sectional view of the DRAM taken along the line B5—B5 in FIG. 45 in the course of the manufacturing process of the same.

First, a conductor film 51 made of tungsten with a thickness of about 50 nm is deposited on the main surface of the substrate 1S by the CVD method or the sputtering method. Thereafter, an insulating film 52 made of a silicon oxide film with a thickness of about 50 nm is deposited on the conductor film 51 by the CVD method. Subsequently, a photoresist film for forming the bit line is formed on the insulating film 52. Thereafter, the insulating film 52 is etched with using the photoresist film as an etching mask, and then, the photoresist film is removed by ashing. Further, the conductor film 51 exposed through the remaining insulating film 52 used as an etching mask is etched and removed. In this manner, the bit line composed of the remaining conductor film 51 is patterned. The bit line composed of the conductor film 51 is formed in a strip-shaped pattern extending in the direction orthogonal to the extending direction of the wall body 25 (lateral direction in FIG. 45) when viewed in plan. The bit line is directly connected and is electrically connected to the plurality of $n^+$ type conductor films 22 arranged adjacent to each other in the extending direction of the bit line. After forming the bit lines in this manner, an insulating film made of a silicon oxide film with a thickness of about 20 nm is deposited on the substrate 1S by the CVD method. Thereafter, the insulating film is etched back by the dry etching method, thereby forming the sidewall insulating film 40 on the side surfaces of the conductor film 51 and the insulating film 52. Then, the n⁺ type conductor film 22, the insulating film 49c, the polycrystalline silicon film 21b, the insulating film 49b, the polycrystalline silicon film 21a, the insulating film 49a, and the conductor film 6e are etched and removed by the dry etching method with using the sidewall insulating film 40 and the insulating film 52 as etching masks, thereby forming a columnar body (third pattern) 25b in an self-alignment manner with the bit line. Because thee columnar body 25b is formed in the self-alignment manner with the bit line BL, it is possible to set the large alignment margin therebetween. Therefore, the yield of the DRAM can be improved. Also, since it is possible to accurately align the columnar body 25b and the bit line BL, the area of each memory cell can be reduced, the entire size of the memory cell forming region can be reduced. Accordingly, the wiring length can be shortened in the memory cell forming region, and thus, the transmission speed of the signal can be improved, and the operation speed of the DRAM can be improved. The columnar body 25b is composed by sequentially laminating the n⁺ type conductor film 6e, the insulating film 49a, the polycrystalline silicon film 21a, the insulating film 49b, the polycrystalline silicon film 21b, the insulating film 49c, and the n⁺ type conductor film 22 on the substrate 1S from below. The columnar body 25b stands on the main surface of the substrate 1S and extends in the vertical direction with respect to the same. In this case, the columnar body 25b is formed in the almost square shape when viewed in plan.

Figure 48:
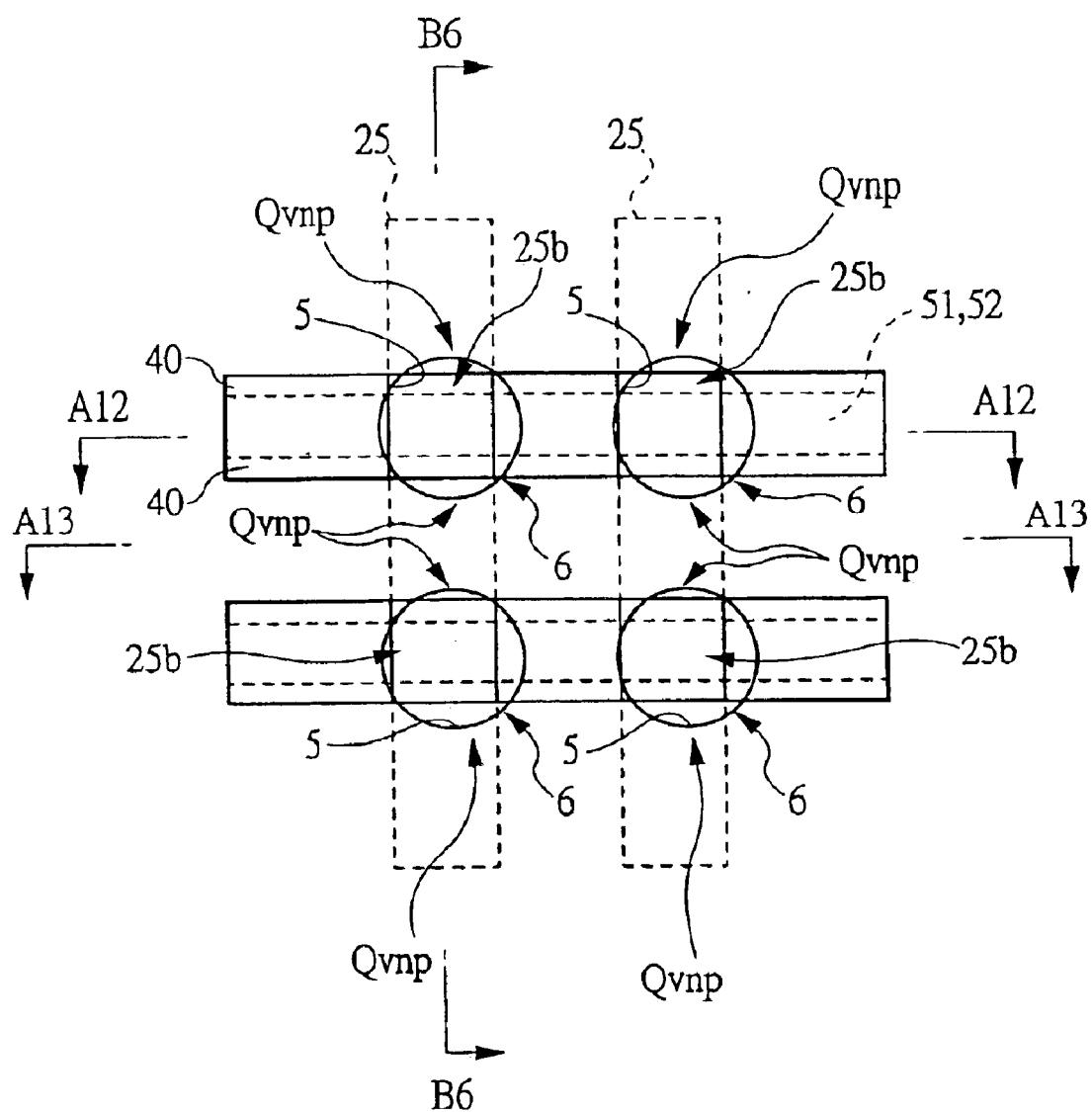
FIG. 48 is a plan view showing the principal part of the memory cell forming region in the course of the manufacturing process of the semiconductor device subsequent to FIGS. 45 to 47.
Figure 49:
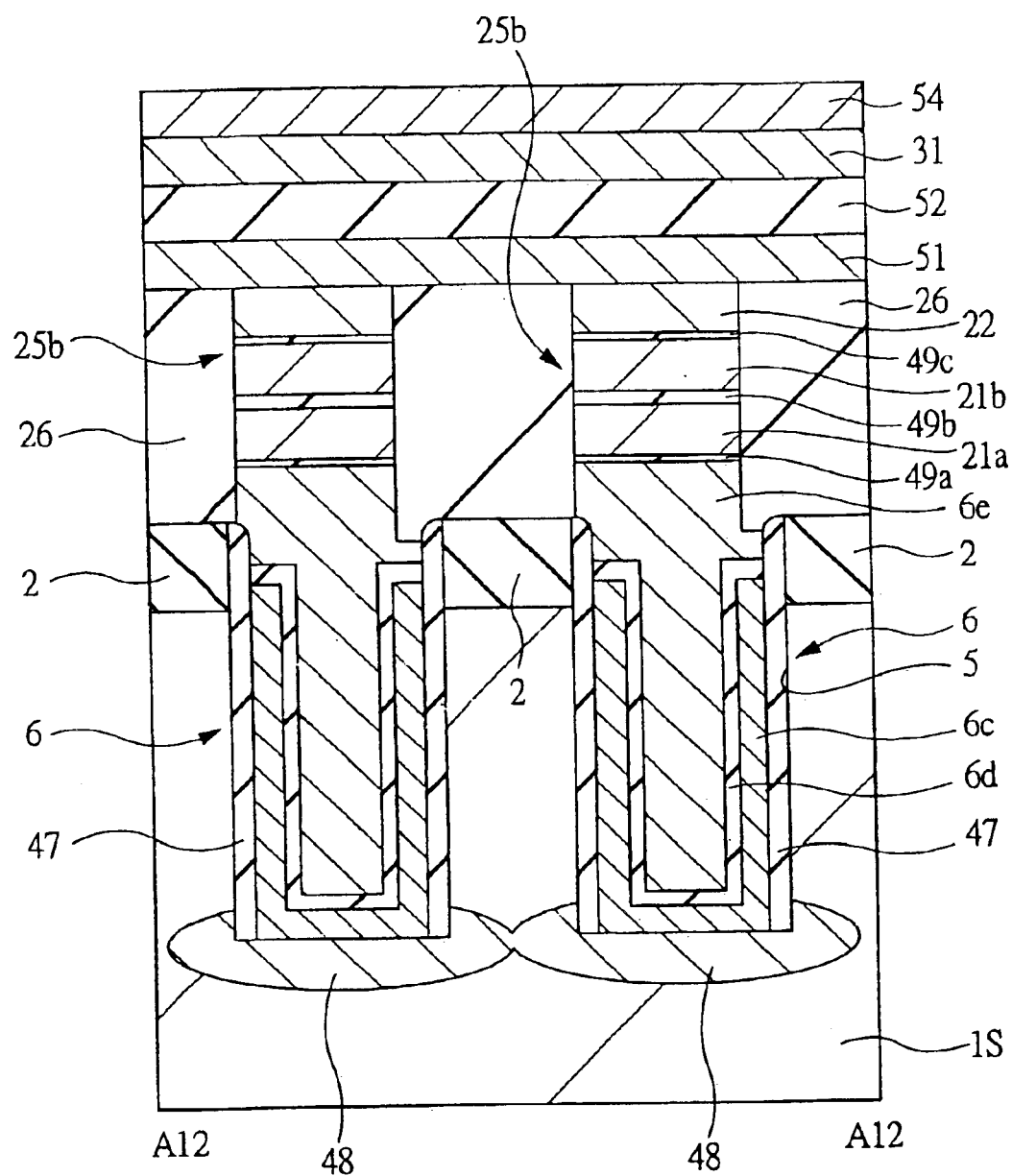
FIG. 49 is a sectional view of the semiconductor device shown in FIG. 48 taken along the line A12—A12 in the course of the manufacturing process of the same.
Figure 50:
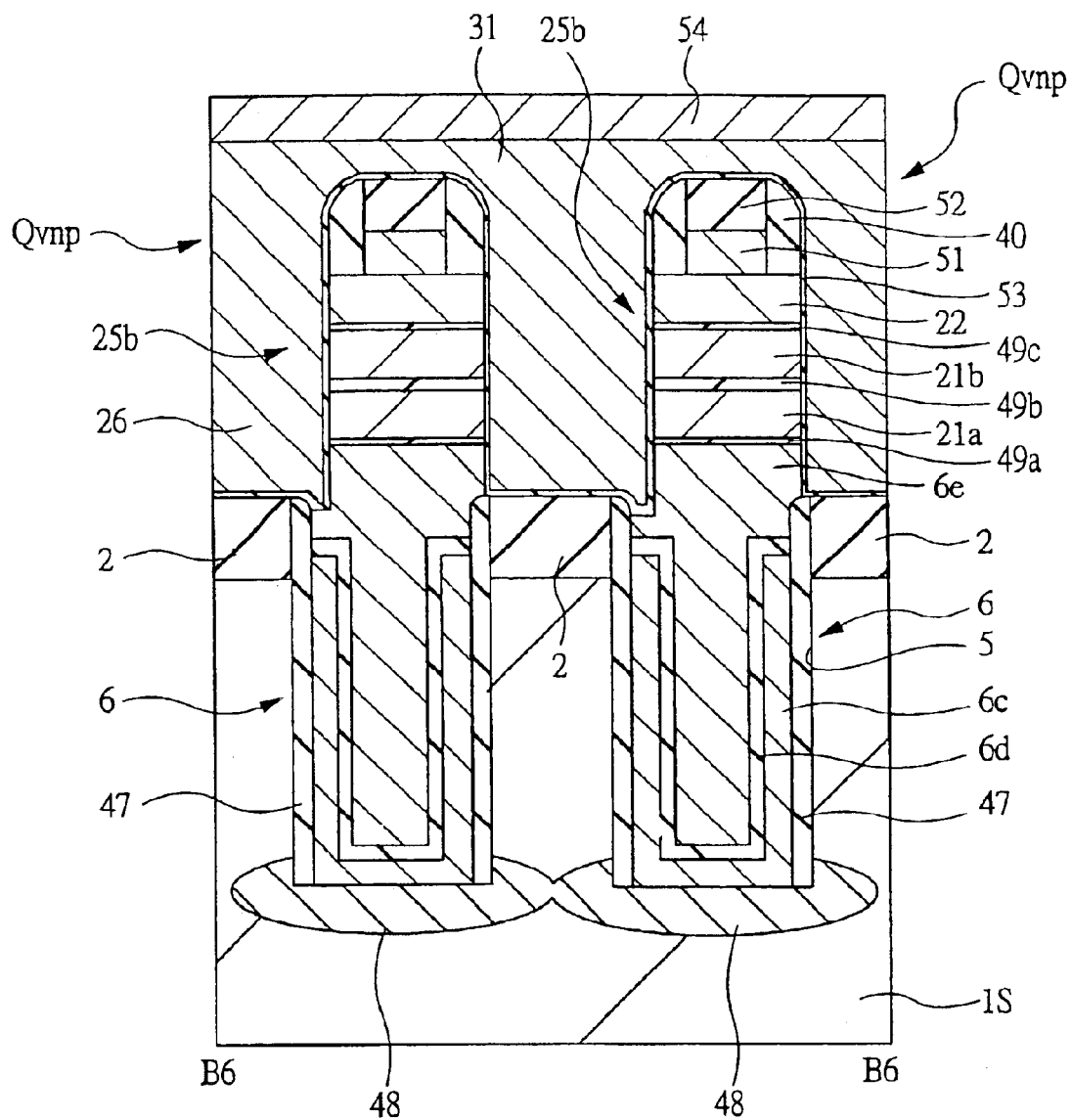
FIG. 50 is a sectional view of the semiconductor device shown in FIG. 48 taken along the line B6—B6 in the course of the manufacturing process of the same.
Figure 51:
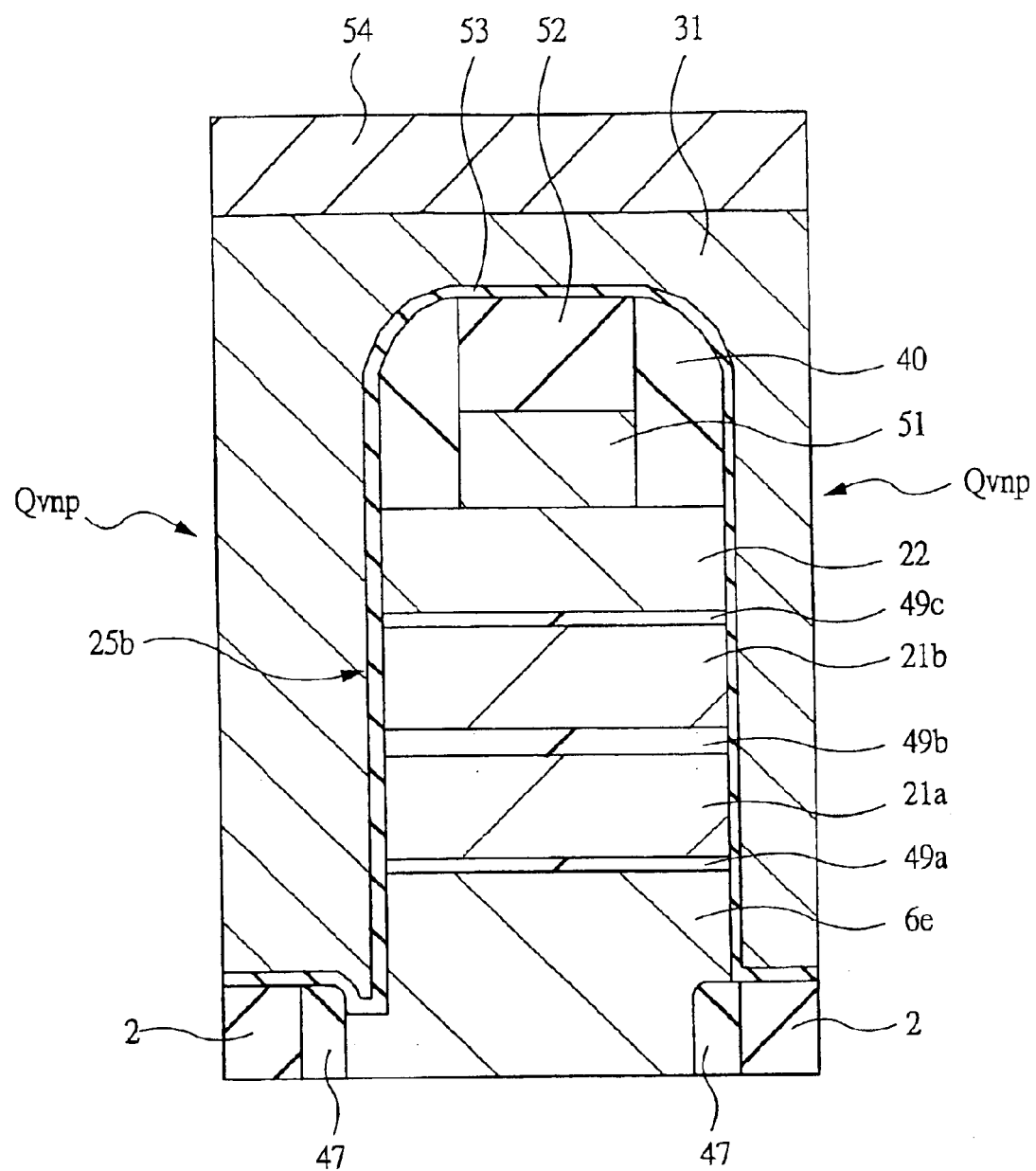
FIG. 51 is an enlarged sectional view showing the principal part of FIG. 50.
Figure 52:
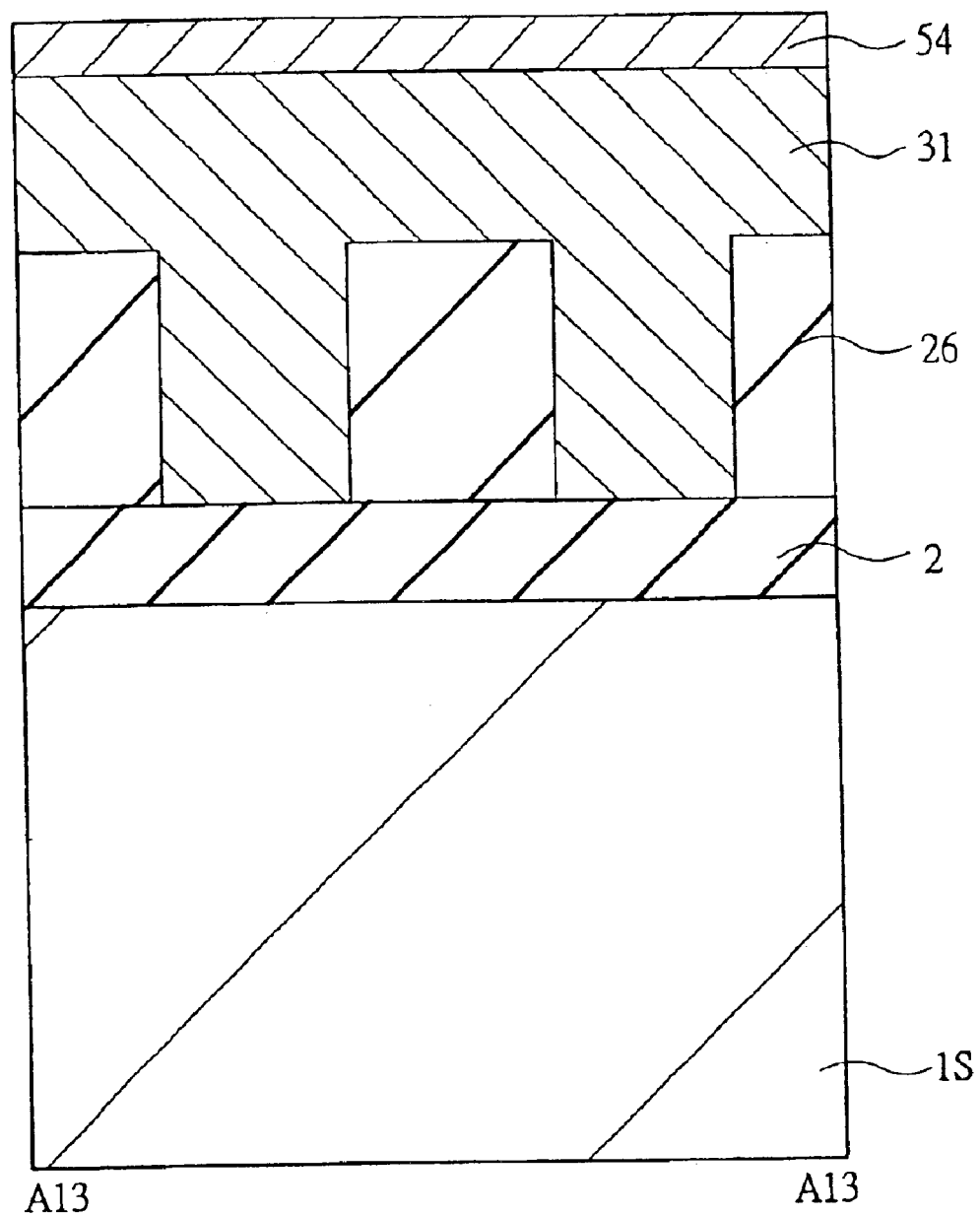
FIG. 52 is a sectional view of the semiconductor device shown in FIG. 48 taken along the line A13—A13 in the course of the manufacturing process of the same.

FIG. 48 is a plan view showing the principal part of the memory cell forming region in the course of the manufacturing process of the DRAM subsequent to FIGS. 45 to 47. FIG. 49 is a sectional view of the DRAM taken along the line A12—A12 in FIG. 48 in the course of the manufacturing process of the same. FIG. 50 is a sectional view of the DRAM taken along the line B6—B6 in FIG. 48 in the course of the manufacturing process of the same. FIG. 51 is an enlarged sectional view showing the principal part of FIG. 50. FIG. 52 is a sectional view of the DRAM taken along the line A13—A13 in FIG. 48 in the course of the manufacturing process of the same.

First, an insulating film 53 made of a silicon oxide film with a thickness of about 6 nm is deposited on the main surface of the substrate 1S by the CVD method. A part of the insulating film 53 deposited on the two side surfaces of the columnar body 25b (refer to FIGS. 50 and 51) forms the gate insulating film of the PLED type MIS. Subsequently, the conductor film 31 made of a polycrystalline silicon film containing boron is deposited on the main surface of the substrate 1S by the CVD method, and then, the upper surface thereof is planarized by the CMP method. In this case, the use of-the polycrystalline silicon film makes it possible to properly fill the space between the columnar bodies 25b and 25b adjacent to each other. In this manner, the PLED type MIS Qvnp is formed on each of the two side surfaces of one columnar body 25b Similarly to the first embodiment, a part of the conductor film 31 located on the side surface of the columnar body 25b forms the gate electrode of the PLED type MIS Qvnp. Thereafter, a conductor film (third conductor film) 54 made of tungsten with a thickness of about 50 nm is deposited on the conductor film 31 by the CVD method. As the insulating film 53 that forms the gate insulating film, a laminated layer obtained by laminating a silicon nitride film on an oxynitride silicon film, a silicon nitride film, or a silicon oxide film can be used instead of the silicon oxide film. In addition, it is also possible to form the conductor film 54 by sequentially laminating a refractory metal nitride film such as tungsten nitride (WN) and a refractory metal film such as tungsten (W) from below in the same manner as that of the conductor film 42 described above.

Figure 53:
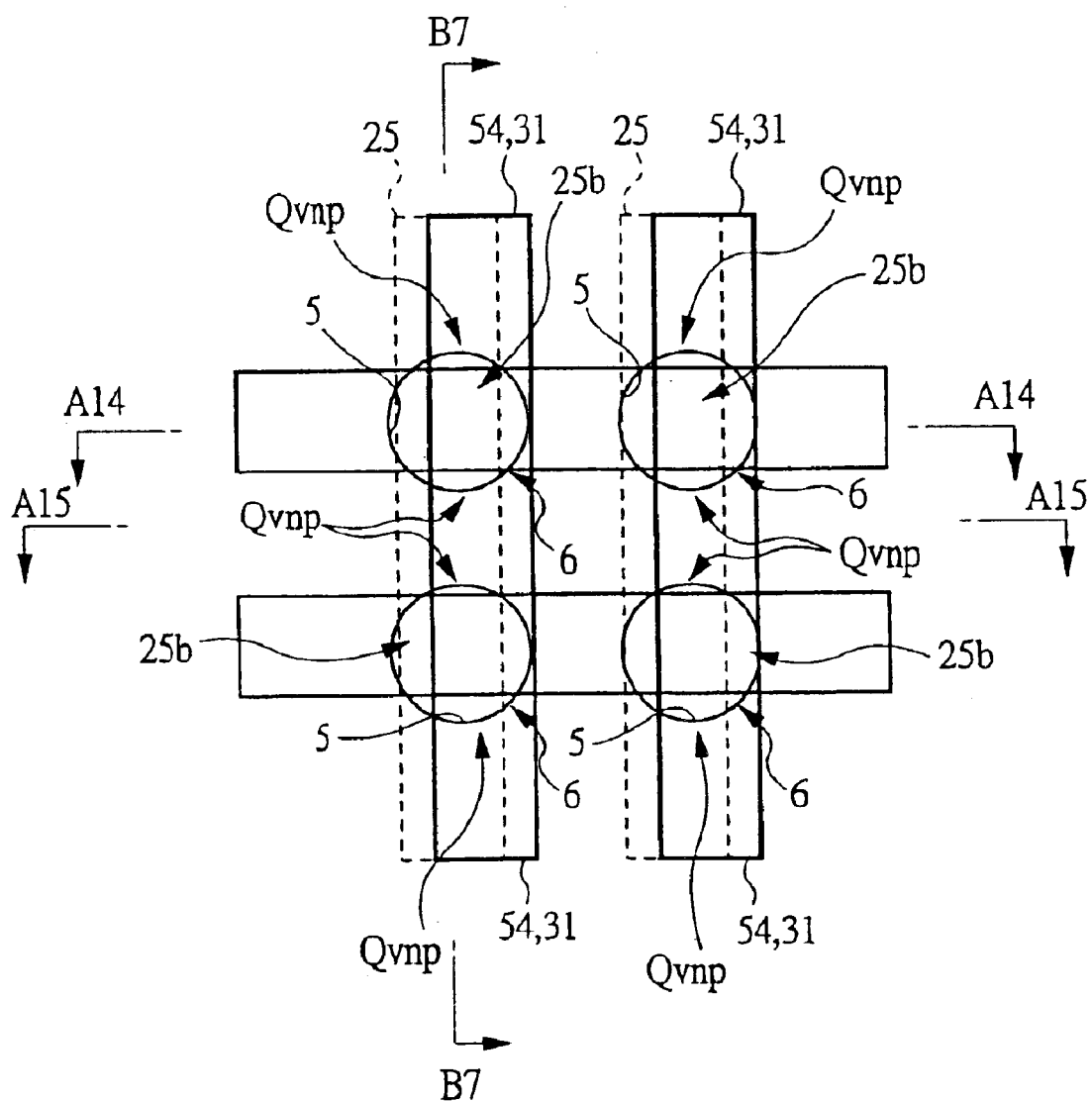
FIG. 53 is a plan view showing the principal part of the memory cell forming region in the course of the manufacturing process of the semiconductor device subsequent to FIGS. 48 to 52.
Figure 54:
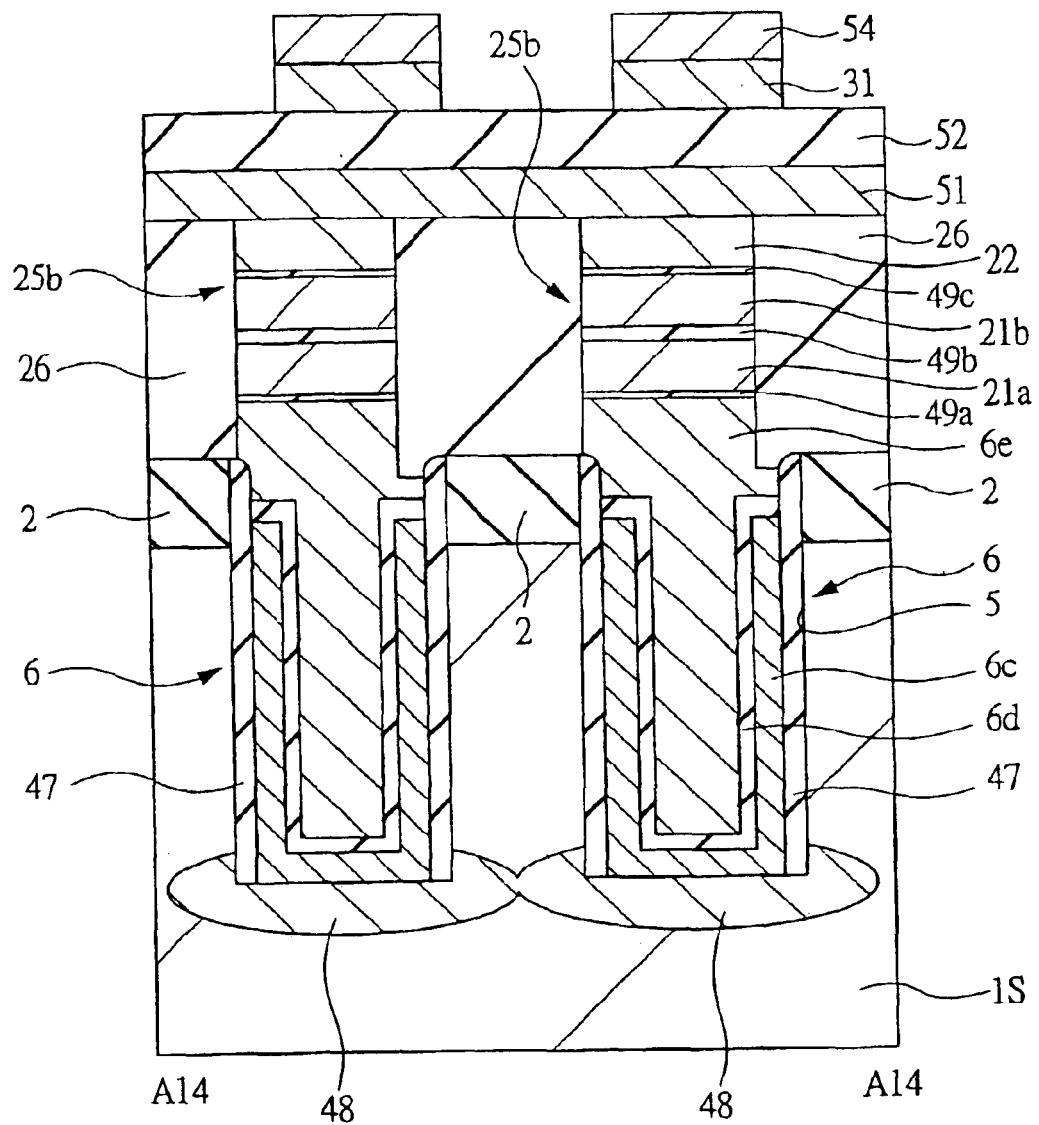
FIG. 54 is a sectional view of the semiconductor device shown in FIG. 53 taken along the line A14—A14 in the course of the manufacturing process of the same.
Figure 55:
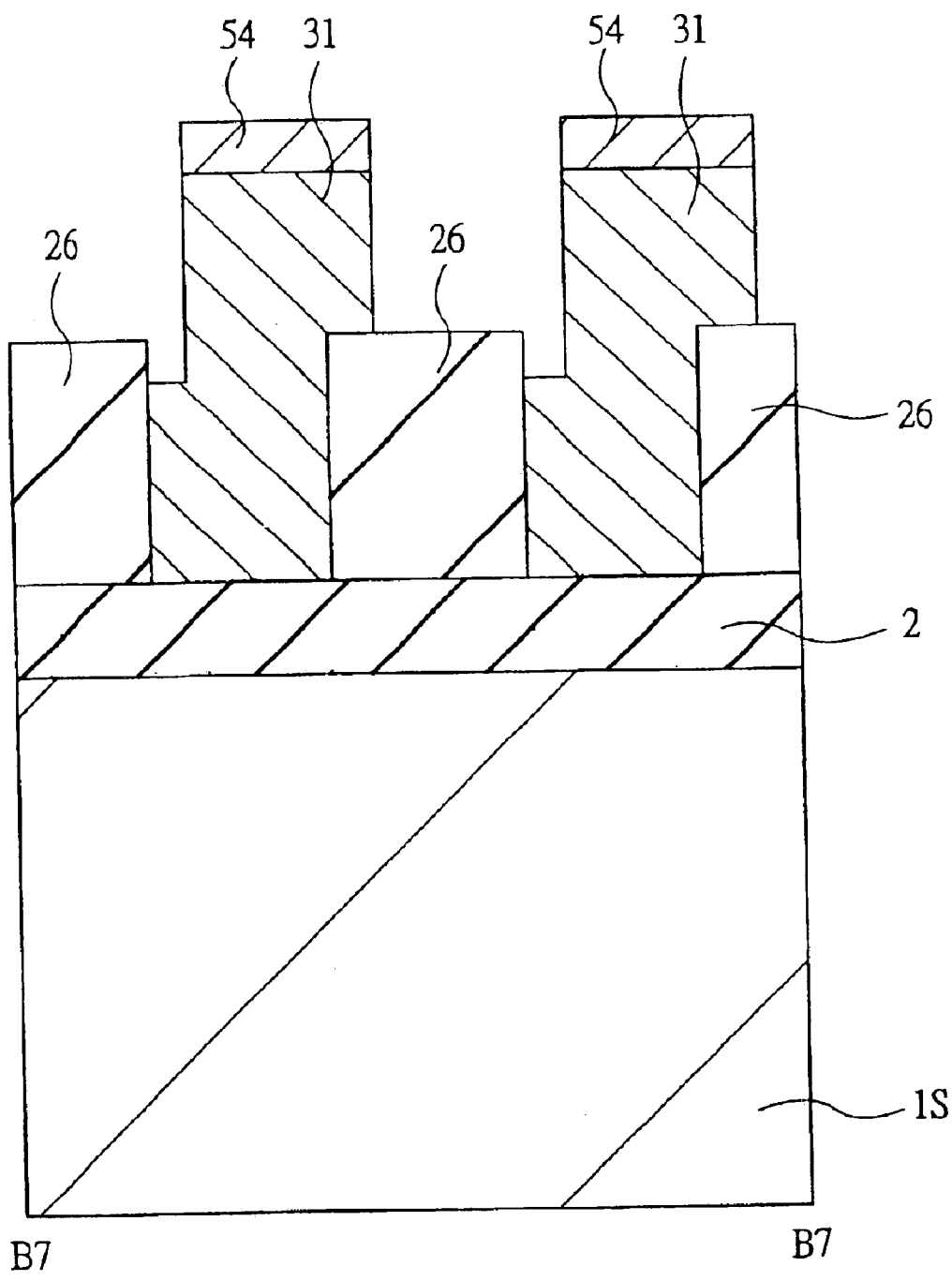
FIG. 55 is a sectional view of the semiconductor device shown in FIG. 53 taken along the line B7—B7 in the course of the manufacturing process of the same.

FIG. 53 is a plan view showing the principal part of the memory cell forming region in the course of the manufacturing process of the DRAM subsequent to FIGS. 48 to 52. FIG. 54 is a sectional view of the DRAM taken along the line A14—A14 in FIG. 53 in the course of the manufacturing process of the same. FIG. 55 is a sectional view of the DRAM taken along the line B7—B7 in FIG. 53 in the course of the manufacturing process of the same.

In this step, a word line composed of the conductor films 54 and 31 is formed by patterning the conductor films 54 and 31 by the use of the photolithography technique and the dry etching technique. The word line composed of the laminated film of the conductor films 54 and 31 is formed in a strip-shaped pattern extending in the extending direction of the wall body 25 (lateral direction in FIG. 53) when viewed in plan. The word line is electrically connected to each of the gate electrodes of the plurality of PLED type MIS Qvnp adjacently arranged in the extending direction of the word line. In addition, the gate electrodes (conductor films 54 and 31) between the PLED type MIS Qvnp adjacent to each other in the lateral direction in FIG. 53 are electrically isolated from each other by this etching process. Note that the sectional view taken along the line A15—A15 in FIG. 53 in the course of the manufacturing process of the DRAM is the same as FIG. 50. Since the following process is identical to that of the first embodiment, the descriptions thereof will be omitted.

In the foregoing, the invention made by the inventors of this invention has been described in detail based on the embodiments. However, it goes without saying that the present invention is not limited to the above-described embodiments, and various changes and modifications of the invention can be made without departing from the spirit and scope of the invention.

Also, in the above description, the invention made by the inventors thereof is applied to a manufacturing method of a single DRAM, which is an applicable field serving as the background of the invention. However, the present invention is not limited to this, and the present invention can also be applied to other manufacturing method of a semiconductor device in which a DRAM and a logic circuit are provided on the same substrate.

The advantages achieved by the typical ones of the inventions disclosed in this application will be briefly described as follows.

That is, since a vertical field effect transistor for memory cell selection is formed in the memory cell forming region after forming a lateral field effect transistor for a peripheral circuit on a semiconductor substrate, it is possible to improve the reliability of the semiconductor device having the vertical transistor.

What is claimed is:

1. A semiconductor device, comprising:
   (a) a plurality of trench data storage capacitors formed in a memory-cell forming region of a semiconductor substrate;
   (b) a lateral field effect transistor for forming a peripheral circuit, formed in a peripheral circuit-forming region of the semiconductor substrate; and
   (c) a vertical field effect transistor for memory cell selection, having semiconductor layers for a source and drain, one of which is electrically connected to one of the electrodes of a respective data storage capacitor, of the plurality of trench data storage capacitors on the semiconductor substrate.

2. A semiconductor device, comprising:

a plurality of trench data storage capacitors formed in a memory cell-forming region of a semiconductor substrate;

a first isolation part for isolating the plurality of trench data storage capacitors from each other on the semiconductor substrate;

a lateral field effect transistor for forming a peripheral circuit, formed in a peripheral circuit-forming region of the semiconductor substrate;

a second isolation part for isolating devices from each other formed in the peripheral circuit-forming region; and a vertical field effect transistor for memory cell selection, having semiconductor layers for a source and drain, one of which is electrically connected to one of the electrodes of a respective data storage capacitor, of the plurality of trench data storage capacitors, on the semiconductor substrate, wherein the first isolation part is thinner than the second isolation part.

3. The semiconductor device according to claim 2, wherein the first isolation part is an insulating film located on a main surface of the semiconductor substrate, and the second isolation part is an insulating film buried in a trench formed on the main surface of the semiconductor substrate.

4. A semiconductor device, comprising:

a plurality of trench data storage capacitors formed in a memory cell-forming region of a semiconductor substrate;

a lateral field effect transistor for forming a peripheral circuit, formed in a peripheral circuit-forming region of the semiconductor substrate; and a vertical field effect transistor for memory cell selection having semiconductor layers for a source and drain, one of which is electrically connected to one of the electrodes of a respective data storage capacitor of the plurality of trench data storage capacitors, wherein the vertical field effect transistor is provided so as to extend in a direction orthogonal to the main surface of the semiconductor substrate, and has a columnar body which forms a channel portion, the columnar body has a first surface crossing to the main surface of the semiconductor substrate, a second surface crossing to the main surface of the semiconductor substrate and facing to the first surface, third and fourth surfaces crossing to the main surface of the semiconductor substrate and also crossing to the third and fourth surfaces, and a fifth surface parallel to the main surface of the semiconductor substrate and crossing to the first to fourth surfaces, and a gate insulating film of the vertical field effect transistor is provided on the first and second surfaces, and the length of the sides of the fifth surface in contact with the first and second surfaces being longer than that of the sides in contact with the third and fourth surfaces.

5. A semiconductor device, comprising:

(a) a plurality of trench data storage capacitors formed in a memory cell-forming region of a semiconductor substrate;

(b) a lateral field effect transistor for forming a peripheral circuit, formed in a peripheral circuit-forming region of the semiconductor substrate;

(c) a first insulating film formed so as to cover the lateral field effect transistor in the peripheral circuit-forming region and expose a part of the data storage capacitor in the memory cell-forming region; and (d) a second insulating film provided on a side surface of the first insulating film at the boundary between the peripheral circuit-forming region and the memory cell-forming region so as to smooth a step part between the peripheral circuit-forming region and the memory cell-forming region.

6. A semiconductor device, comprising:

(a) a plurality of trench capacitors functioning as data storage capacitors and formed in a memory cell-forming region of a semiconductor substrate;

(b) a vertical field effect transistor for memory cell selection, having semiconductor layers for a source and drain, one of which is electrically connected to a first electrode of a respective data storage capacitor of said plurality of trench data storage capacitors;

(c) a dummy trench capacitor formed in the memory cell-forming region of the semiconductor substrate, not electrically connected to the vertical field effect transistor for memory cell selection, and not functioning as a data storage capacitor; and (d) a power supply part which is provided in the region where the dummy trench capacitor is arranged, and which supplies a first voltage to a second electrode of the plurality of trench capacitors functioning as data storage capacitors.

7. The semiconductor device according to claim 1, wherein the vertical field effect transistor has an insulating film on a side wall of a source region, channel and drain region, and a thickness of the insulating film on the channel region is thinner than a thickness of the insulating film on the source region or drain region.

8. The semiconductor device according to claim 2, wherein the vertical field effect transistor has an insulating film on a side wall of a source region, channel and drain region, and a thickness of the insulating film on the channel region is thinner than a thickness of the insulating film on the source region or drain region.

* * * * *